(12) United States Patent
Castro et al.

(10) Patent No.: US 11,316,044 B2
(45) Date of Patent: Apr. 26, 2022

(54) LDMOS TRANSISTORS INCLUDING VERTICAL GATES WITH MULTIPLE DIELECTRIC SECTIONS, AND ASSOCIATED METHODS

(71) Applicant: Maxim Integrated Products, Inc., San Jose, CA (US)

(72) Inventors: Tom K. Castro, Santa Clara, CA (US); Rajwinder Singh, Pleasanton, CA (US); Badredin Fatemizadeh, Palo Alto, CA (US); Adam Brand, Palo Alto, CA (US); John Xia, Fremont, CA (US); Chi-Nung Ni, Foster City, CA (US); Marco A. Zuniga, Berkeley, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 15/997,997

(22) Filed: Jun. 5, 2018

(65) Prior Publication Data

US 2018/0350980 A1 Dec. 6, 2018

Related U.S. Application Data

(60) Provisional application No. 62/515,308, filed on Jun. 5, 2017.

(51) Int. Cl.
*H01L 29/78* (2006.01)
*H01L 29/06* (2006.01)
(Continued)

(52) U.S. Cl.
CPC .. *H01L 29/7816* (2013.01); *H01L 21/823857* (2013.01); *H01L 27/0922* (2013.01); *H01L 29/0649* (2013.01); *H01L 29/407* (2013.01); *H01L 29/41758* (2013.01); *H01L 29/4232* (2013.01); *H01L 29/4236* (2013.01); *H01L 29/42368* (2013.01); *H01L 29/66681* (2013.01); *H01L 29/66704* (2013.01);
(Continued)

(58) Field of Classification Search
None
See application file for complete search history.

(56) References Cited

U.S. PATENT DOCUMENTS 7,345,342 B2 3/2008 Challa et al.
8,709,899 B2 4/2014 Zuniga et al.
(Continued)

OTHER PUBLICATIONS

Punetha et al. (2015) "An Integrable Trench LDMOS Transistor on SOI for RF Power Amplifiers in PICs," 2015 IEEE, 4 pp.

*Primary Examiner* — Jack S Chen
(74) *Attorney, Agent, or Firm* — Lathrop GPM LLP

(57) ABSTRACT

A lateral double-diffused metal-oxide-semiconductor transistor includes a silicon semiconductor structure and a vertical gate. The vertical gate include a (a) gate conductor extending from a first outer surface of the silicon semiconductor structure into the silicon semiconductor structure and (b) a gate dielectric layer including a least three dielectric sections. Each of the at least three dielectric sections separates the gate conductor from the silicon semiconductor structure by a respective separation distance, where each of the respective separation distances is different from each other of the respective separation distances.

3 Claims, 59 Drawing Sheets

(51) Int. Cl.
    *H01L 29/417*     (2006.01)
    *H01L 29/423*     (2006.01)
    *H01L 29/66*     (2006.01)
    *H01L 29/40*     (2006.01)
    *H01L 27/092*     (2006.01)
    *H01L 21/8238*     (2006.01)

(52) U.S. Cl.
    CPC ...... *H01L 29/7825* (2013.01); *H01L 29/7831* (2013.01); *H01L 29/7835* (2013.01); *H01L 29/0692* (2013.01)

(56) References Cited

U.S. PATENT DOCUMENTS

| | | |
|---|---|---|
| 9,084,084 B2 | 7/2015 | Chiu |
| 9,721,806 B2 | 8/2017 | Fang |
| 2015/0187937 A1* | 7/2015 | Sridhar ............... H01L 29/7835 257/408 |
| 2017/0346477 A1 | 11/2017 | Xia et al. |
| 2018/0350980 A1* | 12/2018 | Castro ............. H01L 21/823857 |

* cited by examiner

LDMOS TRANSISTORS INCLUDING VERTICAL GATES WITH MULTIPLE DIELECTRIC SECTIONS, AND ASSOCIATED METHODS

RELATED APPLICATIONS

This application claims benefit of priority to U.S. Provisional Patent Application Ser. No. 62/515,308, filed Jun. 5, 2017, which is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is blocked within the transistors' semiconductor material primarily in a lateral direction. LDMOS transistors are often combined with other circuitry in integrated circuits, especially in power applications or radio-frequency applications.

FIG. 1 is a cross-sectional view of a prior art n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage $V_{DS}$ is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage $V_{DS}$, thereby enabling LDMOS transistor 100 to support a relatively large value of $V_{DS}$ without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. This channel has excess electrons and will therefore conduct current. Consequentially, current will flow in the lateral 138 direction through silicon semiconductor structure 102 from drain n+ region 132 to source n+ region 130 when $V_{GS}$ exceeds a threshold value and $V_{DS}$ is a positive value. The current can encounter substantial resistance, however, in drift region 134 due to relatively light n-type dopant concentration in n-well 124.

DETAILED DESCRIPTION OF THE EMBODIMENTS

Applicant has developed LDMOS transistors and associated systems and methods which significantly advance the state of the art. Certain embodiments of the LDMOS transistors include a gate dielectric layer formed in a trench of a silicon semiconductor structure, to promote high transistor performance and small transistor pitch. In some embodiments, the gate dielectric layer includes at least three dielectric sections separating a vertical gate conductor from the silicon semiconductor structure by differing respective separation distances, to promote both low on-resistance and high breakdown voltage. The number of dielectric sections is determined, for example, by the required breakdown voltage and associated on-resistance. Additionally, some embodiments include both a vertical gate and a lateral gate.

Figure 1:
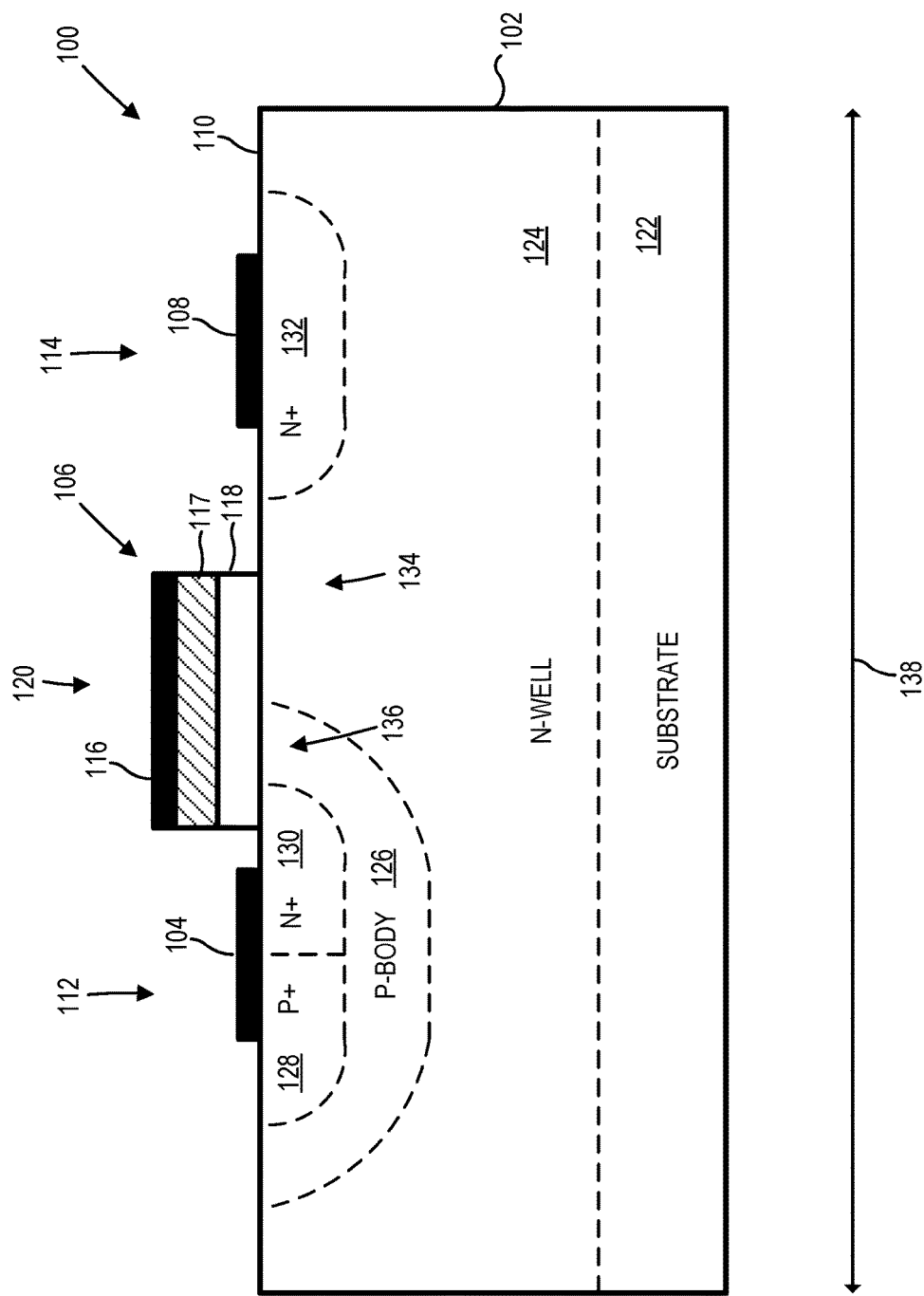
FIG. 1 is a cross-sectional view of a prior-art LDMOS transistor.
Figure 2:
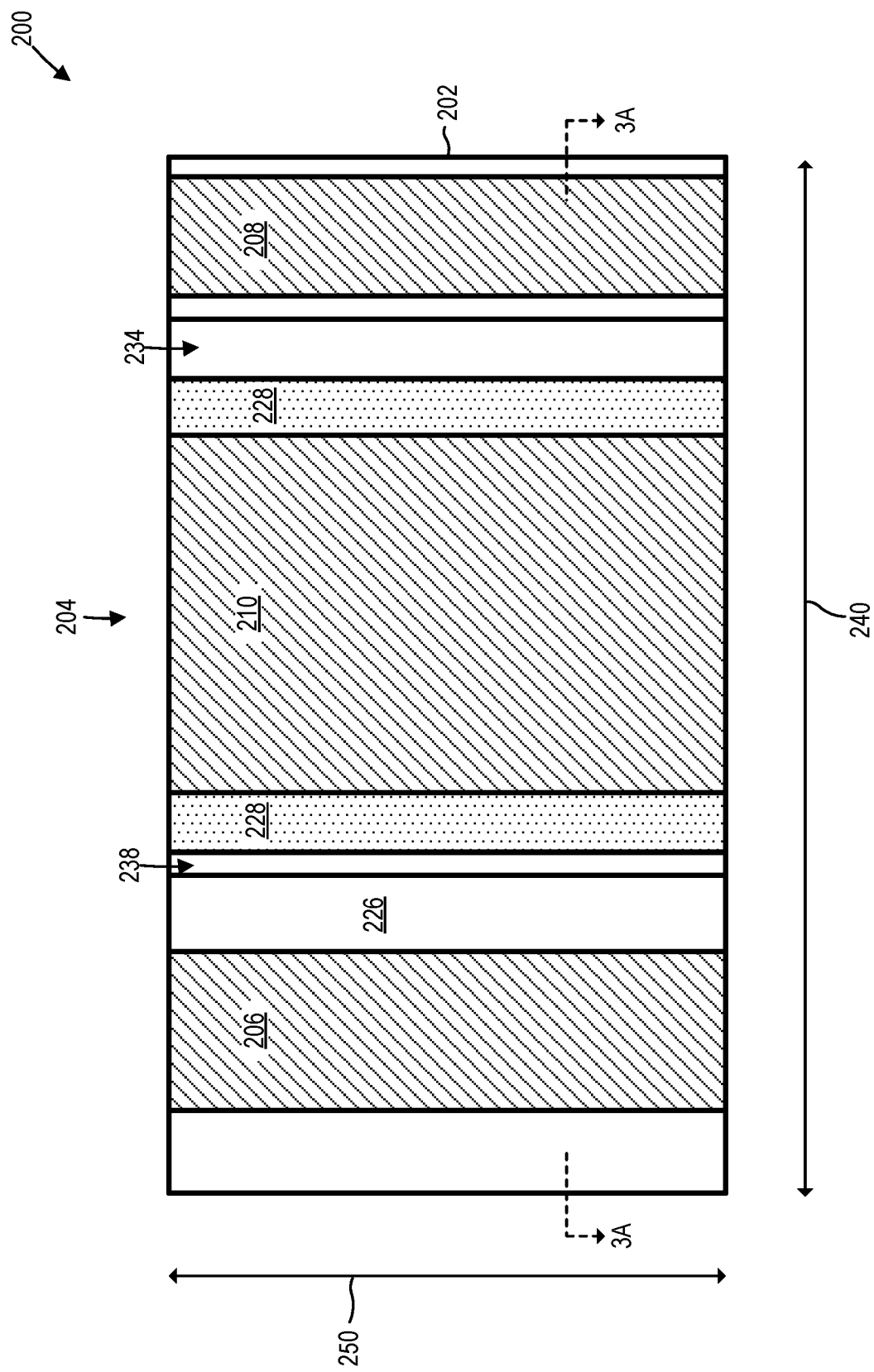
FIG. 2 is a top plan view of a LDMOS transistor including a vertical gate with three dielectric sections, according to an embodiment.
Figure 3:
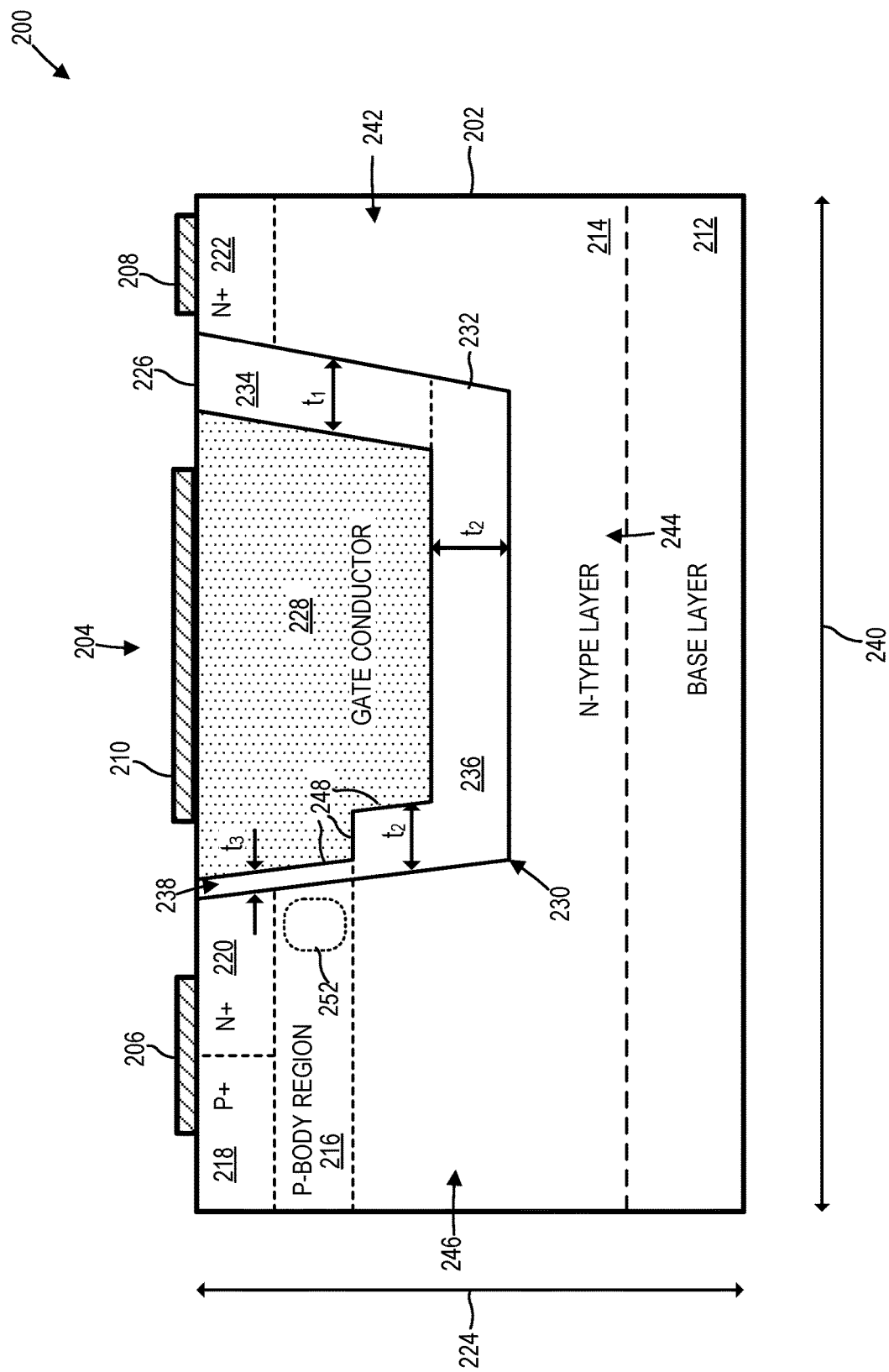
FIG. 3 is a cross-sectional view of the FIG. 2 LDMOS transistor taken along line 3A-3A of FIG. 2.

FIG. 2 is a top plan view of a LDMOS transistor 200 including a vertical gate with three dielectric sections. FIG. 3 is a cross-sectional view of LDMOS transistor 200 taken along line 3A-3A of FIG. 2. LDMOS transistor 200 includes a silicon semiconductor structure 202, a vertical gate 204, a source electrode 206, a drain electrode 208, and a gate electrode 210.

Silicon semiconductor structure 202 includes a base layer 212, an n-type layer 214, a p-body region 216, a source p+ region 218, a source n+ region 220, and a drain n+ region 222. Base layer 212 is, for example, an n-type high-voltage well in a silicon substrate, a p-type silicon substrate, or an n-type epitaxial layer grown over a p-type silicon substrate. N-type layer 214 is disposed over base layer 212 in a thickness direction 224, and p-body region 216 is disposed in n-type layer 214 adjacent to an outer surface 226 of silicon semiconductor structure 202. Source p+ region 218 and source n+ region 220 are each disposed in p-body region 216, and drain n+ region 222 is disposed in n-type layer 214 adjacent to outer surface 226. Source p+ region 218 has a greater p-type dopant concentration than p-body region 216, and each of source n+ region 220 and drain n+ region 222 has a greater n-type dopant concentration than n-type layer 214.

Silicon semiconductor structure 202 can include additional impurity regions without departing from the scope hereof. Additionally, the locations of source p+ region 218 and source n+ region 220 within p-body region 216 can be varied. For example, in an alternate embodiment (not illustrated), source p+ region 218 is disposed behind source n+ region 220 within p-body region 216.

One or more regions of silicon semiconductor structure 202 optionally has a graded dopant concentration. For example, in some embodiments, n-type layer 214 has a graded n-type dopant concentration where n-type dopant concentration is greatest near drain n+ region 222, and p-body region 216 has a graded p-type dopant concentration where p-type dopant concentration is greatest near source n+ region 220. In certain embodiments, n-type layer 214 is configured to have n-type dopant gradient concentrations which help maximize accumulation conductance while maintaining desired breakdown voltage of LDMOS transistor 200.

Vertical gate 204 includes a gate conductor 228 and a gate dielectric layer 230 each disposed in a trench 232 of silicon semiconductor structure 202. Depth of trench 232 is selected, in part, according to required breakdown voltage of LDMOS transistor 200. Breakdown voltage magnitude increases with increasing depth of trench 232 in thickness direction 224. Gate conductor 228 extends from outer surface 226 into silicon semiconductor structure 202 in thickness direction 224, and gate dielectric layer 230 includes a first dielectric section 234, a second dielectric section 236, and a third dielectric section 238. Gate conductor 228 is disposed between source n+ region 220 and drain n+ region 222 in a lateral direction 240 orthogonal to thickness direction 224. The fact that LDMOS transistor 200 has a vertical gate instead of a horizontal gate minimizes length of LDMOS transistor 200 in lateral direction 240, thereby promoting small transistor size and high transformer performance.

Each dielectric section 234, 236, and 238 separates gate conductor 228 from silicon semiconductor structure 202 by a respective separation distance. In particular, first dielectric section 234 separates gate conductor 228 from a drain portion 242 of n-type layer 214 in lateral direction 240 by a first separation distance $t_1$. Additionally, second dielectric section 236 separates gate conductor 228 from a well portion 244 of n-type layer 214 in thickness direction 224 by a second separation distance $t_2$, and second dielectric section 236 also separates gate conductor 228 from a source portion 246 of n-type layer 214 in lateral direction 240 by second separation distance $t_2$. Third dielectric section 238 separates gate conductor 228 from p-body region 216 by a third separation distance $t_3$. Drain portion 242 of n-type layer 214 is disposed (a) below drain region 222 in thickness direction 224 and (b) beside vertical gate 204 in lateral direction 240. Well portion 244 of n-type layer 214 is disposed below vertical gate 204 in thickness direction 224. Source portion 246 of n-type layer 214 is disposed (a) below p-body region 216 in thickness 224 direction and (b) beside vertical gate 204 in lateral direction 240.

Each of first separation distance $t_1$, second separation distance $t_2$, and third separation distance $t_3$ is different from each other of first separation distance $t_1$, second separation distance $t_2$, and third separation distance $t_3$. Consequently, gate dielectric layer 230 has a stepped sidewall 248, as seen when LDMOS transistor 200 is viewed cross-sectionally in a depth direction 250, where depth direction 250 is orthogonal to each of thickness direction 224 and lateral direction 240. As discussed below, such differences in separation distances may advantageously enable achieving both high breakdown voltage and low on-resistance of LDMOS transistor 200.

First dielectric section 234, second dielectric section 236, and third dielectric section 238 are formed, for example, of silicon dioxide or a high-K dielectric material such as one or more of $HfO_2$, $TiO_2$, $ZrO_2$, and $HfAlO_x$. In some embodiments, first dielectric section 234, second dielectric section 236, and third dielectric section 238 are formed of a common dielectric material, while in some other embodiments, at least two of first dielectric section 234, second dielectric section 236, and third dielectric section 238 are formed of different dielectric materials.

Source electrode 206 is disposed on outer surface 226 and contacts each of source p+ region 218 and source n+ region 220. Drain electrode 208 disposed on outer surface 226 and contact drain n+ region 222, and gate electrode 210 is disposed on outer surface 226 and contacts gate conductor 228. In some alternate embodiments, source electrode 206 is replaced with two separate electrodes contacting source p+ region 218 and source n+ region 220, respectively.

When positive voltage $V_{DS}$ is applied between drain electrode 208 and source electrode 206, a p-n junction formed at the interface of n-type layer 214 and p-body region 216 is reversed biased, so that very little current flows between drain electrode 208 and source electrode 206 by default. However, a positive voltage $V_{GS}$ applied between gate electrode 210 and source electrode 206 creates negative charges in semiconductor structure 202 adjacent to third dielectric section 238 in lateral direction 240, causing a minority-carrier channel to form in a portion of p-body region 216 approximately indicated by dashed-line 252. This channel has excess electrons and therefore conducts electric current through p-body region 216 from n-type layer 214 to source n+ region 220. Consequentially, current will flow from drain n+ region 222 to source n+ region 220 when $V_{GS}$ exceeds a threshold value and $V_{DS}$ is a positive value. The threshold value is established, in part, by the dopant concentration in p-body region 216 and by the value of third separation distance $t_3$. For example, threshold voltage can be reduced by decreasing p-type dopant concentration in p-body region 216 adjacent to third dielectric section 238 and/or by decreasing the value of third separation distance $t_3$. Source p+ region 218 forms an ohmic contact between p-body region 216 and source electrode 206 to help prevent a parasitic bipolar junction transistor (not shown) in silicon semiconductor substrate 202 from activating.

The values of each of first, second, and third separation distances $t_1$, $t_2$, and $t_3$, affect different respective characteristics of LDMOS transistor 200. For example, gate-to-drain breakdown voltage of LDMOS transistor 200 increases with increasing value of first separation distance $t_1$, while value of second separation distance $t_2$, on the other hand, affects electric field distribution, gate-to-drain capacitance, and accumulation resistance in n-type layer 214. Value of third separation distance $t_3$, in turn, affects threshold voltage and gate-to-source breakdown voltage of LDMOS transistor 200. Specifically, threshold voltage decreases with decreasing value of third separation distance $t_3$, while gate-to-source breakdown voltage of LDMOS transistor 200 increases with increasing value of third separation distance $t_3$.

Forming gate dielectric layer 230 of first, second, and third dielectric sections 234, 236, and 238 enables each of respective first, second, and third separation distances $t_1$, $t_2$, and $t_3$ to be independently selected, thereby helping LDMOS transistor 200 achieve both high breakdown voltage and low on-resistance. For example, first separation distance $t_1$ may be selected to achieve a high gate-to-drain breakdown voltage, while second separation distance $t_2$ may be independently selected to achieve a desired balance between accumulation conductance and uniform electric field distribution, to promote low on-resistance which achieving high breakdown voltage. If gate dielectric layer 230 were instead formed of a single dielectric layer having uniform thickness, the dielectric layer thickness would need to be chosen to achieve a sufficiently high gate-to-drain breakdown voltage, thereby resulting in a less than optimum thickness of the dielectric layer adjacent to well portion 244 and source portion 246 of n-type layer 214, which would increase on-resistance. As another example, the ability of first, second, and third separation distances $t_1$, $t_2$, and $t_3$ to be independently selected enables $t_1$ and $t_2$ to be selected without being constrained by a value of $t_3$ required to achieve desired gate control, thereby further enabling $t_1$ and $t_2$ to be selected to achieve high breakdown voltage and low on-resistance, respectively. As yet another example, the ability to independently select first and second separation distances $t_1$ and $t_2$ enables doping profile of n-type layer 214 to be different in drain portion 242 of n-type layer 214 than in source portion 246 of n-type layer 214 and in well portion 244 of n-type layer 214, further enabling LDMOS transistor 200 to achieve high breakdown voltage and low on-resistance. In a particular embodiment, third separation distance $t_3$ is less than each of first separation distance $t_1$ and second separation distance $t_2$.

Figure 4:
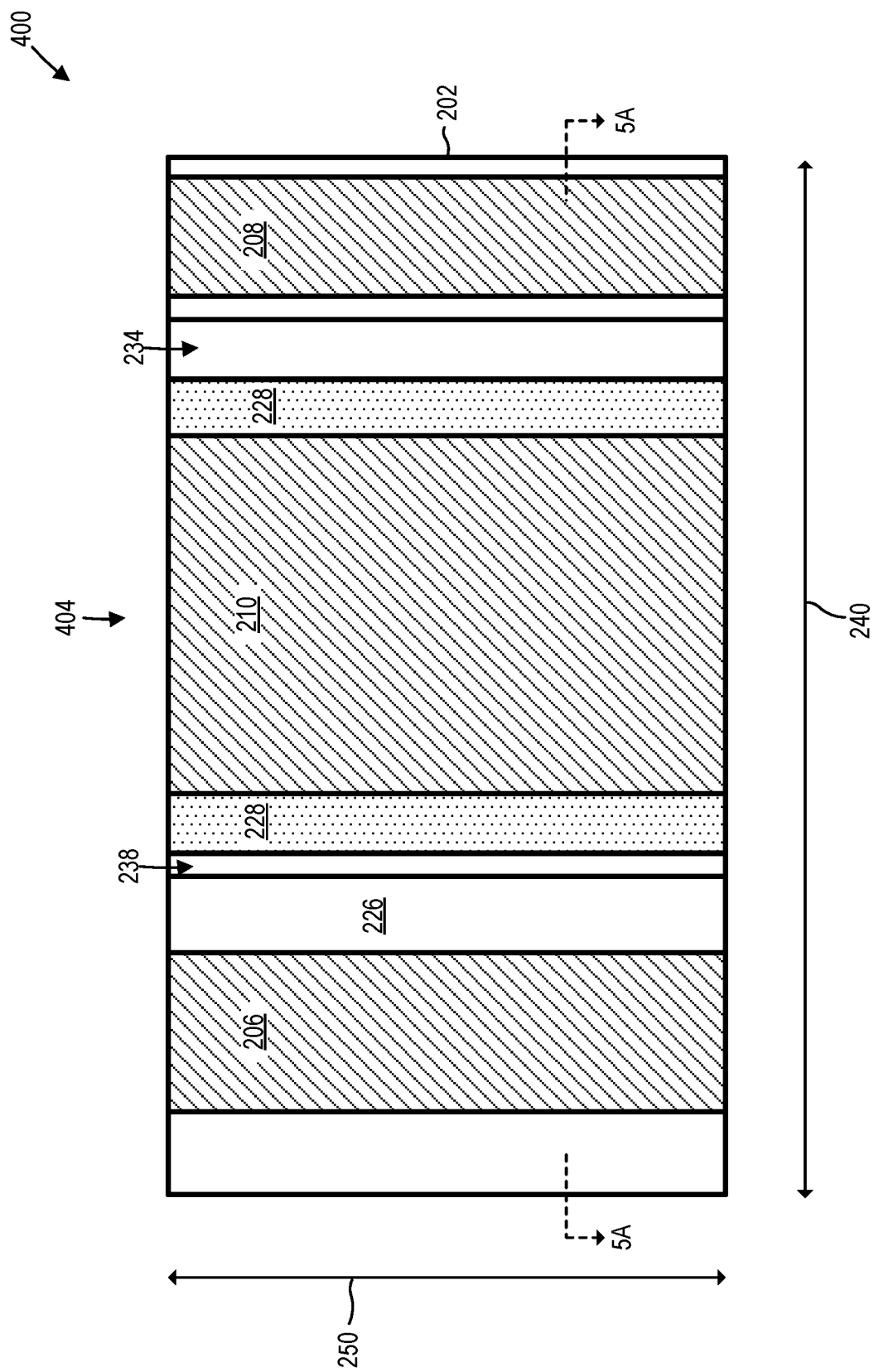
FIG. 4 is a top plan view of a LDMOS transistor including a vertical gate with four dielectric sections, according to an embodiment.
Figure 5:
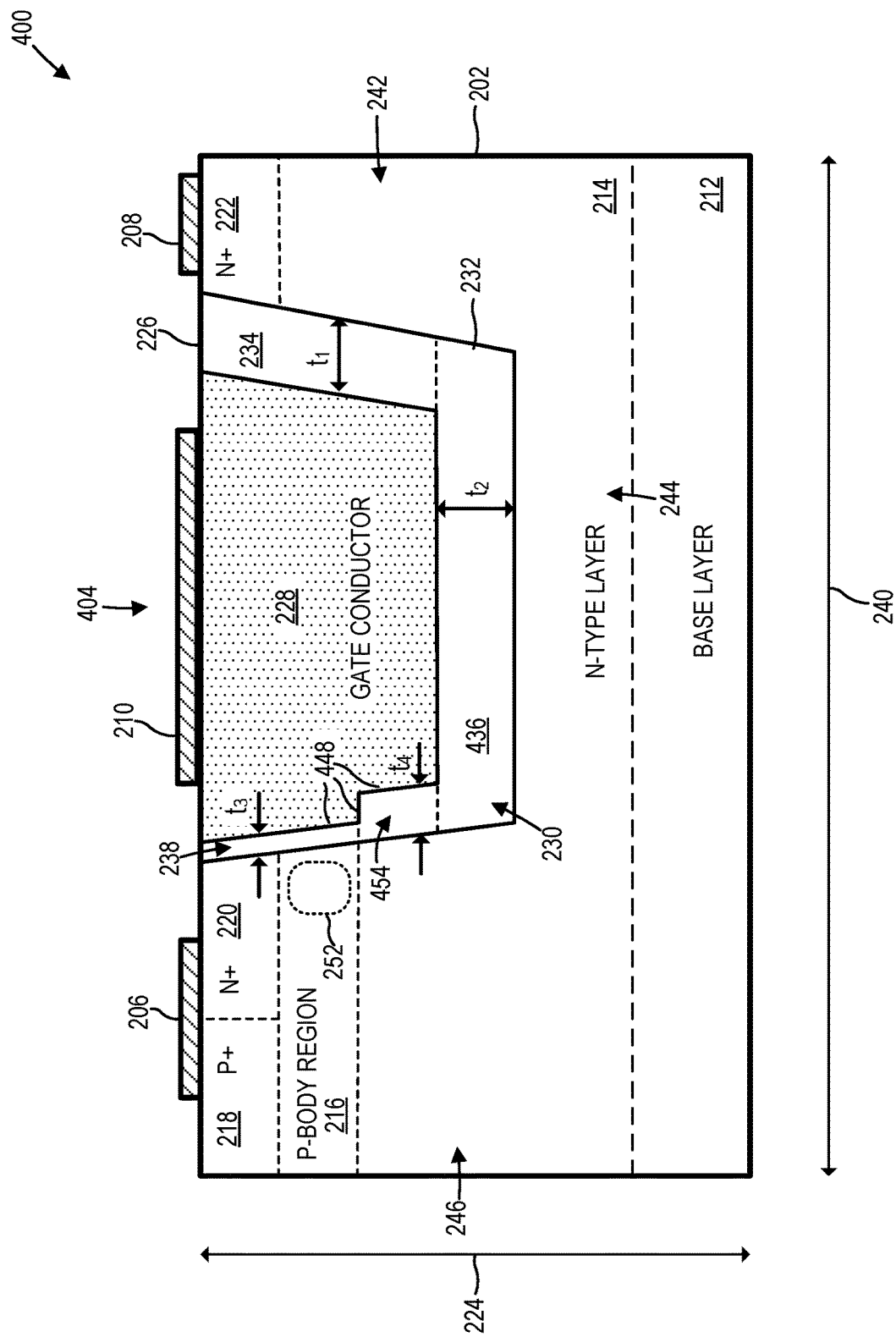
FIG. 5 is a cross-sectional view of the FIG. 4 LDMOS transistor taken along line 5A-5A of FIG. 4.

Gate dielectric layer 230 could be modified to have additional dielectric sections, such as to enable further optimization of LDMOS transistor 200. For example, FIGS. 15A-15K, discussed below, illustrate an example of an alternate embodiment including five dielectric sections. As another example, FIG. 4 is a top plan view of a LDMOS transistor 400 including a vertical gate with four dielectric sections. FIG. 5 is a cross-sectional view of LDMOS transistor 400 taken along line 5A-5A of FIG. 4. LDMOS transistor 400 of FIGS. 4 and 5 is like LDMOS transistor 200 of FIGS. 2 and 3 but with vertical gate 204 replaced with a vertical gate 404. Vertical gate 404 is like vertical gate 204 but with second dielectric section 236 replaced with a second dielectric section 436 and a fourth dielectric section 454 such that vertical gate 404 has a stepped sidewall 448. Second dielectric section 436 is analogous to second dielectric section 236, and fourth dielectric section 454 separates gate conductor 228 from source portion 246 of the n-type layer 214 in lateral direction 240 by a fourth separation distance $t_4$. Each of first, second, third, and fourth separation distances $t_1$, $t_2$, $t_3$, and $t_4$ are typically different from each other to optimize different respective characteristics of LDMOS transistor 400. The ability to select fourth separation distance $t_4$ independently of second separation distance $t_2$ enables accumulation conductance in source portion 246 of n-type layer 214, which is affected by the value of fourth separation distance $t_4$, to be optimized independently of electric field distribution in well portion 244 of n-type layer 214, which is affected by the value of second separation distance $t_2$, thereby further promoting high breakdown voltage and low on-resistance of LDMOS transistor 400. Such ability to select fourth separation distance $t_4$ independently of second separation distance $t_2$ may be particularly advantageous in embodiments where trench 232 has a large depth in thickness direction 224 which makes it difficult to optimize gate-to-drain capacitance, electric field distribution, and accumulation conductance if second separation distance $t_2$ and fourth separation distance $t_4$ must have a common value. In a particular embodiment, third separation distance $t_3$ is less than each of first separation distance $t_1$ and second separation distance $t_2$, and fourth separation distance $t_4$ is less than second separation distance $t_2$.

Figure 6:
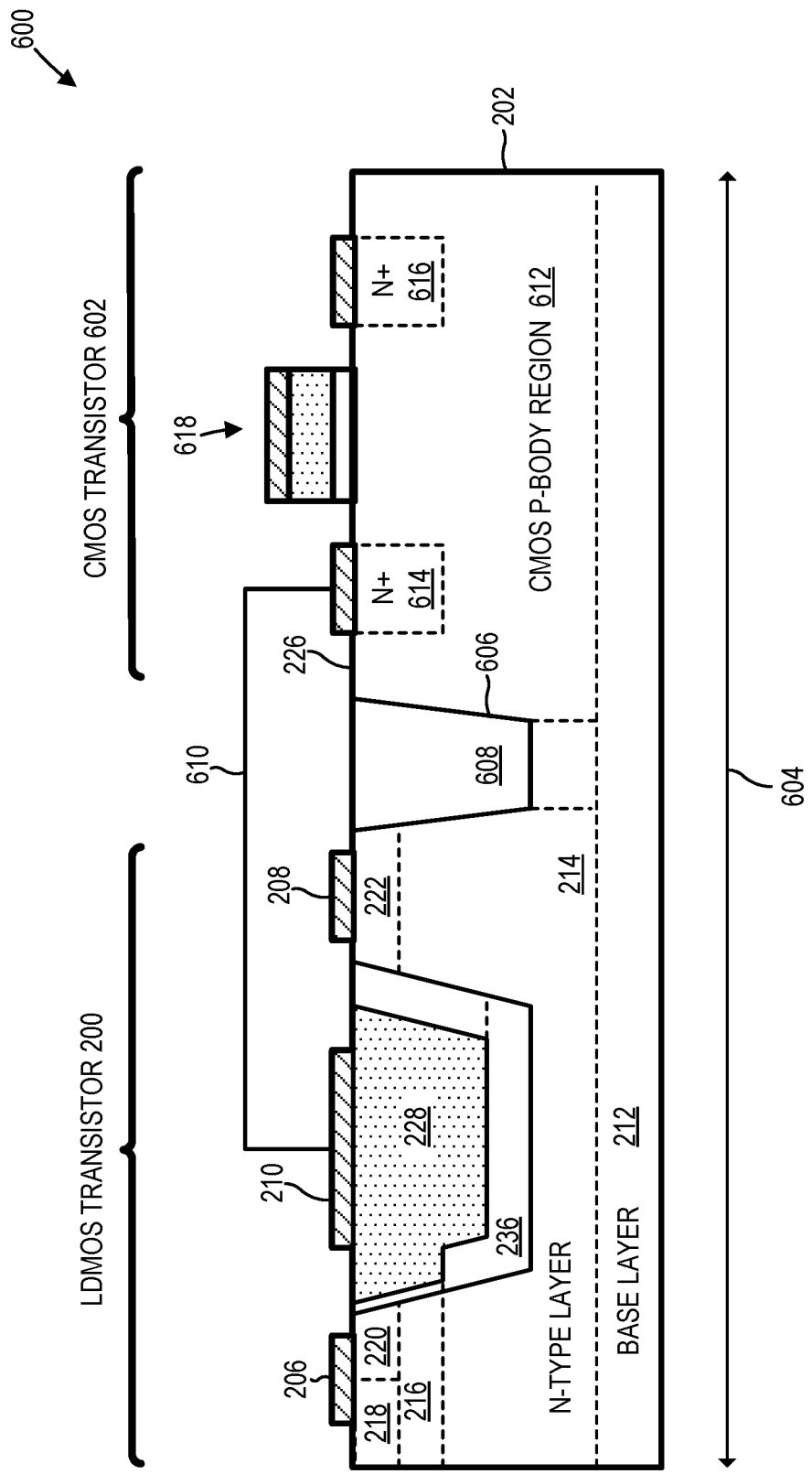
FIG. 6 is a cross-sectional view of a portion of an integrated circuit including an instance of the FIG. 2 LDMOS transistor and a complementary metal oxide semiconductor transistor, according to an embodiment.
Figure 20:
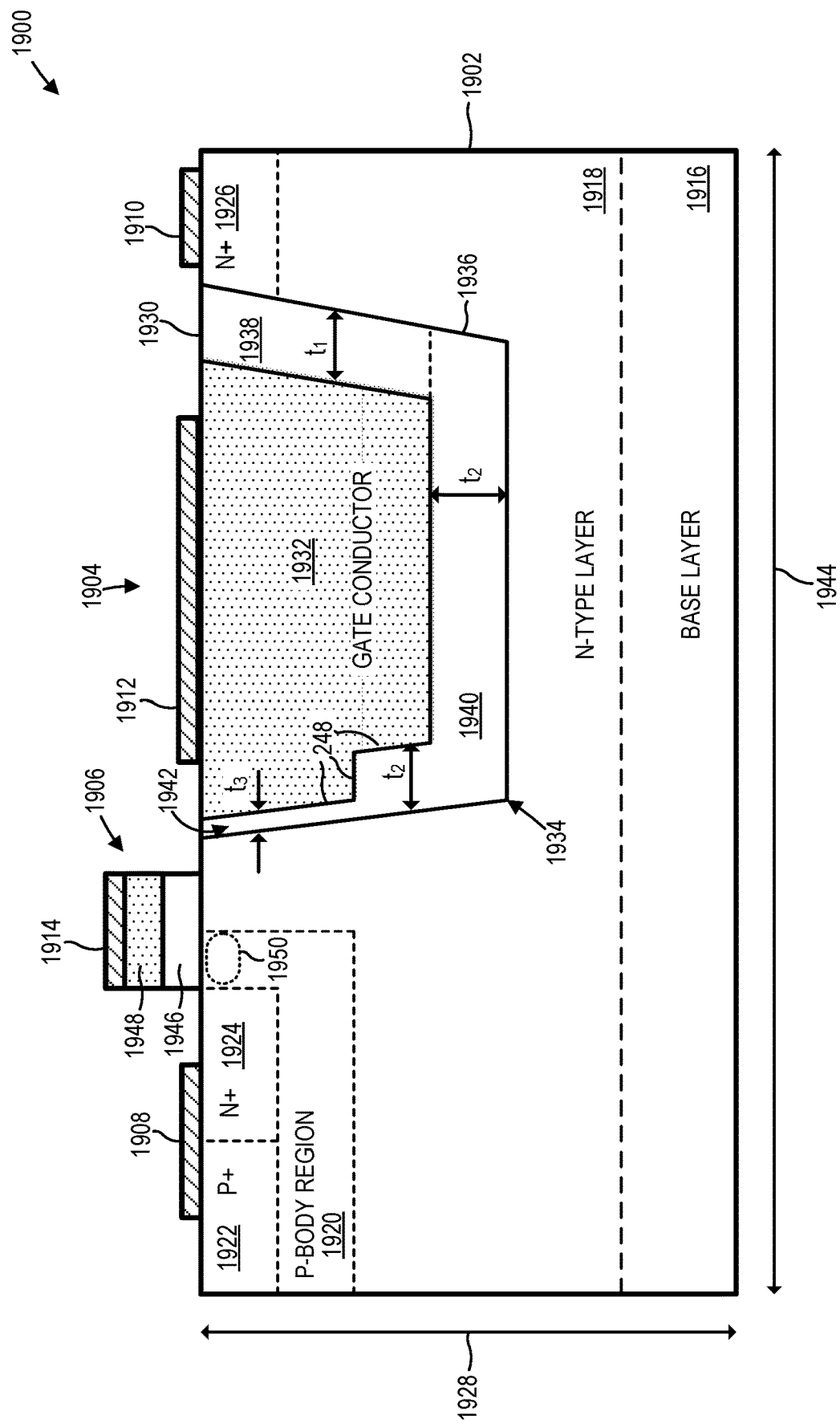
FIG. 20 is a cross-sectional view of the FIG. 19 LDMOS transistor taken along line 20A-20A of FIG. 19.
Figure 21:
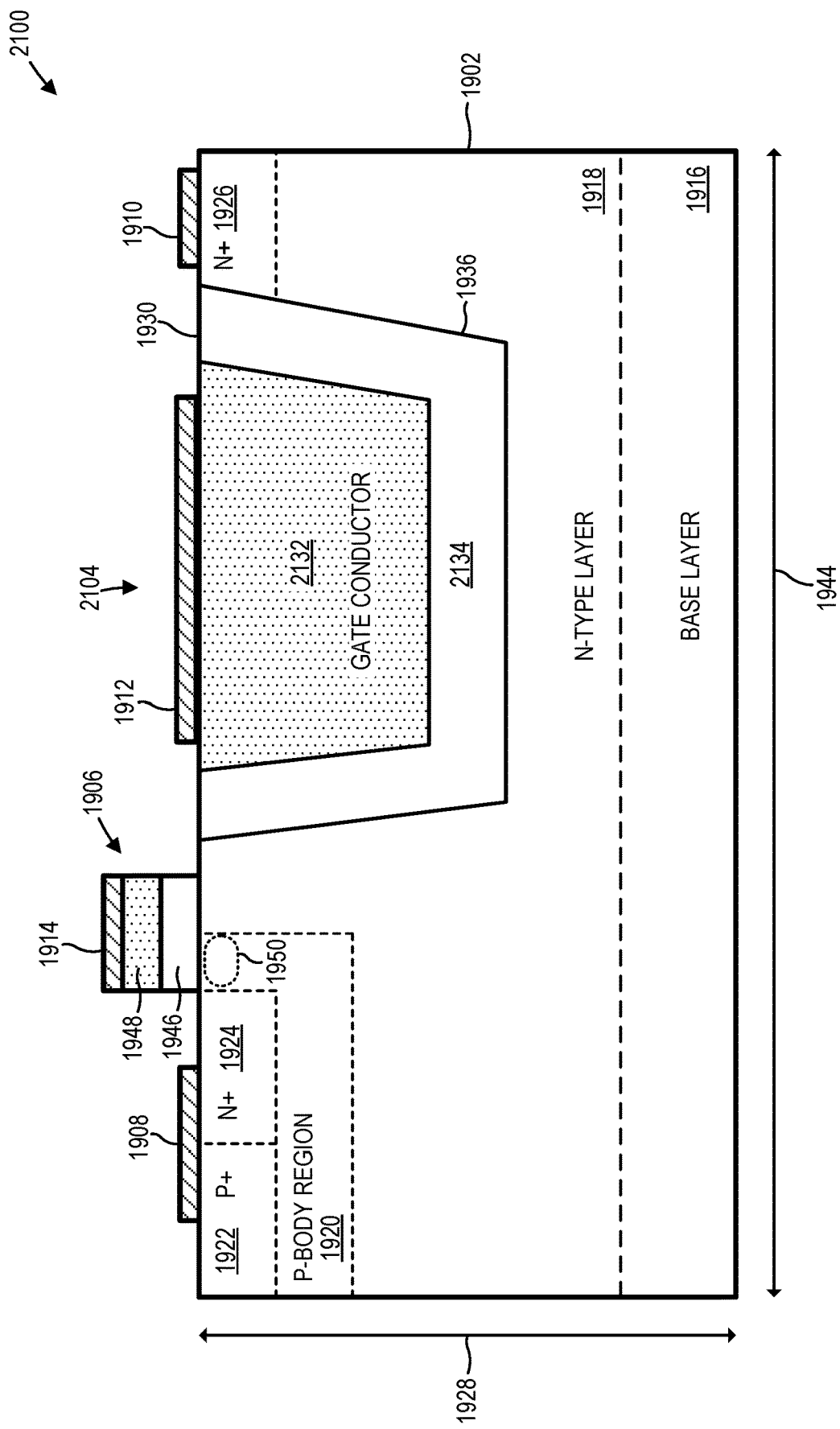
FIG. 21 is a cross-sectional view of a LDMOS transistor which is like the LDMOS transistor of FIGS. 19 and 20, but with a vertical gate having a gate conductor disposed within a symmetrical gate dielectric layer, according to an embodiment.

One possible application of the LDMOS transistors disclosed herein is in an integrated circuit, such as an integrated circuit including one or more instances of the present LDMOS transistors along with one or more other type of transistors. For example, FIG. 6 is a cross-sectional view of a portion of an integrated circuit 600 including an instance of LDMOS transistor 200 and a complementary metal oxide semiconductor (CMOS) transistor 602 sharing silicon semiconductor structure 202 and partially separated in a lateral direction 604 by a shallow isolation trench 606. Shallow isolation trench 606 is filled with a dielectric material 608. CMOS transistor 602 is, for example, part of driver circuit (not shown) which controls switching of LDMOS transistor 200. CMOS transistor 602 is optionally electrically coupled to LDMOS transistor 200 via one or more electrical conductors 610 of integrated circuit 600, as symbolically illustrated in FIG. 6. CMOS transistor 602 includes a CMOS p-body-region 612, a CMOS source n+ region 614, a CMOS drain n+ region 616, and a CMOS gate structure 618. CMOS p-body region 612 is disposed in silicon semiconductor structure 202, and each of CMOS source n+ region 614 and CMOS drain n+ region 616 are disposed in CMOS p-body region 612 adjacent to outer surface 226. CMOS gate structure 618 is disposed on outer surface 226 between CMOS source n+ region 614 and CMOS drain n+ region 616 in lateral direction 604. LDMOS transistor 200 in integrated circuit 600 could be replaced with LDMOS transistor 400, LDMOS transistor 1900 (FIGS. 19 and 20 below), or LDMOS transistor 2100 (FIG. 21 below).

Figure 7:
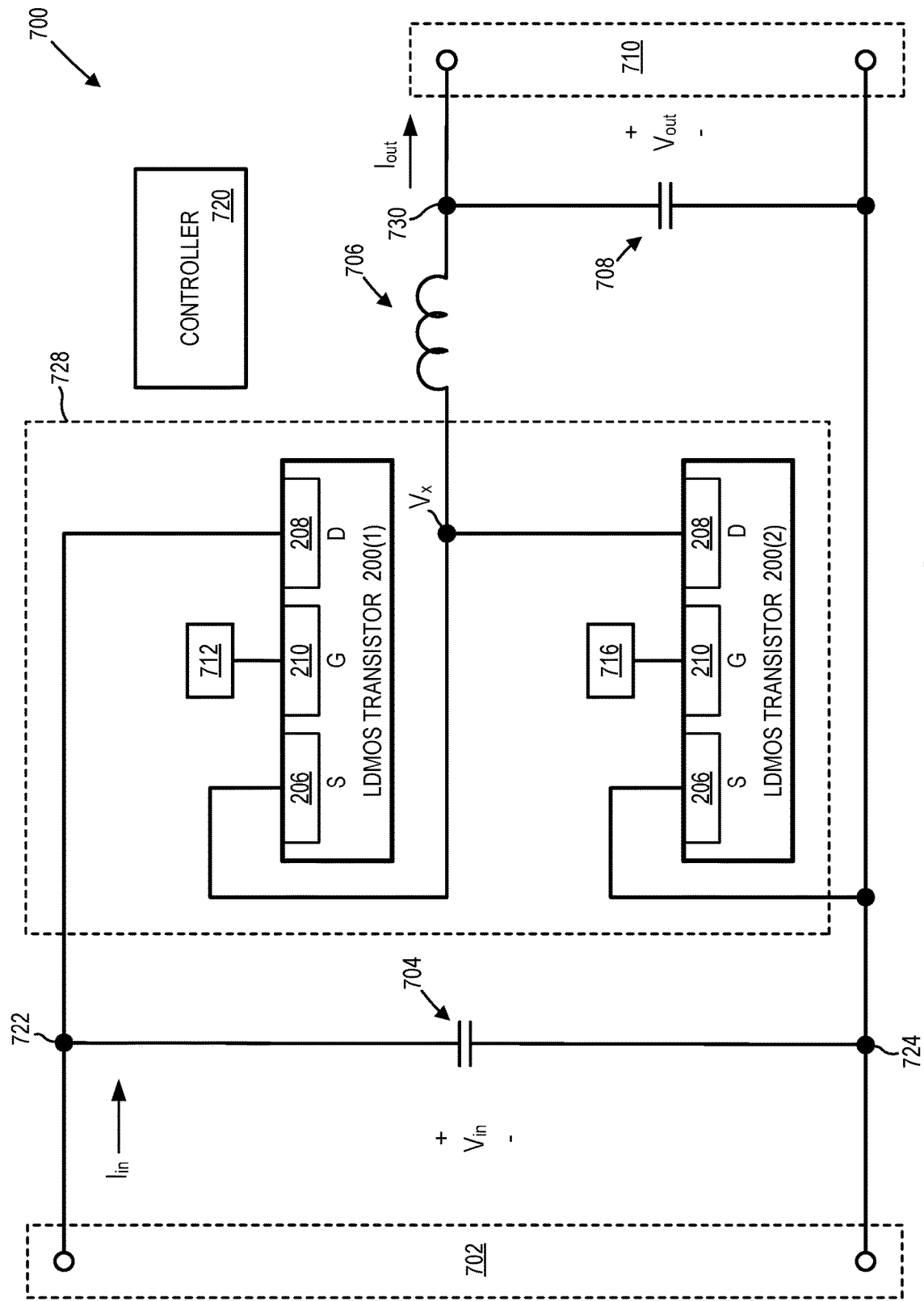
FIG. 7 schematically illustrates a buck converter including two instances of the LDMOS transistor of FIG. 2, according to an embodiment.

One possible application of the LDMOS transistors disclosed herein is in a switching power converter. For example, FIG. 7 schematically illustrates a buck converter 700 including two instances of LDMOS transistor 200, hereinafter referred to as LDMOS transistor 200(1) and LDMOS transistor 200(2). LDMOS transistors 200(1) and 200(2) are schematically illustrated in FIG. 7 to promote illustrative clarity. Buck converter 700 further includes an input port 702 electrically coupled to an input power source (not shown), an input capacitor 704, an inductor 706, an output capacitor 708, an output port 710 electrically coupled to a load (not shown), first driver circuitry 712, second driver circuitry 716, and a controller 720.

Input port 702 is electrically coupled across a positive input node 722 and a reference node 724. Input capacitor 704 is electrically coupled across positive input node 722 and reference node 724, and input capacitor 704 provides a path for input ripple current drawn by buck converter 700. Drain electrode 208 of LDMOS transistor 200(1) is electrically coupled to positive input node 722, and source electrode 206 of LDMOS transistor 200(1) is electrically coupled to a switching node $V_x$. Gate electrode 210 transistor 200(1) is electrically coupled to first driver circuitry 712. Drain electrode 208 of LDMOS transistor 200(2) is electrically coupled to switching node $V_x$, and source electrode 206 of LDMOS transistor 200(2) is electrically coupled to reference node 724. Gate electrode 210 of LDMOS transistor 200(2) is electrically coupled to second driver circuitry 716. LDMOS transistors 200(1) and 200(2), first driver circuitry 712, and second driver circuitry 716 collectively form a switching circuit 728. Inductor 706 is electrically coupled between switching node $V_x$ and a positive output node 730, and output port 710 is electrically coupled across positive output node 730 and reference node 724. Output capacitor 708 is electrically coupled across positive output node 730 and reference node 724, and output capacitor 708 provides a path for output ripple current generated by buck converter 700.

Controller 720 controls switching of switching circuit 728 to transfer power from the power source (electrically coupled to input port 702) to the load (electrically coupled to output port 710). In particular, controller 720 controls first driver circuitry 712 to repeatedly switch gate electrode 210 of LDMOS transistor 200(1) between two different voltage magnitudes, to repeatedly create and destroy a minority-carrier channel in p-body region 216 of LDMOS transistor 200(1). Consequentially, LDMOS transistor 200(1) repeatedly switches between its conductive and non-conductive states under the control of controller 720. Controller 720 also controls second driver circuitry 716 to repeatedly switch gate electrode of LDMOS transistor 200(2) between two different voltage magnitudes to cause LDMOS transistor 200(2) to repeatedly switch between its conductive and non-conductive states. Controller 720 controls switching of LDMOS transistor 200(2) such that it provides a freewheeling function, or in other words, so that LDMOS transistor 200(2) provides a path for current flowing through inductor 706 when LDMOS transistor 200(1) is in its non-conductive state. In some embodiments, controller 720 controls switching of switching circuit 728 to regulate one or more parameters of buck converter 700, such as input voltage $V_{in}$, input current $I_{in}$, input power $P_{in}$, output voltage $V_{out}$, output current $I_{out}$, and output power $P_{out}$. Connections between controller 720 and other components of buck converter 700 are not shown to promote illustrative clarity.

One or more of LDMOS transistors 200(1) and 200(2) could be replaced with an instance of LDMOS transistor 400, LDMOS transistor 1900 (FIGS. 19 and 20 below), or LDMOS transistor 2100 (FIG. 21 below). Additionally, it should be appreciated that the LDMOS transistors disclosed herein are not limited to use in a buck converter, or even to use in a switching power converter. For example, the LDMOS transistors disclosed herein could alternately be used in an amplifier.

Discussed below are several possible methods of manufacturing the LDMOS transistors disclosed herein. It should be appreciated, however, that LDMOS transistors 200 and 400 could be manufactured by methods other than those discussed below. Additionally, the manufacturing methods discussed below could be used to manufacture LDMOS transistors other than LDMOS transistors 200 and 400.

It may be desirable to manufacture the LDMOS transistors disclosed herein with wafer fabrication techniques compatible with standard CMOS processes, such as for manufacturing integrated circuits like that illustrated in FIG. 6. Such compatibility of manufacturing techniques may enable integration of LDMOS transistors 200 and 400 with the necessary drive circuitry, such as first driver circuitry 712, second driver circuitry 716, and controller 720 of FIG. 7, for control of the LDMOS transistors. Accordingly, in certain embodiments, integrated circuits including at least one LDMOS transistor and at least one CMOS transistor are formed using a method including forming one or more deep trenches, depositing dielectric material in each deep trench, filling each trench with a conductive material such as polysilicon, and subsequent CMOS processing.

In certain embodiments, dedicated processing steps and accompanying processing flow produce a device topology that is insensitive to mask layer misalignment and processing non-idealities. The need for highly reproducible device structures, which is potentially achieved by certain of the manufacturing methods disclosed herein, is heightened when high voltage capability is targeted in conjunction with high current carrying capability. Device dimensions and material selection are undertaken, for example, to balance the competing requirements of manufacturing invariance and high electrical performance.

Figure 8:
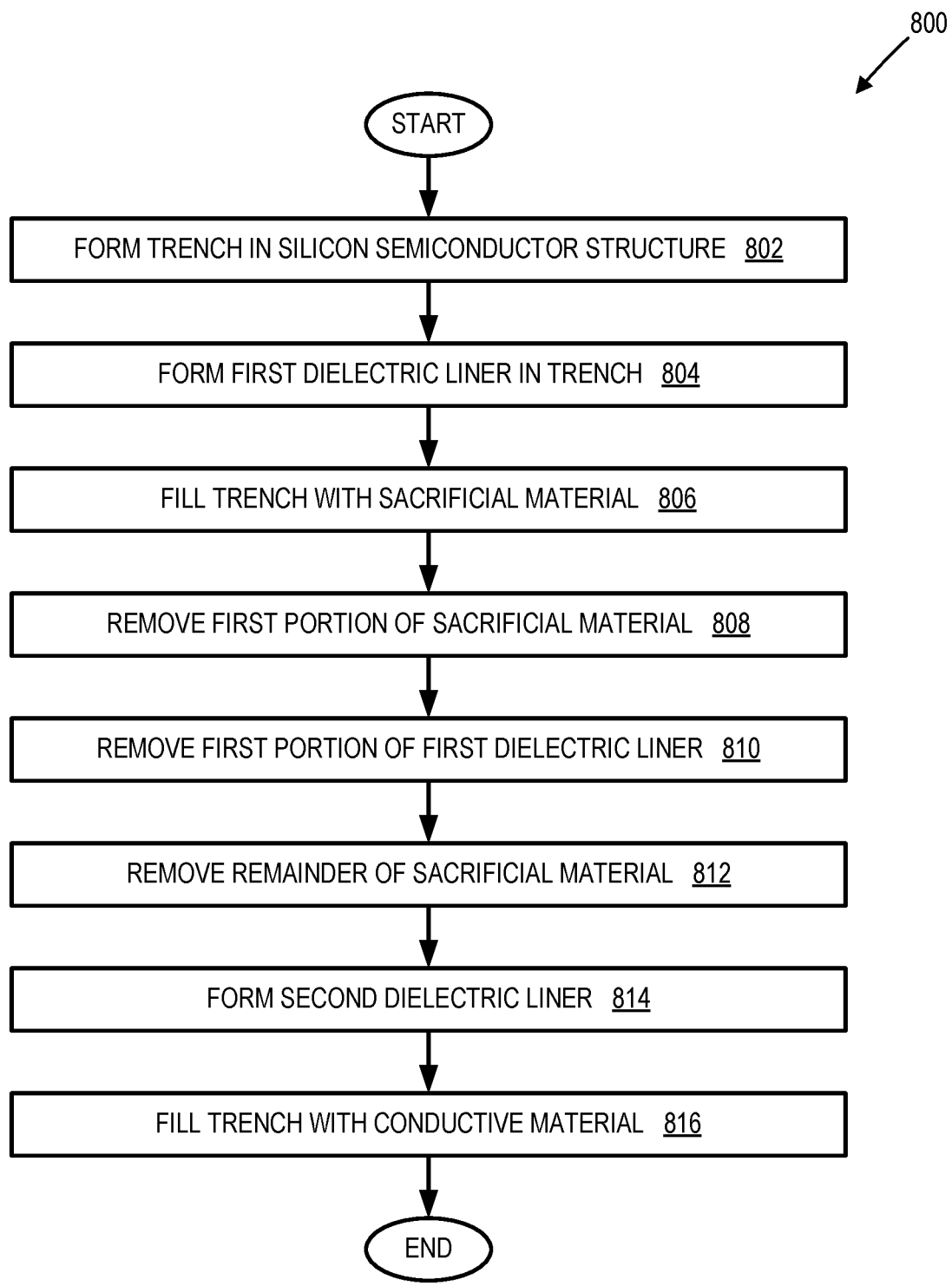
FIG. 8 illustrates a method for forming a vertical gate of a LDMOS transistor, according to an embodiment.
Figure 9A:
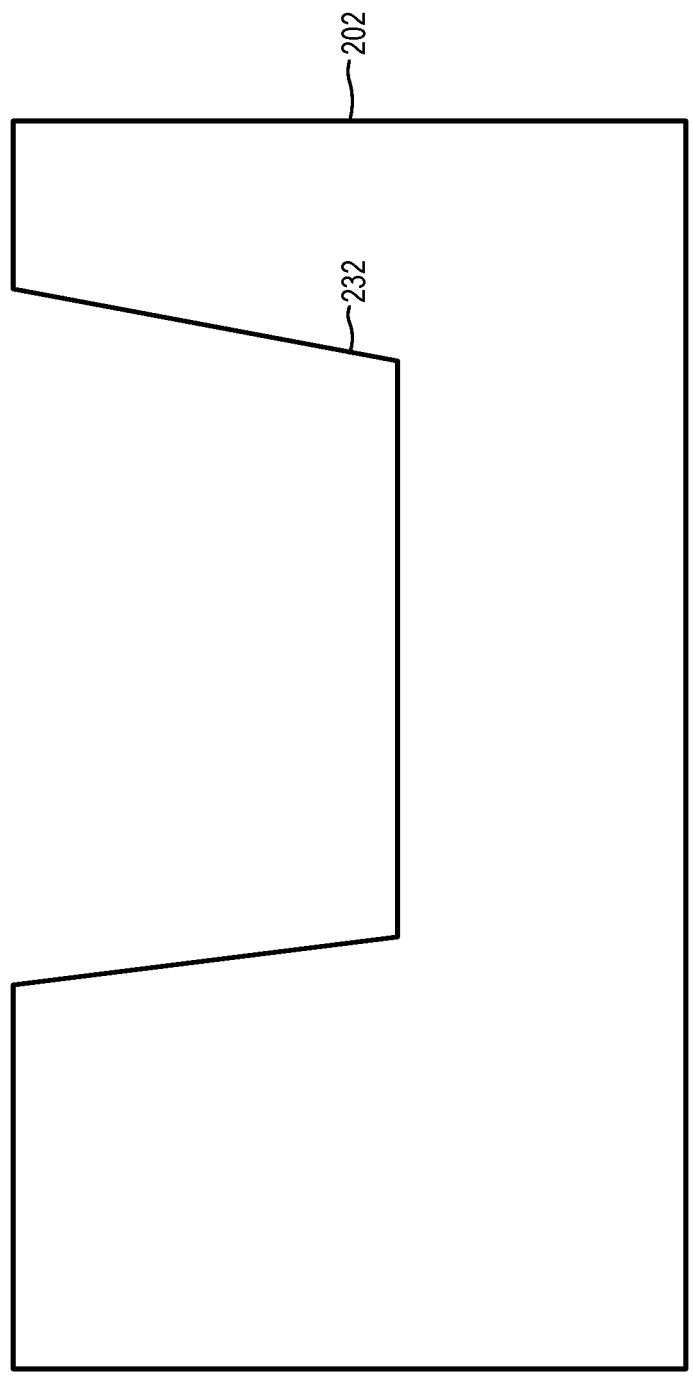
FIGS. 9A-9H illustrate one example of the FIG. 8 method being used to form the vertical gate of the FIG. 2 LDMOS transistor.
Figure 9B:
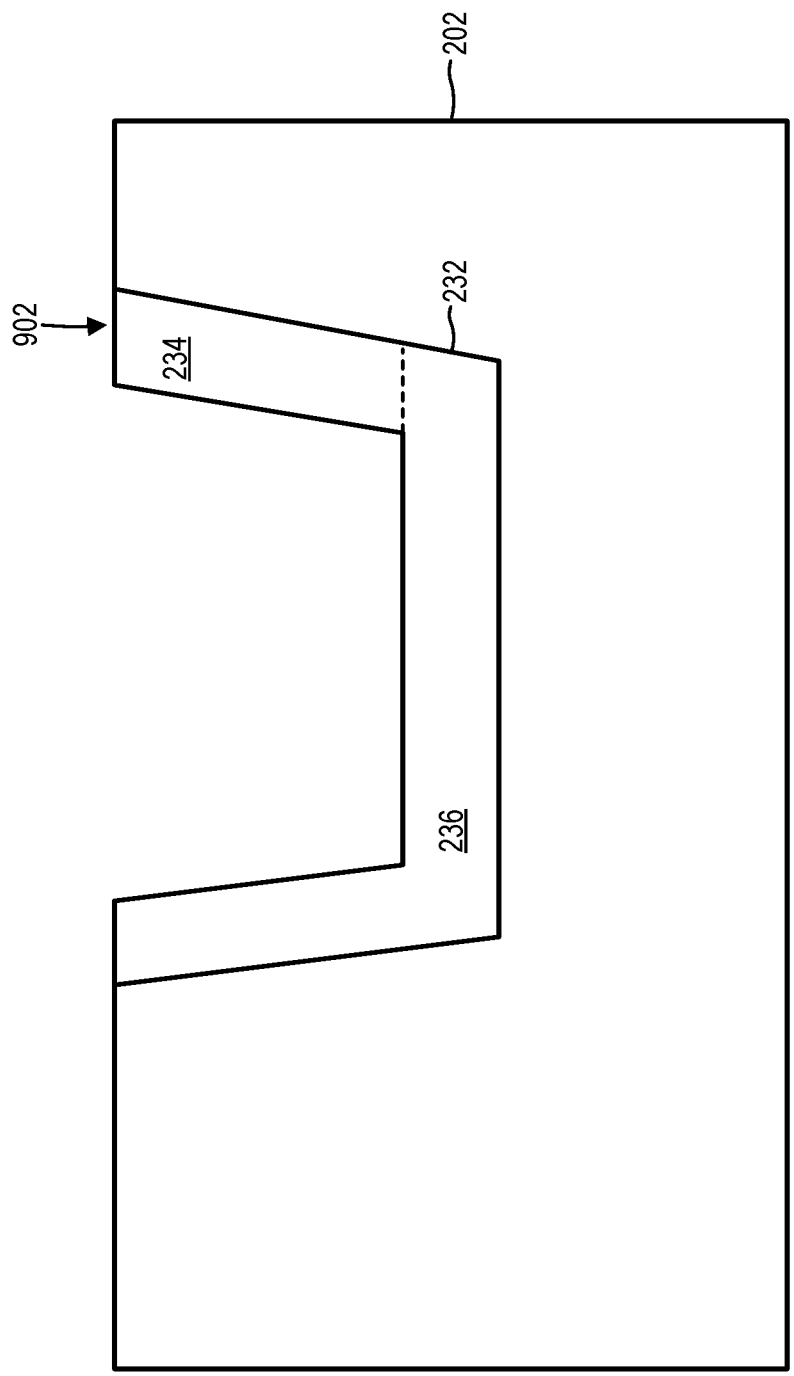
Figure 9C:
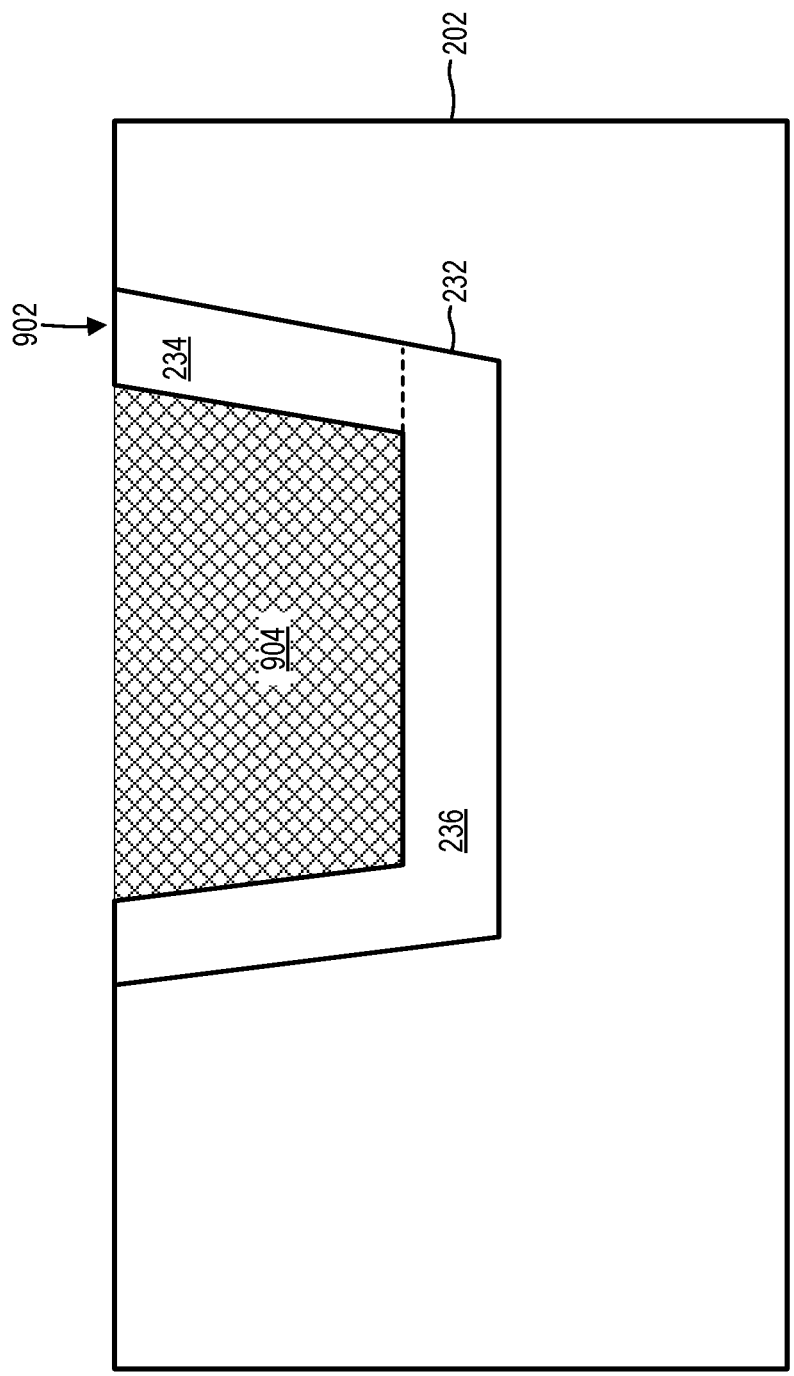

FIG. 8 illustrates a method 800 for forming a vertical gate of a LDMOS transistor, and FIG. 9A-9H illustrates one example of forming vertical gate 204 of LDMOS transistor 200 using method 800. FIGS. 8 and 9 are best viewed together. In step 802 a trench is formed in a silicon semiconductor structure. In one example of step 802 illustrated in FIG. 9A, trench 232 is formed in silicon semiconductor structure 202. In step 804, a first dielectric liner is formed in the trench. In one example of step 804, a first dielectric liner 902 is formed in trench 232 with appropriate thicknesses to form first dielectric section 234 and second dielectric section 236, as illustrated in FIG. 9B, using processes such as nitride deposition, oxide growth, and nitride removal. In step 806, the trenched is filled with a sacrificial material. In one example of step 806, trench 232 is filled with a spin-on carbon material 904, or another material significantly more susceptible to etchant than first dielectric liner 902, as illustrated in FIG. 9C.

Figure 9D:
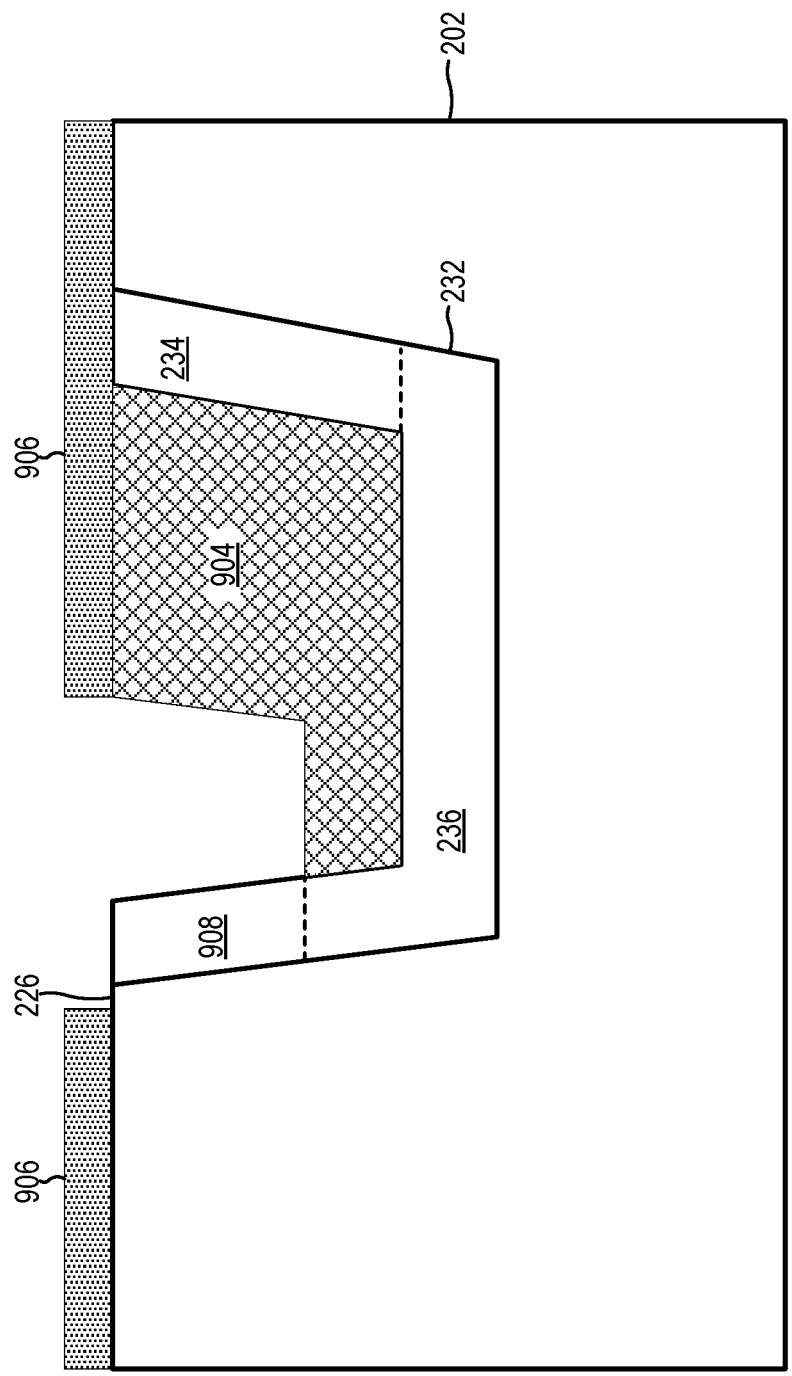
Figure 9E:
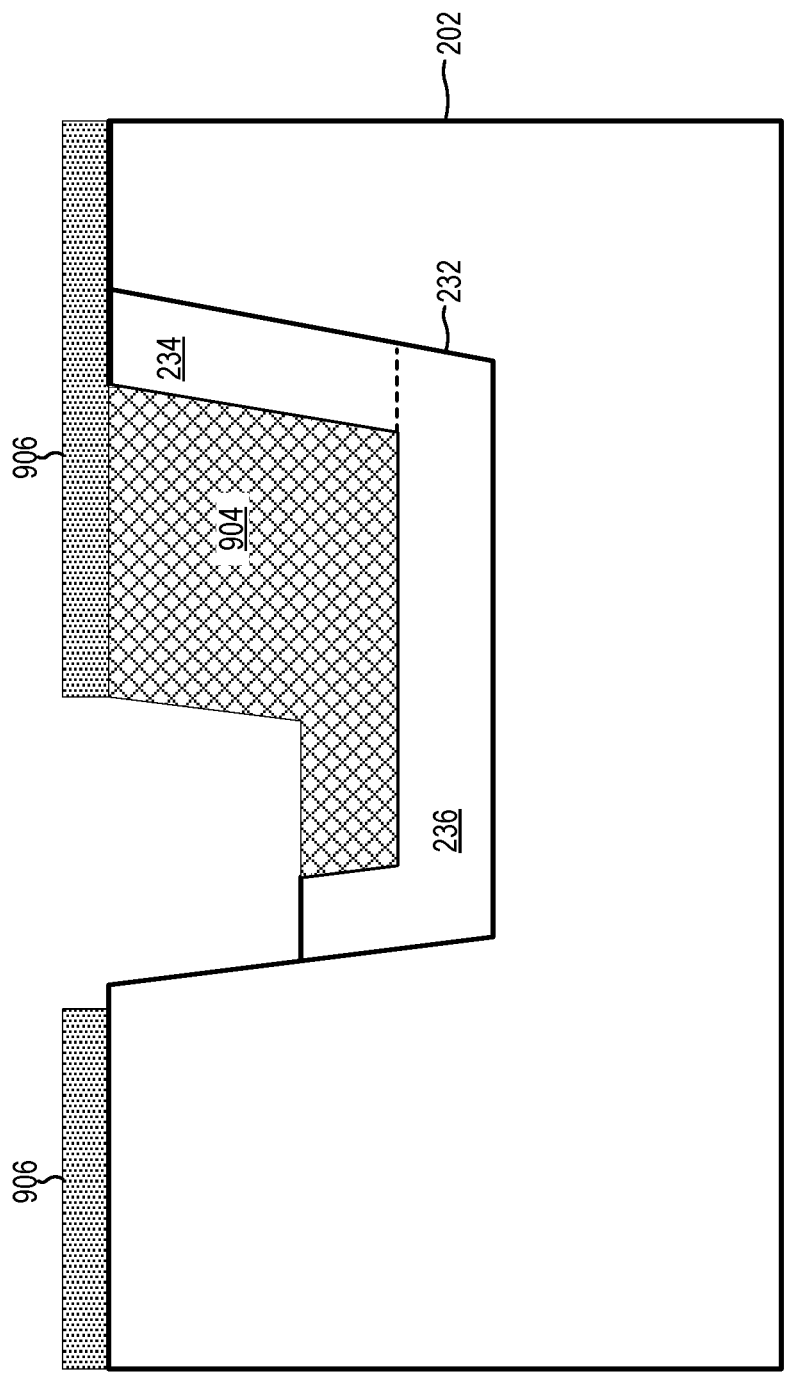
Figure 9F:
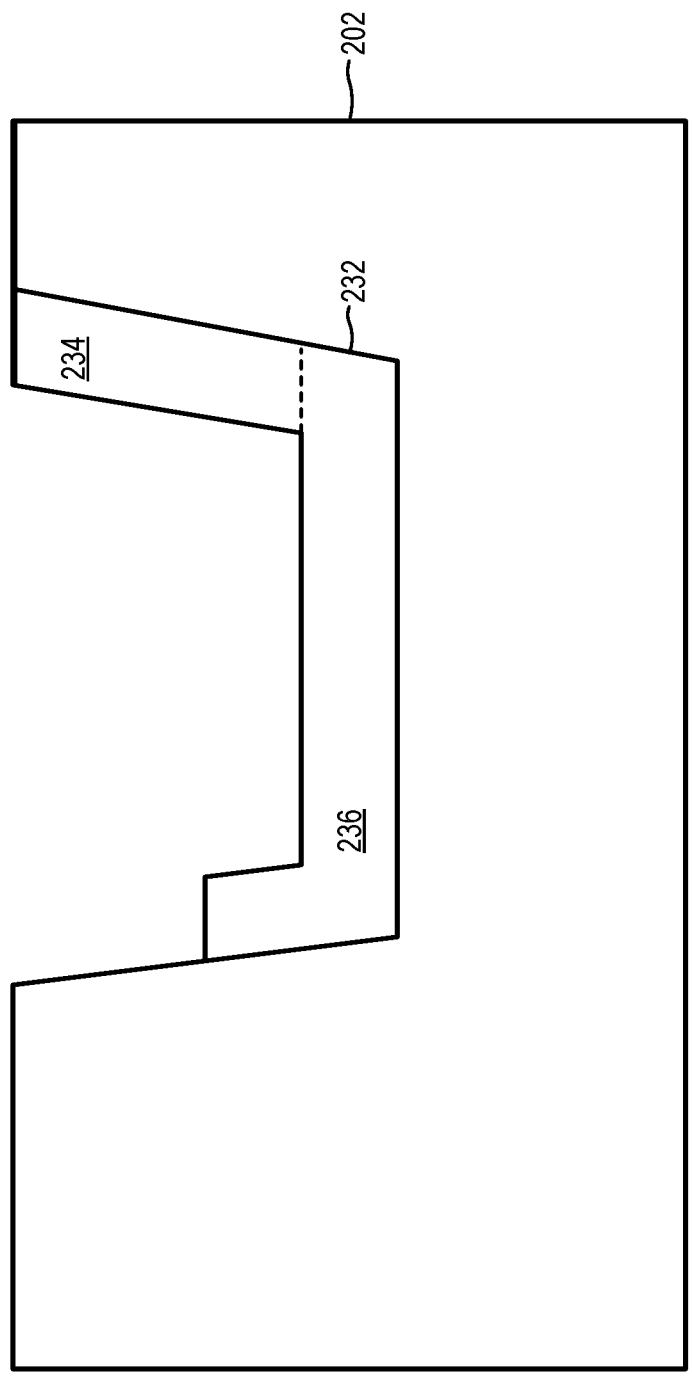

In step 808, a first portion of the sacrificial material is removed to expose a first portion of the first dielectric liner. In one example of step 808, outer surface 226 of silicon semiconductor structure 202 is patterned with a photoresist material 906, and a portion of spin-on carbon material 904, which is uncovered by photoresist material 906, is removed using a dry etching process to expose a first portion 908 of first dielectric liner 902, as illustrated in FIG. 9D. In step 810, the first portion of the first dielectric liner is removed. In one example of step 810 illustrated in FIG. 9E, first portion 908 of first dielectric liner 902 is removed using a wet etching process. In step 812, the remainder of the sacrificial material is removed. In one example of step 812 illustrated in FIG. 9F, the remainder of spin-on carbon material 904, which was not removed in step 808, is removed using a plasma etching process. Photoresist material 906 is also removed in this example of step 808.

Figure 9G:
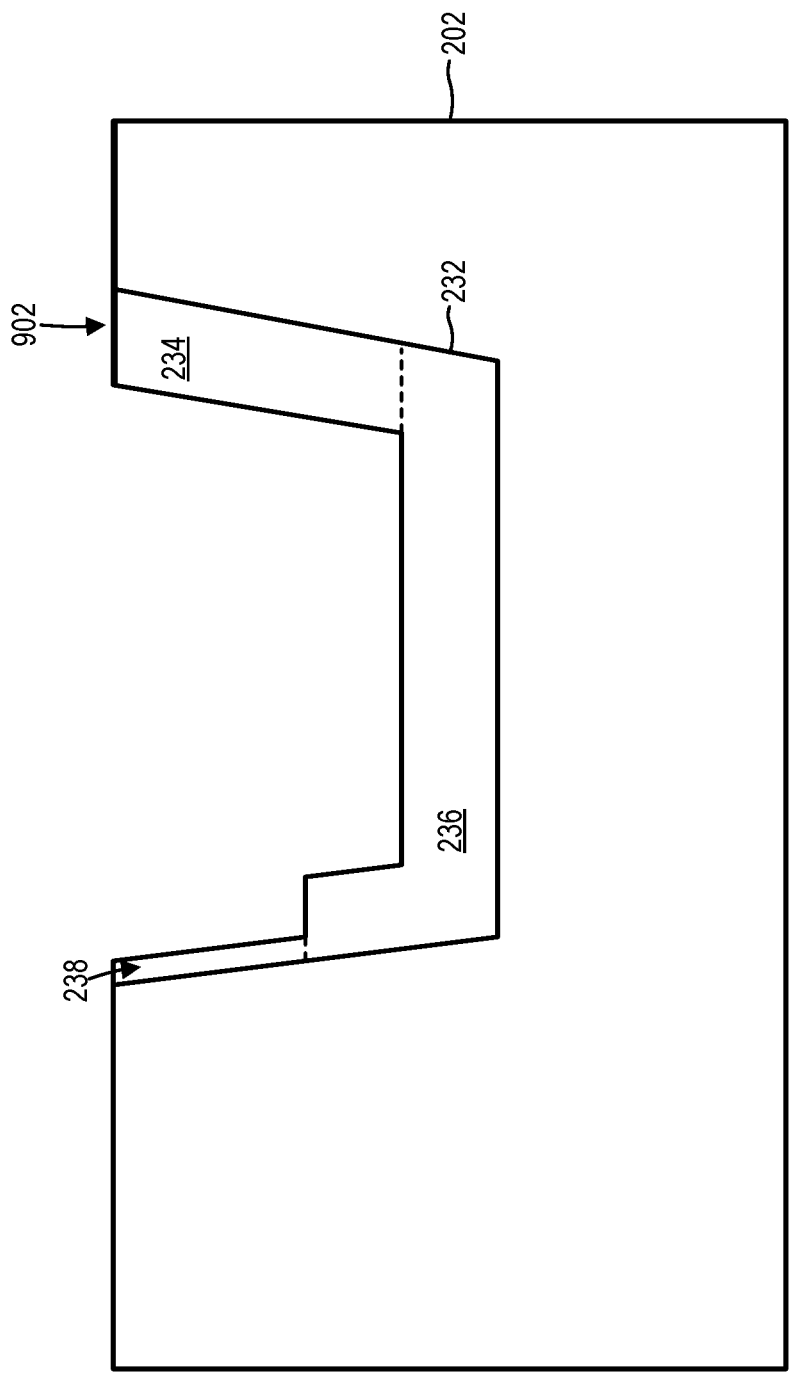
Figure 9H:
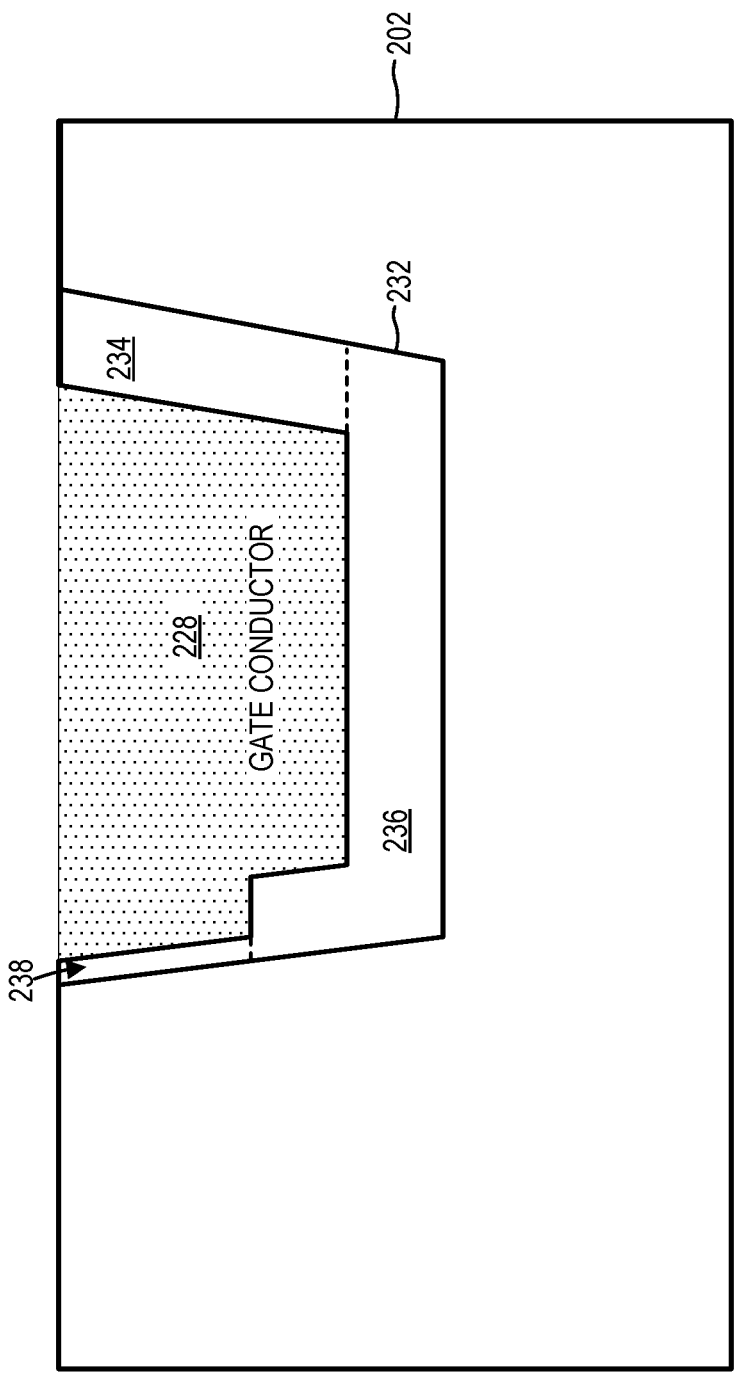

In step 814, a second dielectric liner is formed at least where the first portion of the first dielectric liner was removed in step 810. In one example of step 814, a second dielectric liner is disposed to form third dielectric section 238, as illustrated in FIG. 9G. In step 816, the trench is filed with a conductive material to form a gate conductor. In one example of step 816 as illustrated in FIG. 9H, trench 232 is filled with polysilicon and then planarized to form gate conductor 228.

Figure 10:
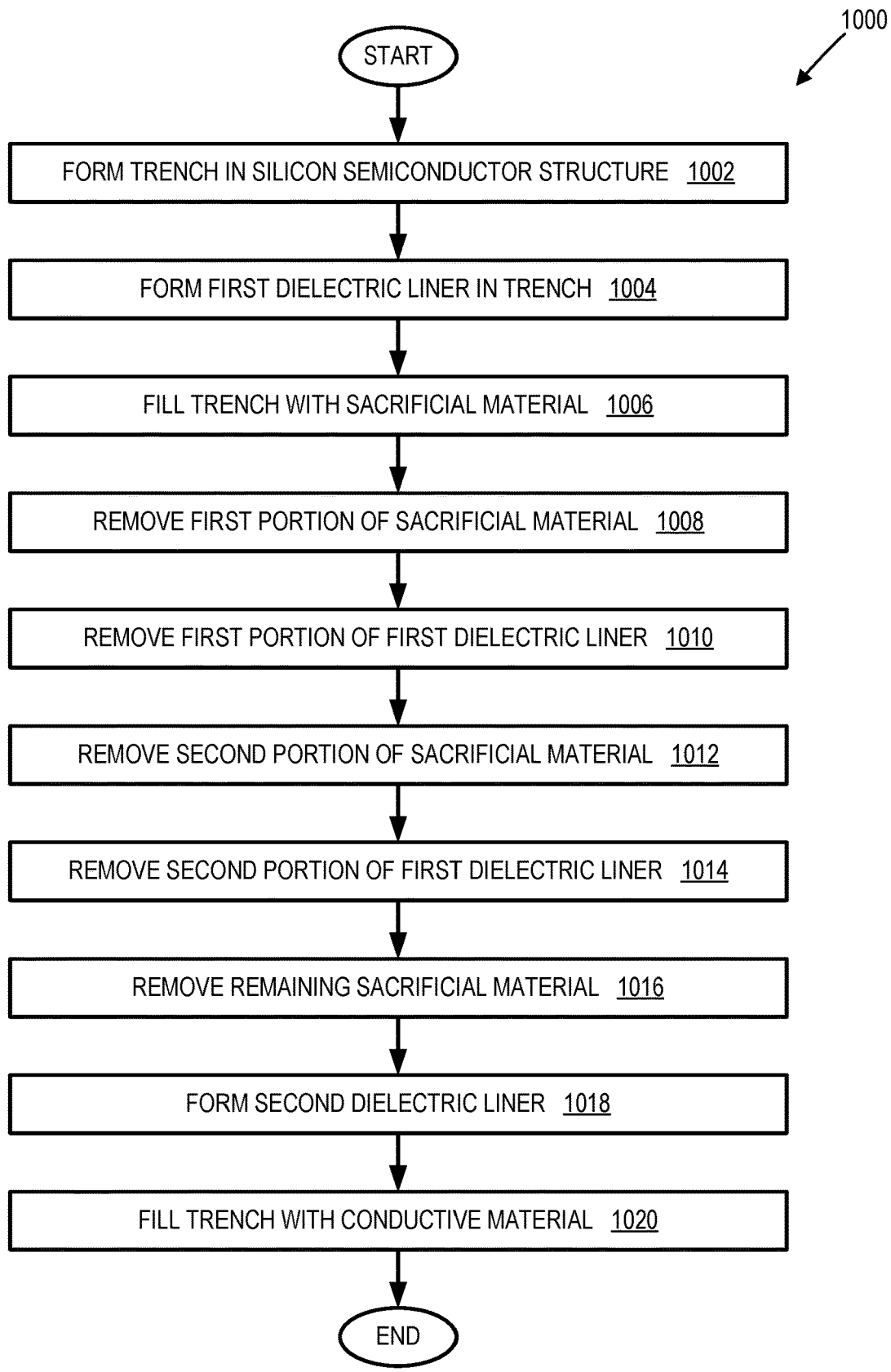
FIG. 10 illustrates another method for forming a vertical gate of a LDMOS transistor, according to an embodiment.
Figure 11A:
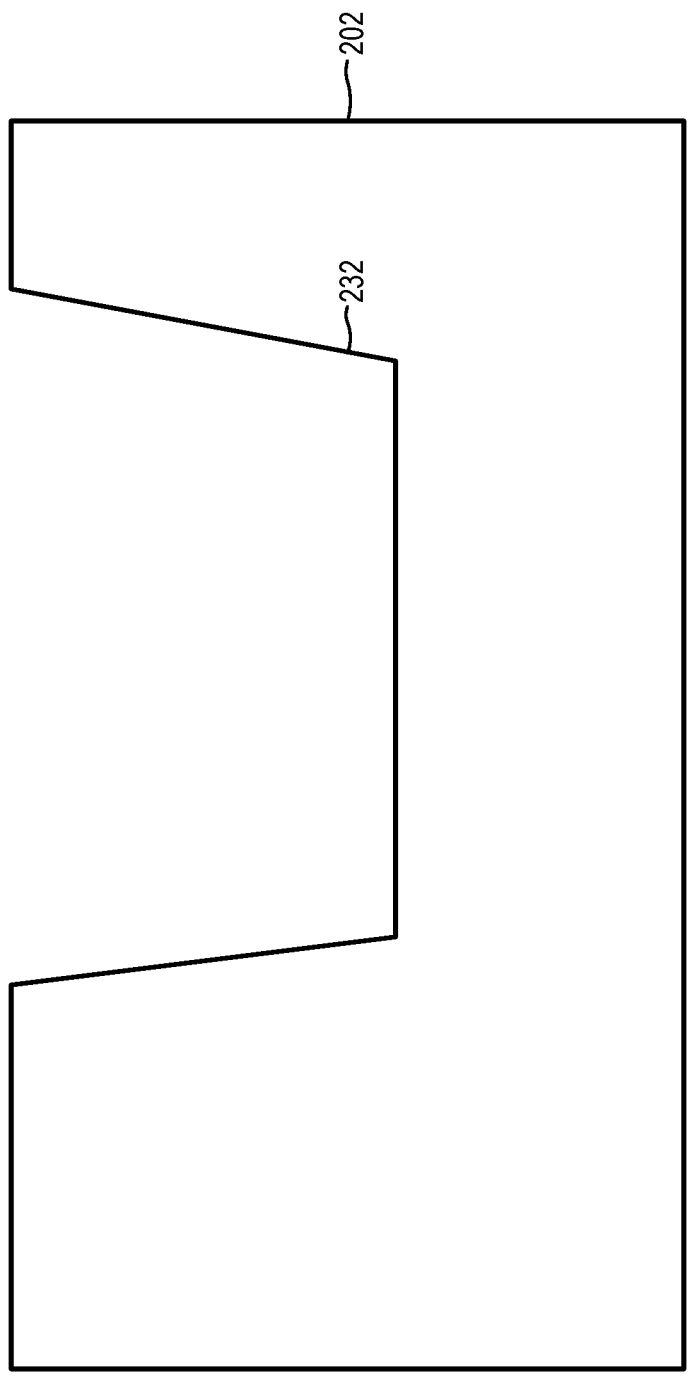
FIGS. 11A-11K illustrate one example of the FIG. 10 method being used to form the vertical gate of the FIG. 4 LDMOS transistor.
Figure 11B:
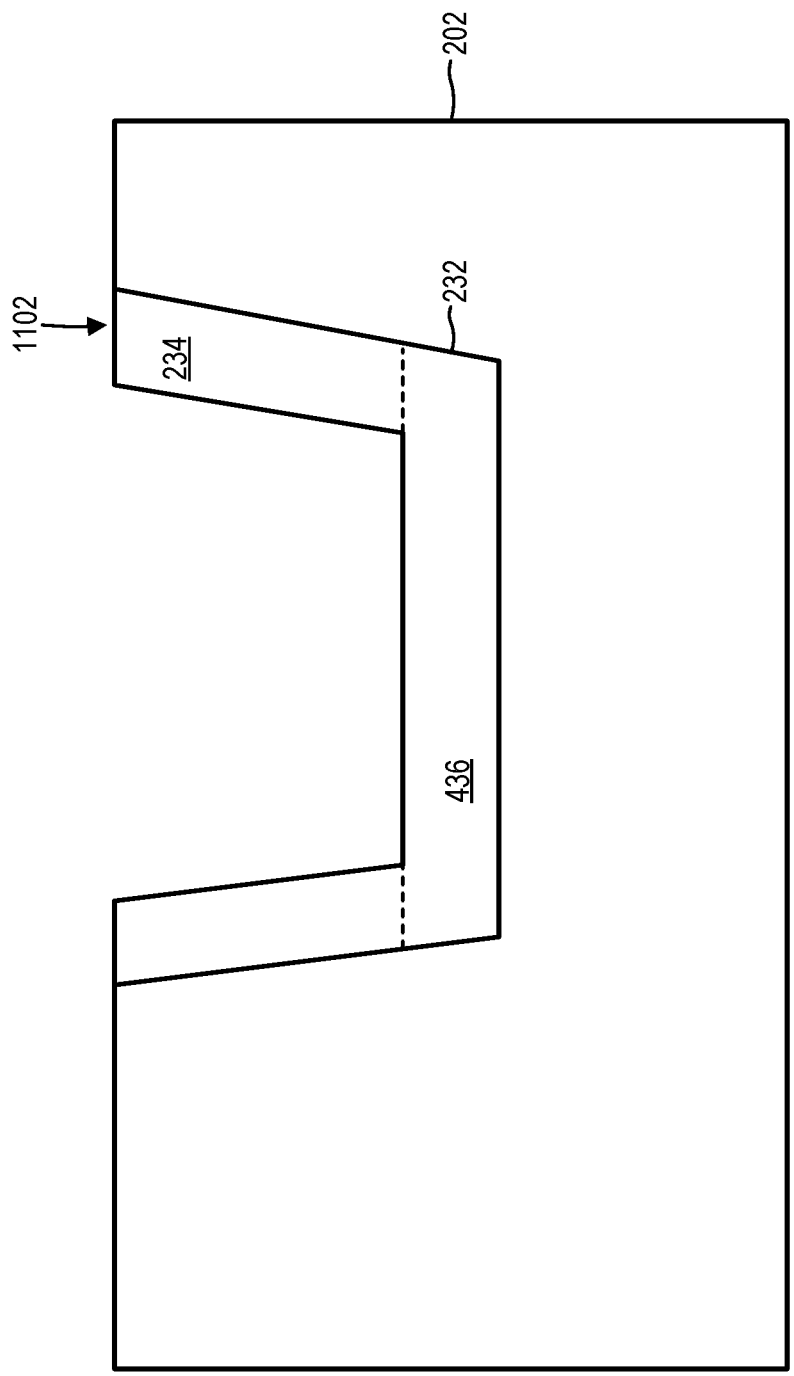
Figure 11C:
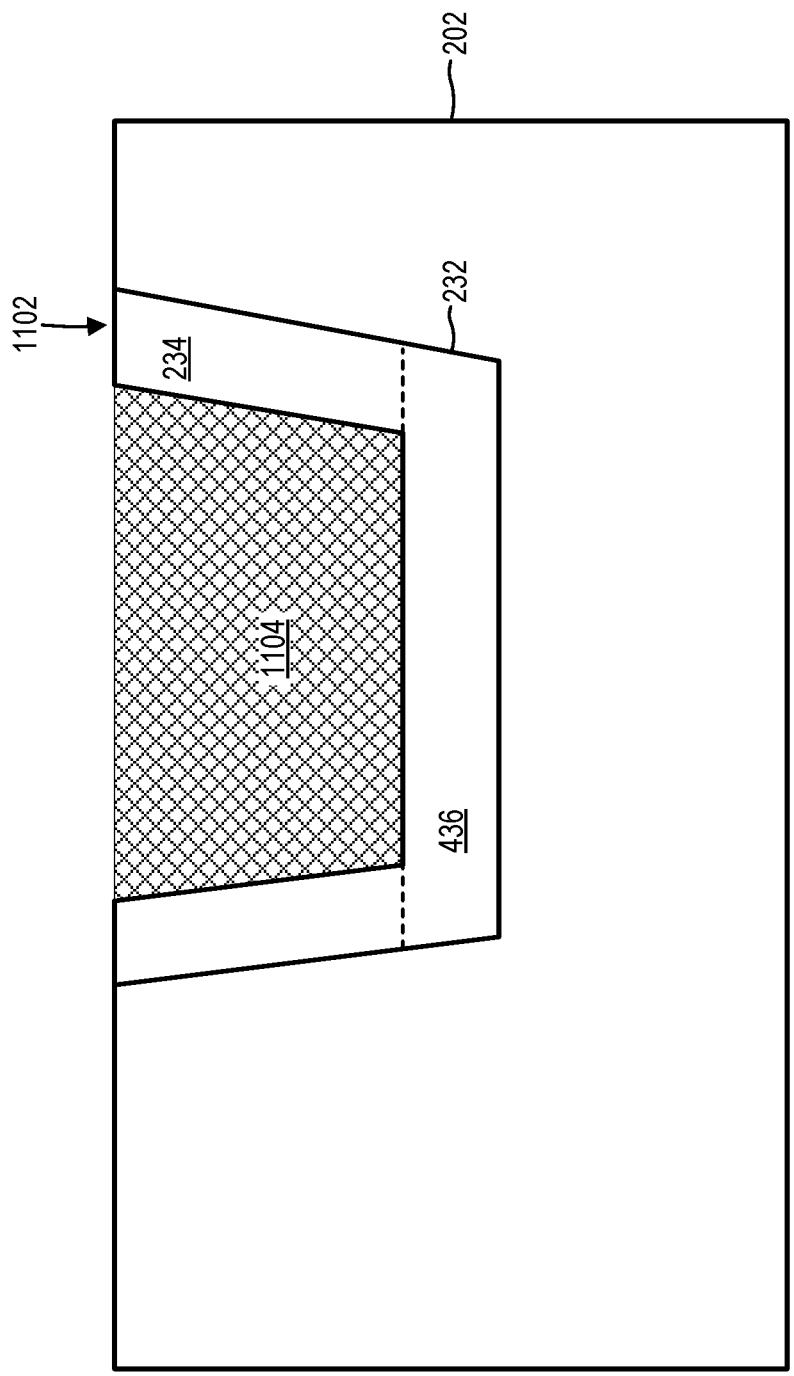

FIG. 10 illustrates another method 1000 for forming a vertical gate of a LDMOS transistor, and FIGS. 11A-11H illustrate one example of forming vertical gate 404 of LDMOS transistor 400 using method 1000. FIGS. 10 and 11 are best viewed together. In step 1002 a trench is formed in a silicon semiconductor structure. In one example of step 1002 illustrated in FIG. 11A, trench 232 is formed in silicon semiconductor structure 202. In step 1004, a first dielectric liner is formed in the trench. In one example of step 1004, a first dielectric liner 1102 is formed in trench 232 with appropriate thicknesses to form first dielectric section 234 and second dielectric section 436, as illustrated in FIG. 11B, using processes such as nitride deposition, oxide growth, and nitride removal. In step 1006, the trenched is filled with a sacrificial material. In one example of step 1006, trench 232 is filled with a spin-on carbon material 1104, or another material significantly more susceptible to etchant than first dielectric liner 1102, as illustrated in FIG. 11C.

Figure 11D:
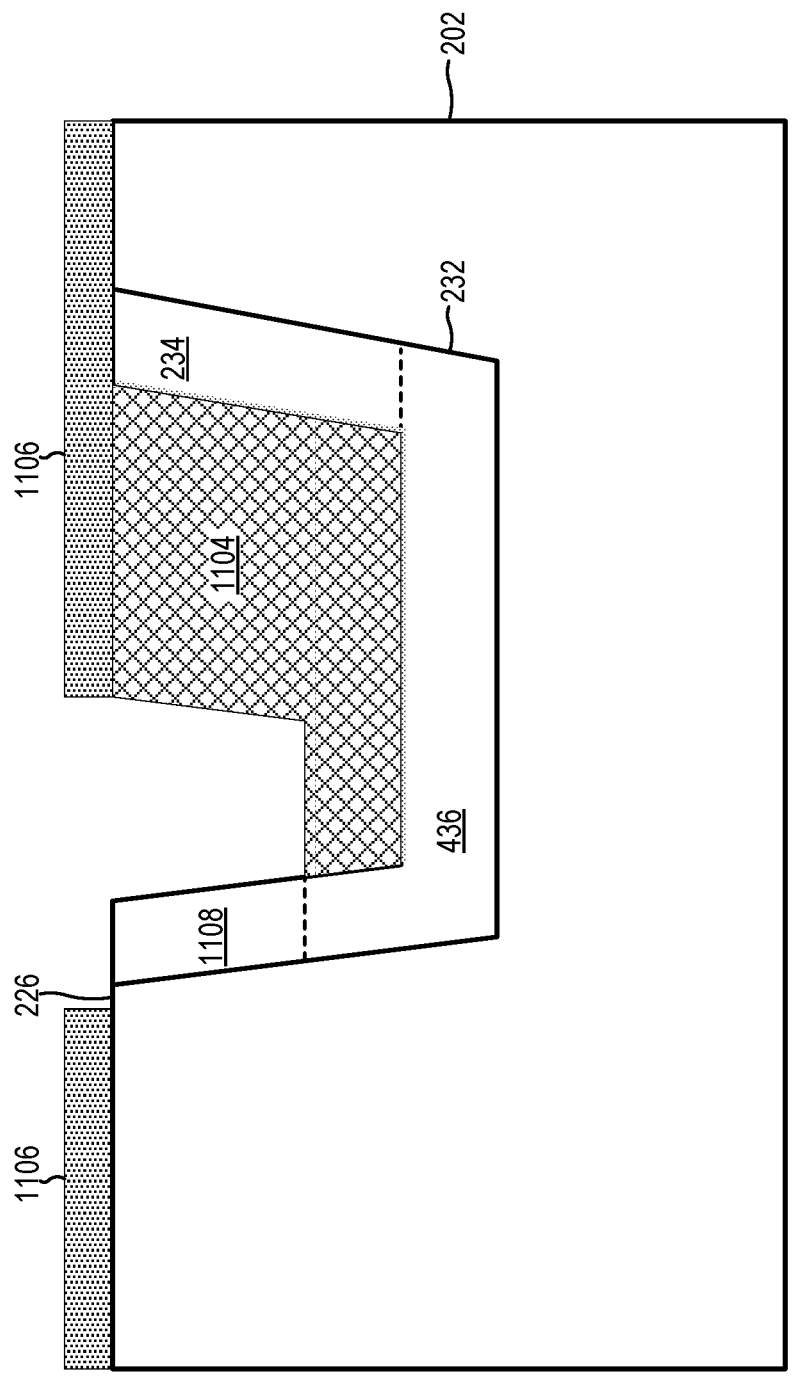
Figure 11E:
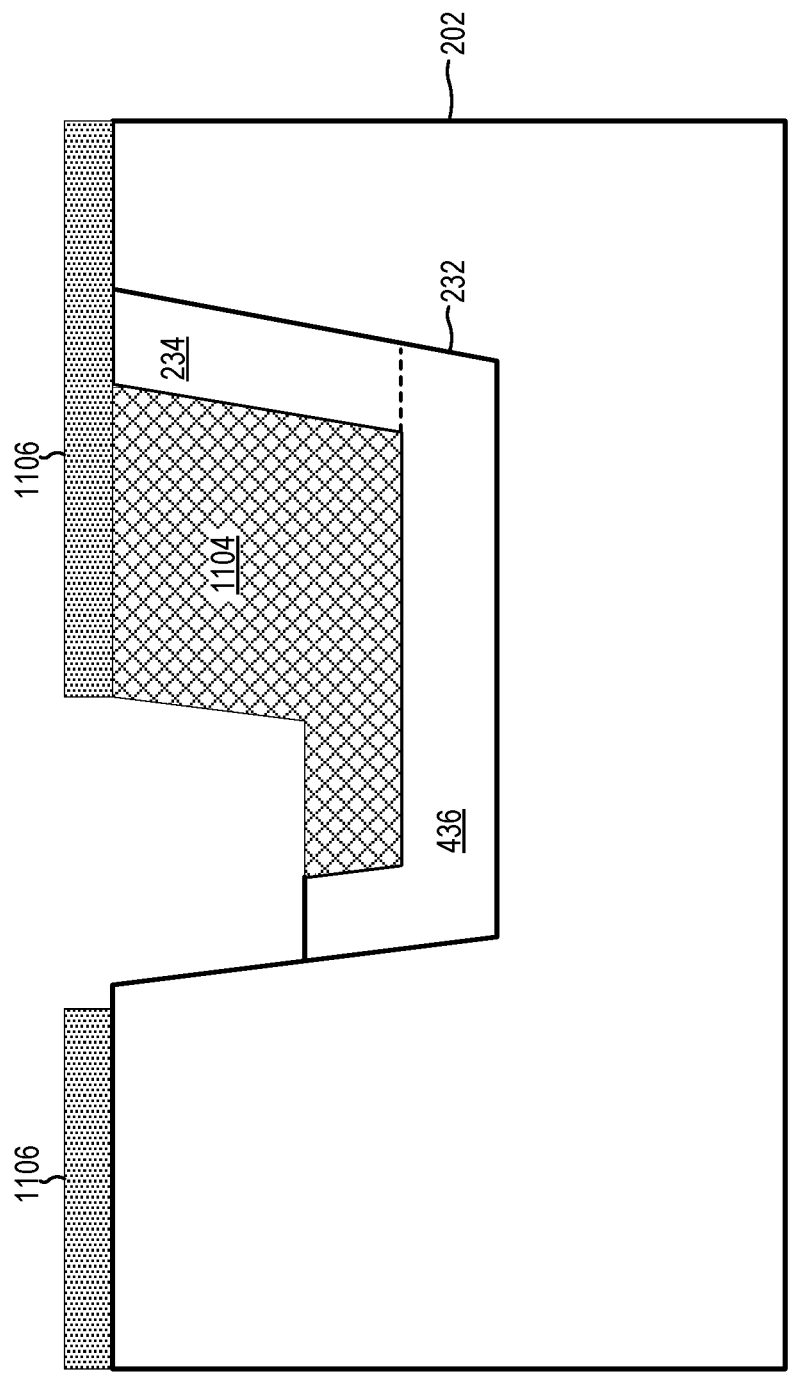
Figure 11F:
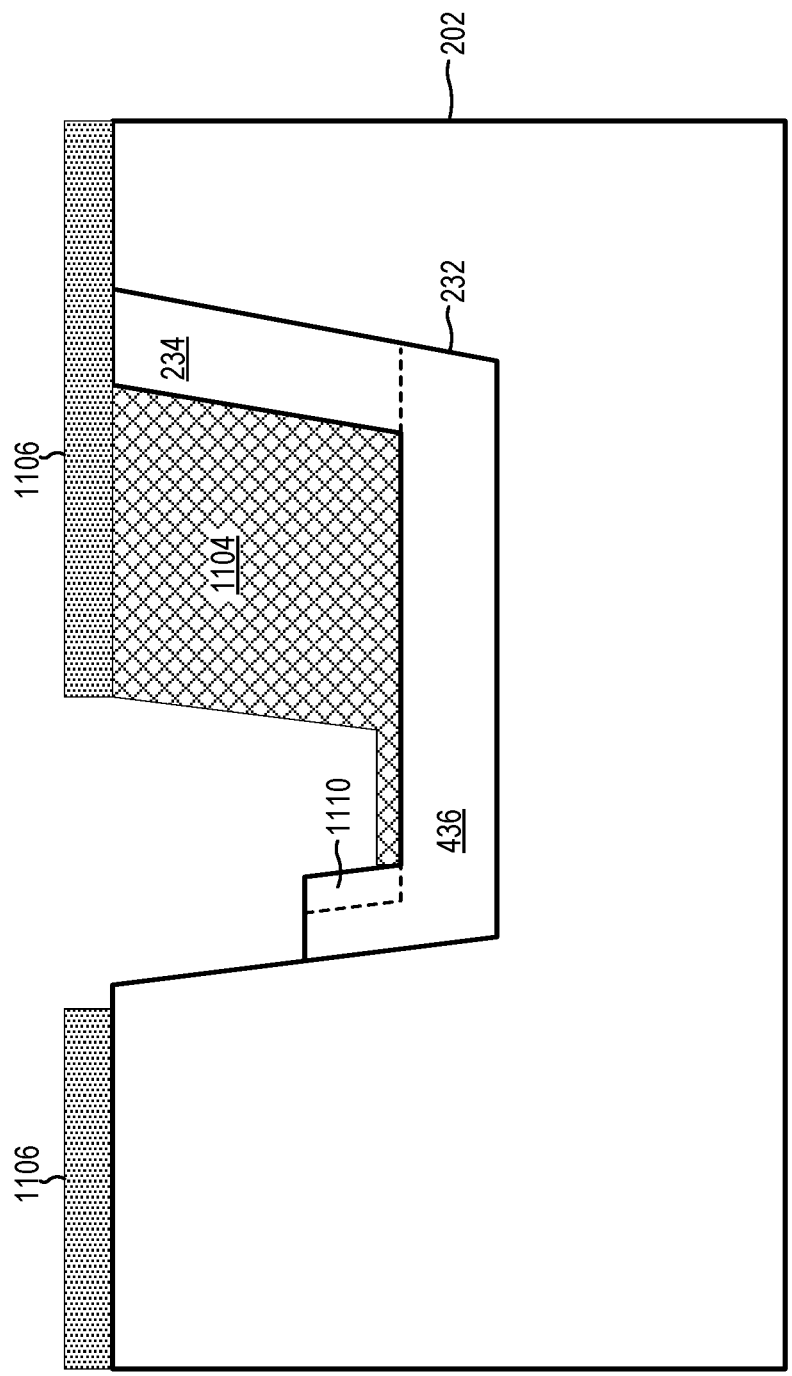
Figure 11G:
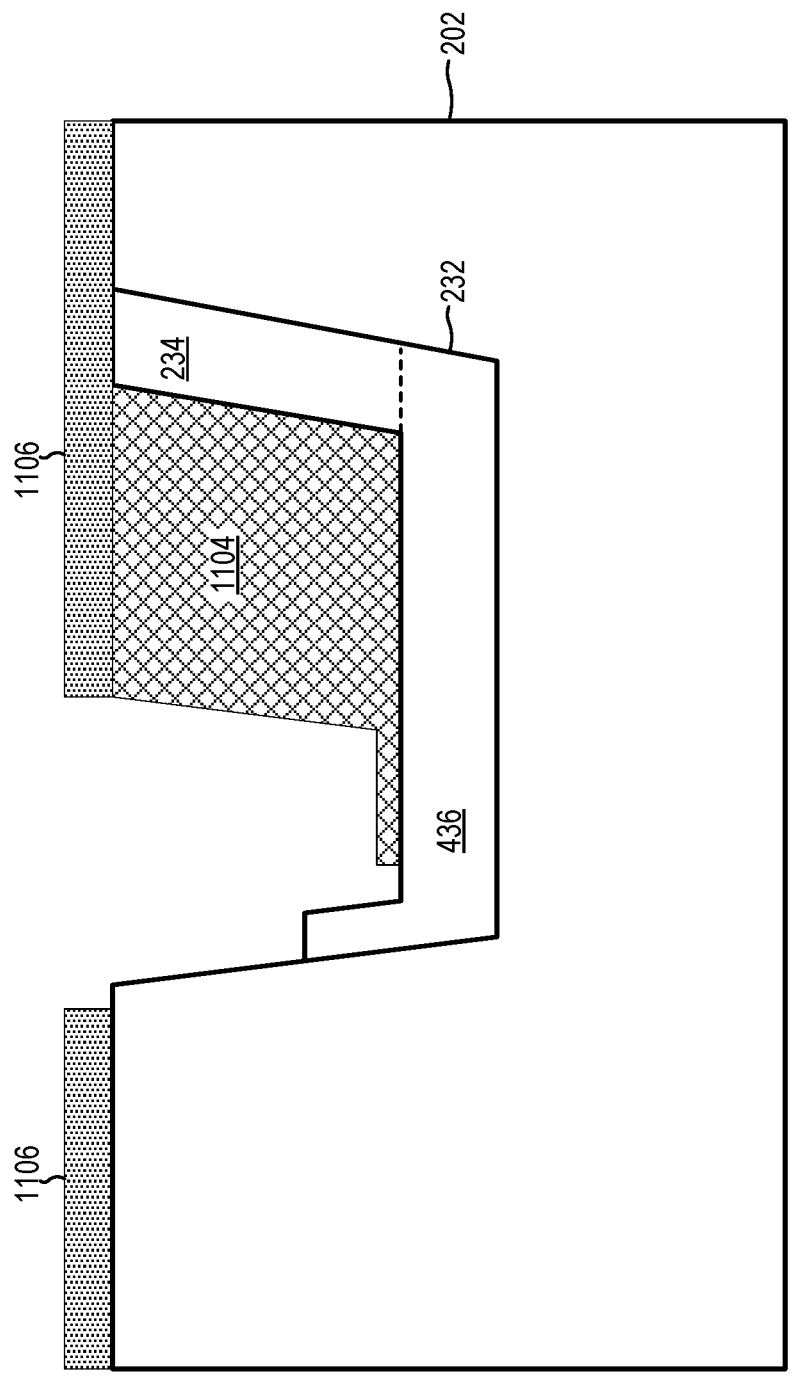
Figure 11H:
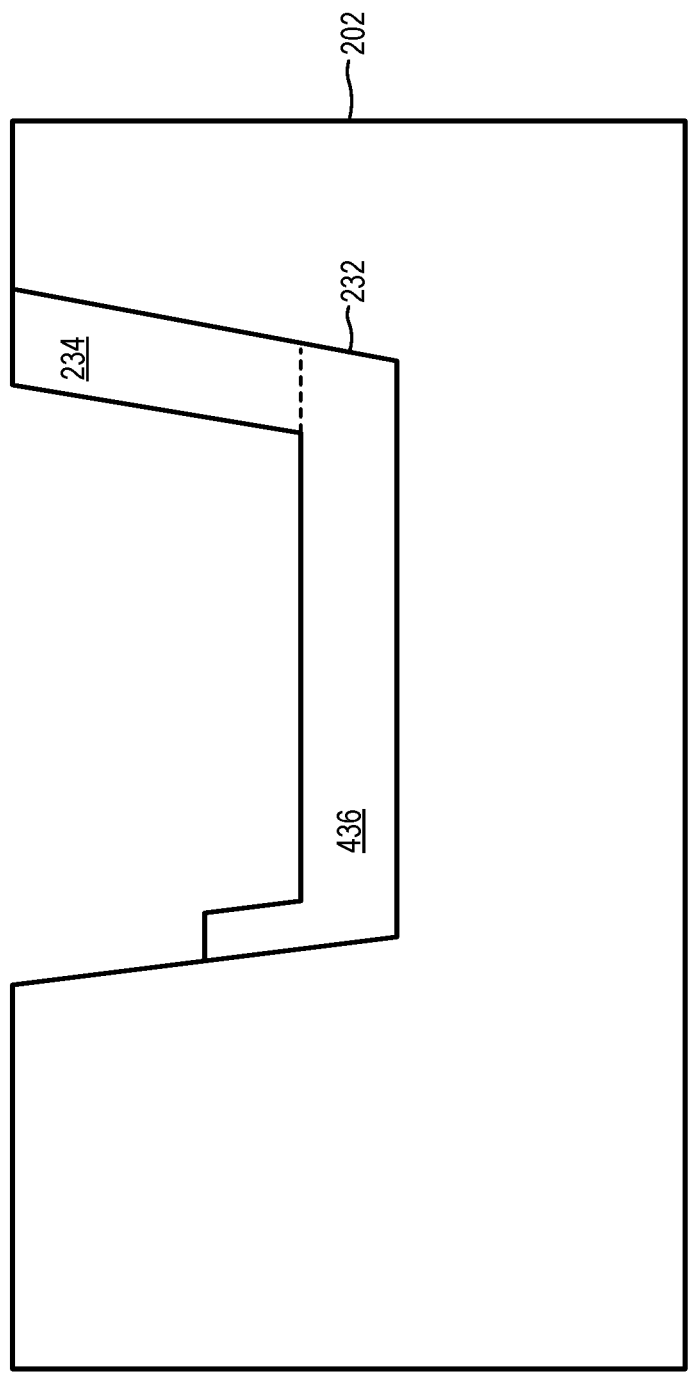
Figure 11I:
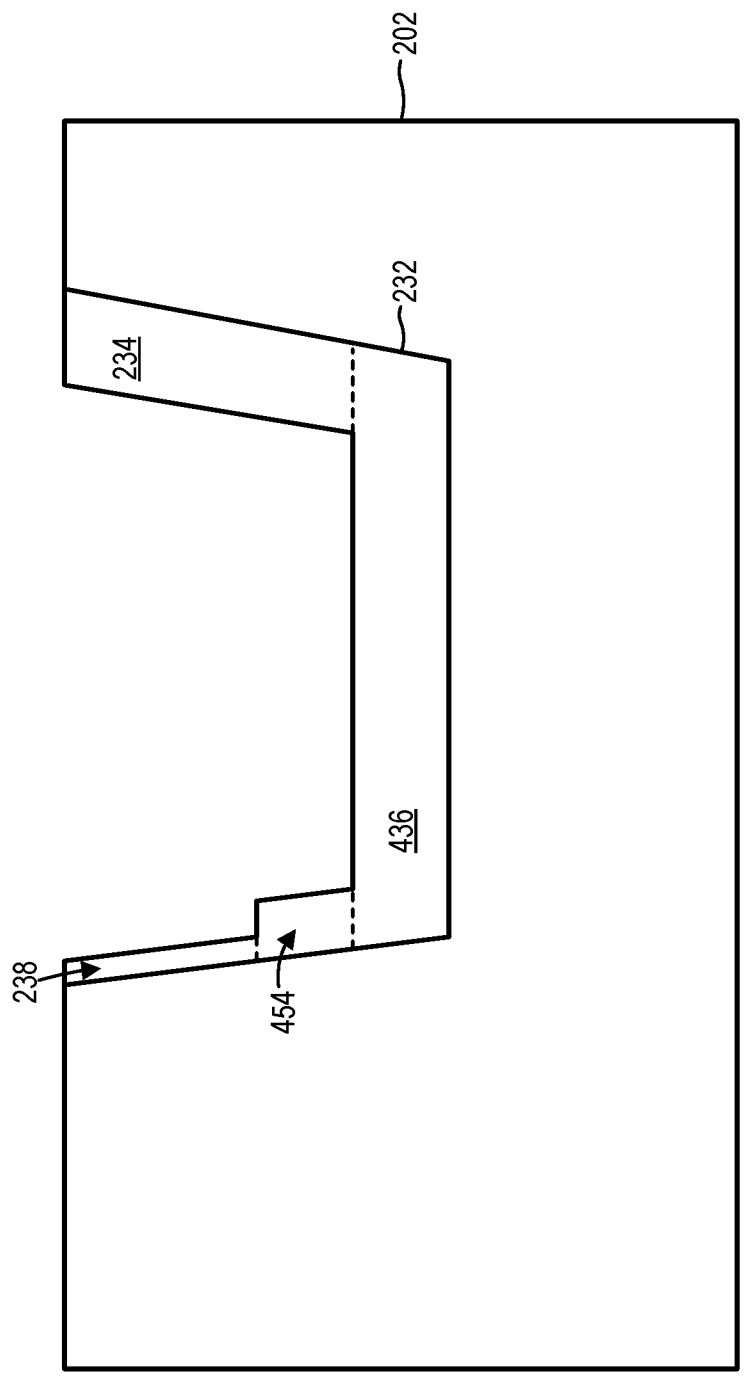
Figure 11J:
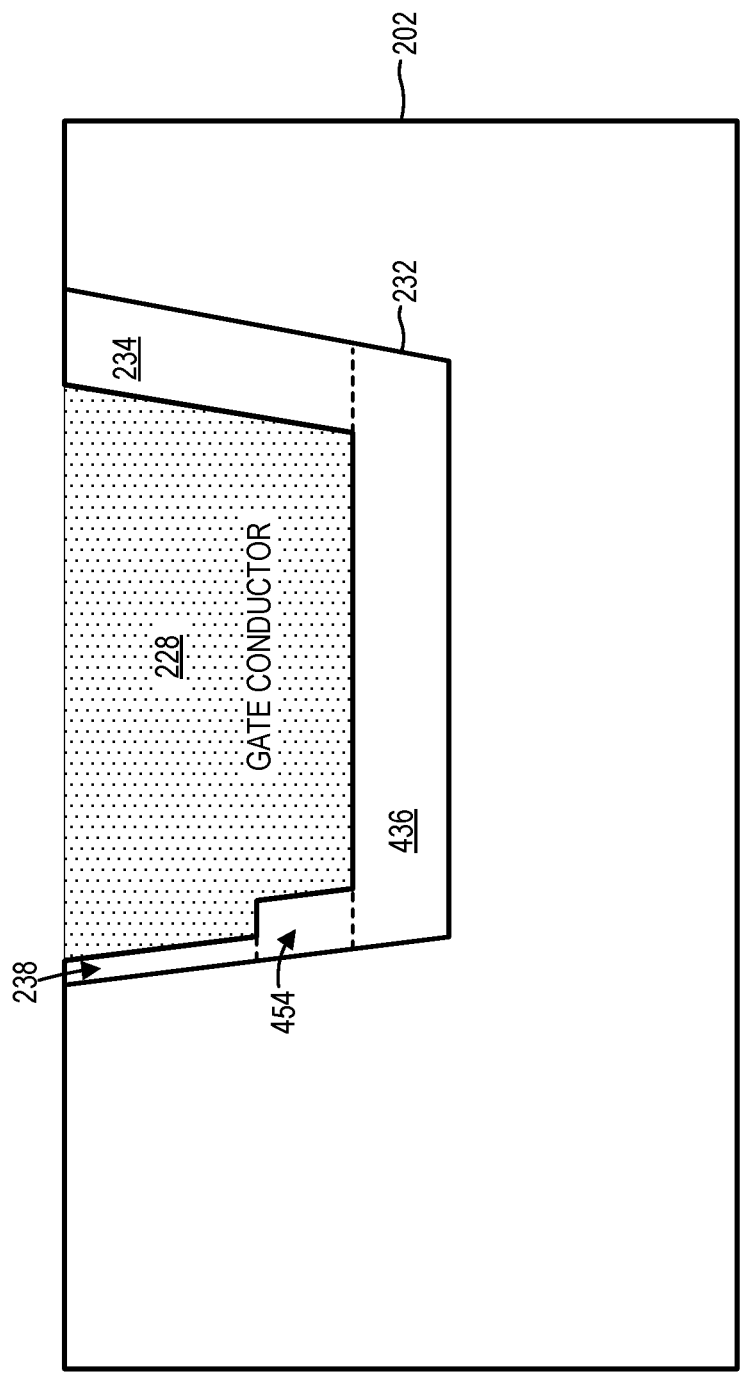
Figure 11K:
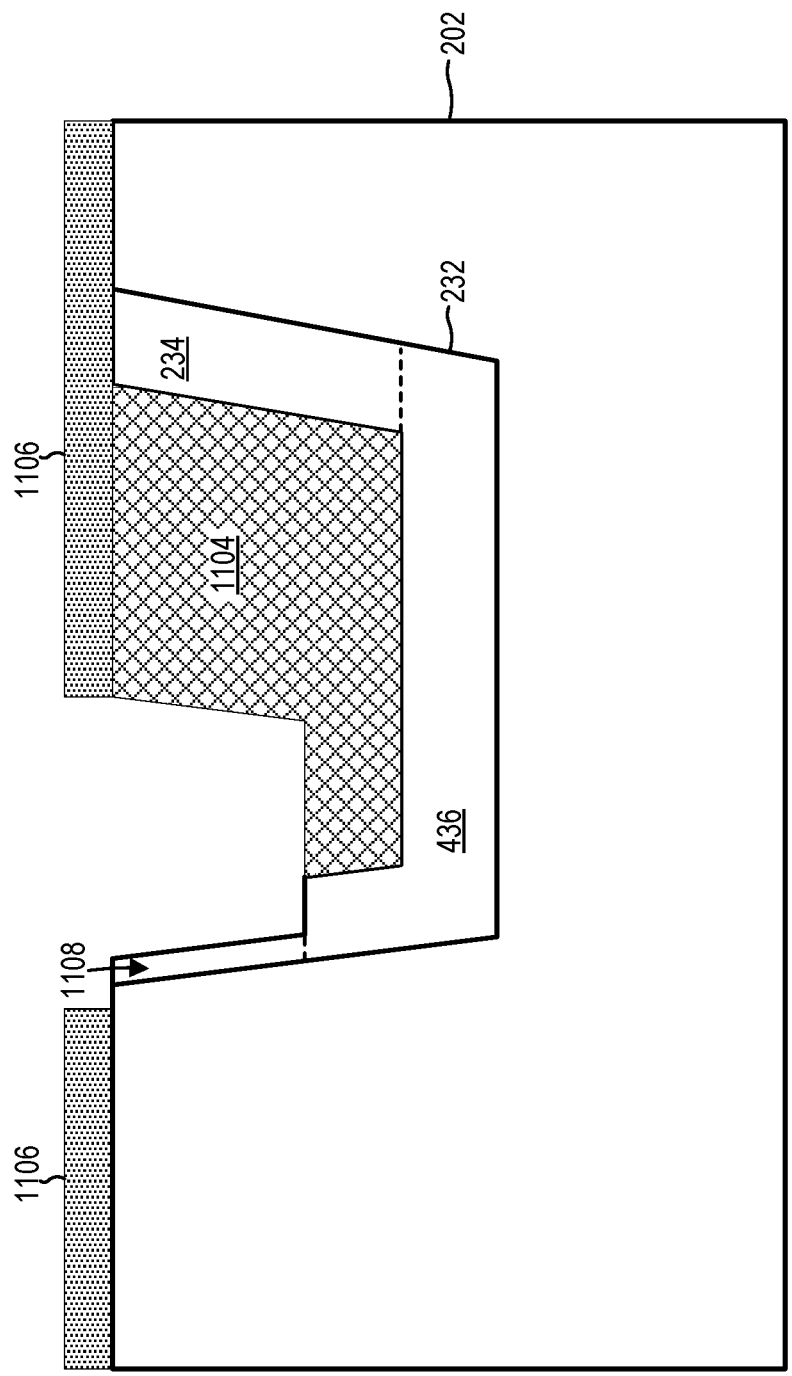

In step 1008, a first portion of the sacrificial material is removed to expose a first portion of the first dielectric liner. In one example of step 1008, outer surface 226 of silicon semiconductor structure 202 is patterned with a photoresist material 1106, and a first portion of spin-on carbon material 1104, which is uncovered by photoresist material 1106, is removed using a dry etching process to expose a first portion 1108 of first dielectric liner 1102, as illustrated in FIG. 11D. In step 1010, the first portion of the first dielectric liner is removed. In one example of step 1010 illustrated in FIG. 11E, first portion 1108 of first dielectric liner 1102 is removed using a wet etching process. In an alternate embodiment, first portion 1108 is only partially removed in step 1010, such as illustrated in FIG. 11K, to help prevent undercut at outer surface 226. In this alternate embodiment, the remainder of first portion 1108 is removed in step 1014, discussed below.

In step 1012, a second portion of the sacrificial material is removed to expose a second portion of the first dielectric liner. In one example of step 1012, a second portion of spin-on carbon material 1104, which is uncovered by photoresist material 1106, is removed using a dry etching process to expose a second portion 1110 of first dielectric liner 1102, as illustrated in FIG. 11F. In step 1014, the second portion of the first dielectric liner is removed. In one example of step 1014 illustrated in FIG. 11G, second portion 1110 of first dielectric liner 1102 is removed using a wet etching process. Additionally, in the alternate embodiment discussed above where first portion 1108 is only partially removed in step 1010, the remainder of first portion 1108 is also removed in step 1014. In step 1016, the remaining sacrificial material removed. In one example of step 1016 illustrated in FIG. 11H, a remaining spin-on carbon material 1104, which was not removed in step 1008, is removed using a plasma etching process. Remaining photoresist material 1106 is also removed in this example of step 1016.

In step 1018, a second dielectric liner is formed at least where the first portion of the first dielectric liner was removed in step 1010 and where the second portion of the first dielectric liner was removed in step 1014. In one example of step 1018, a second dielectric liner is disposed to form third dielectric section 238 and fourth dielectric section 454, as illustrated in FIG. 11I. In step 1020, the trench is filed with a conductive material to form a gate conductor. In one example of step 1020 as illustrated in FIG. 11J, trench 232 is filled with polysilicon and then planarized to form gate conductor 228. Method 1000 could be modified to include additional steps of removing the sacrificial material and the first dielectric liner to form a vertical gate with additional dielectric sections, without departing from the scope hereof.

Figure 12:
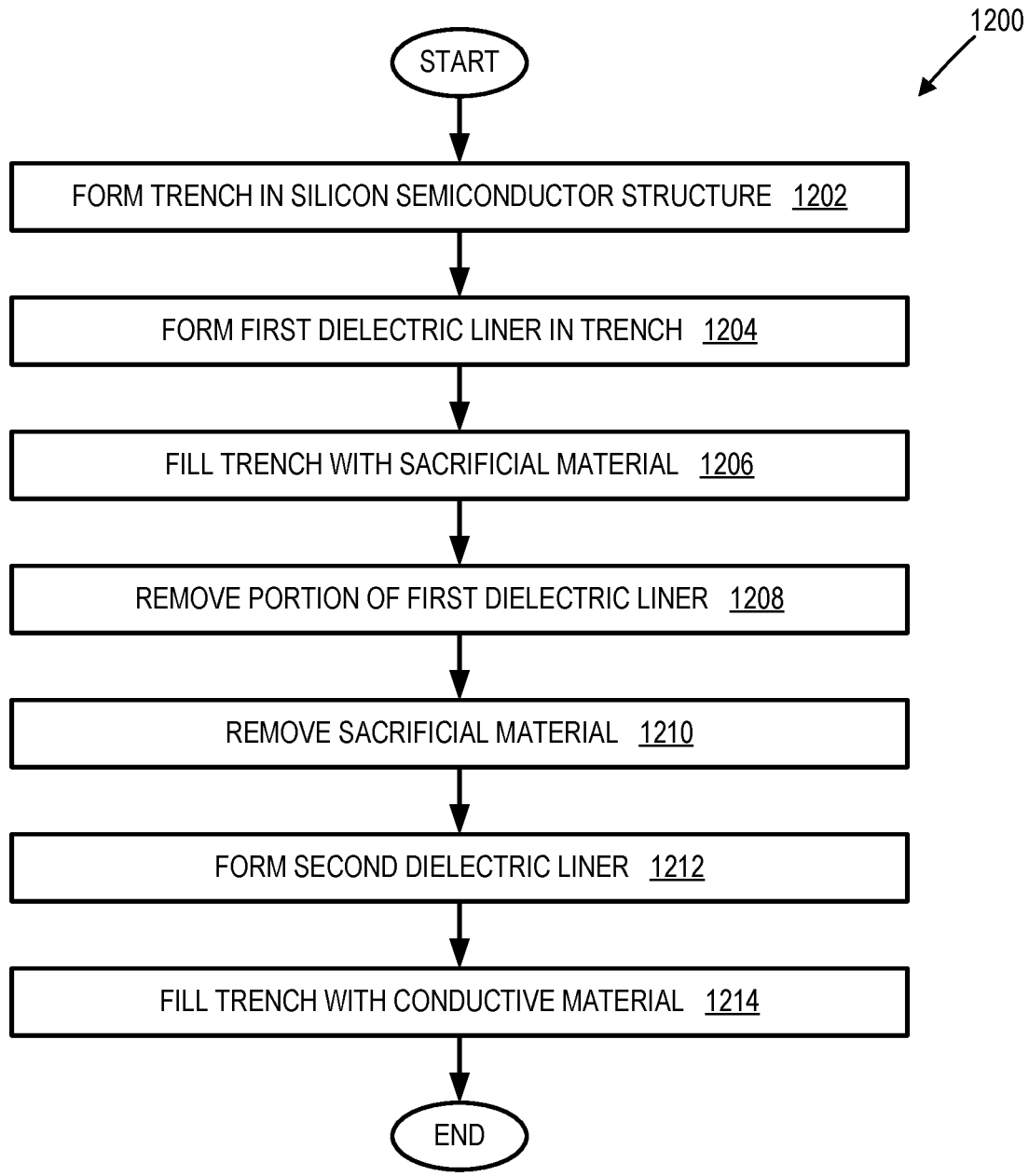
FIG. 12 illustrates another method for forming a vertical gate of a LDMOS transistor, according to an embodiment.
Figure 13A:
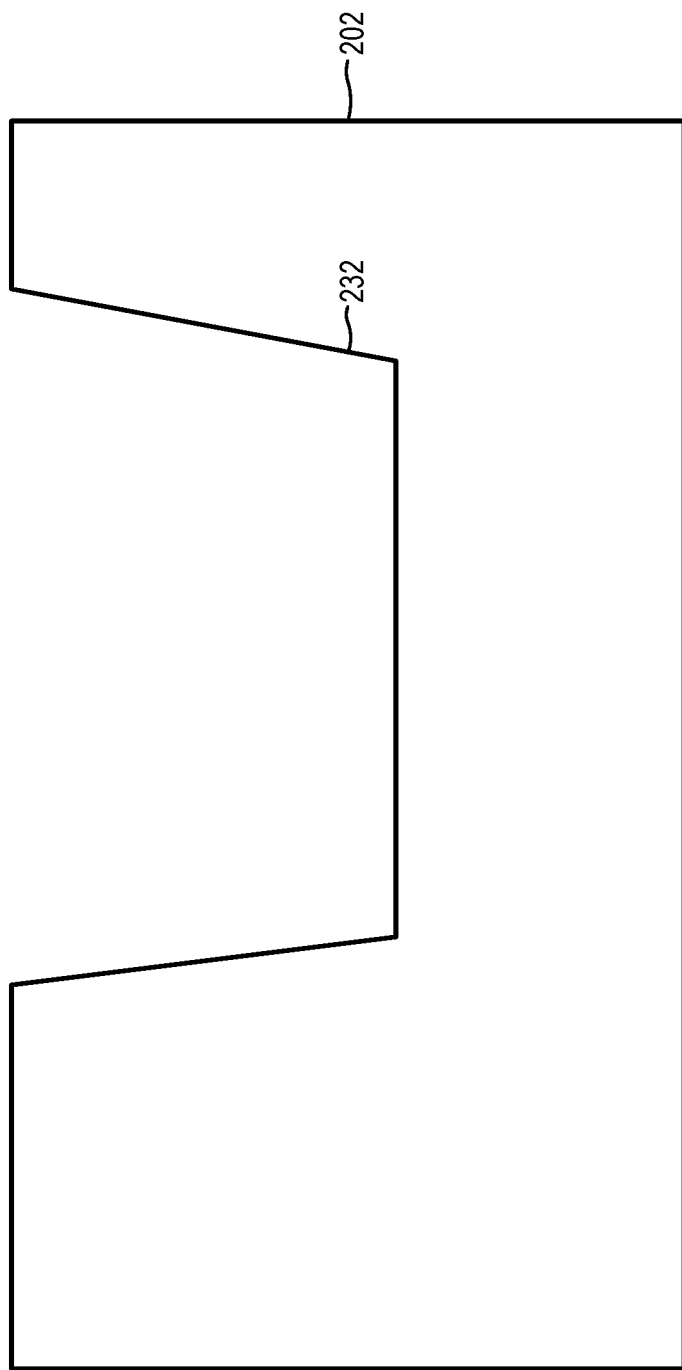
FIGS. 13A-13G illustrates one example of the FIG. 12 method being used to form the vertical gate of the FIG. 2 LDMOS transistor.
Figure 13B:
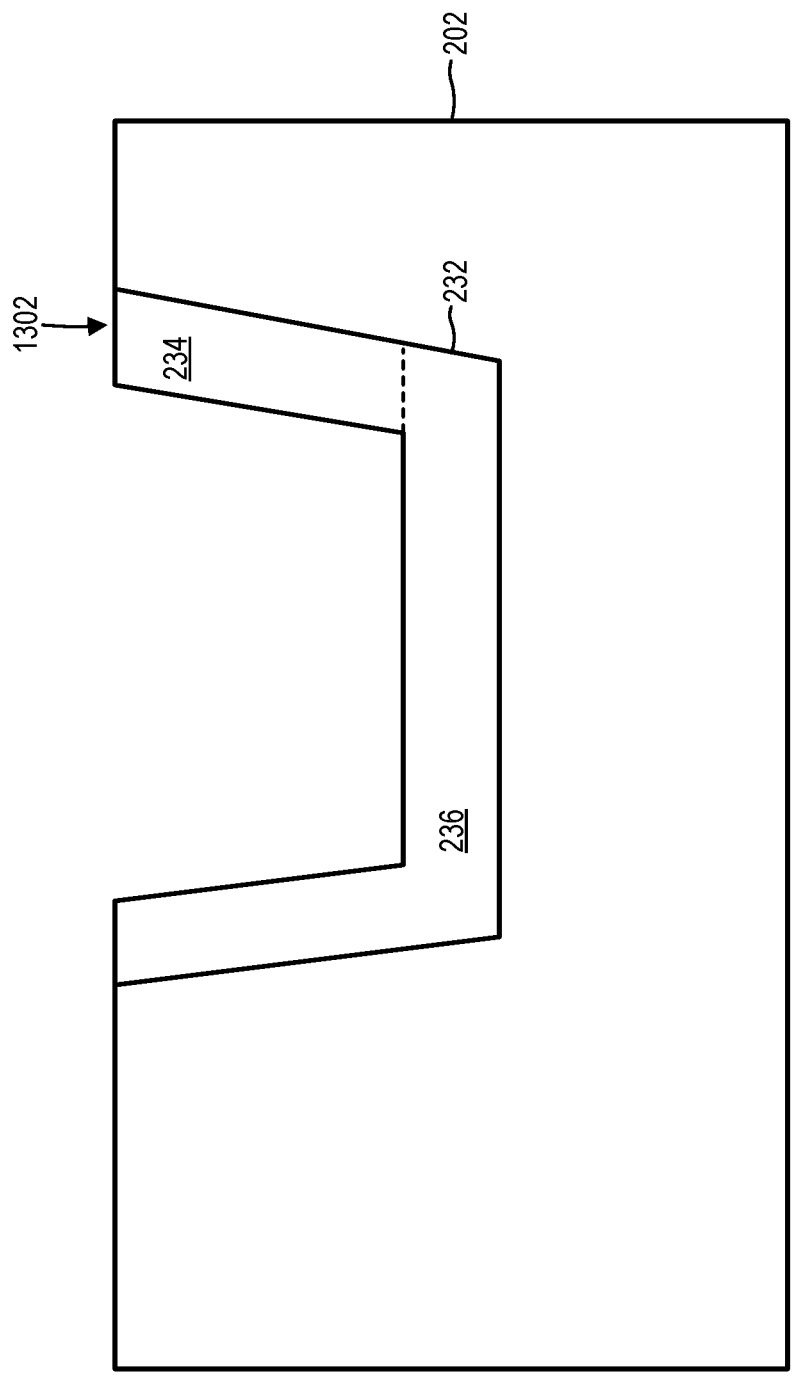
Figure 13C:
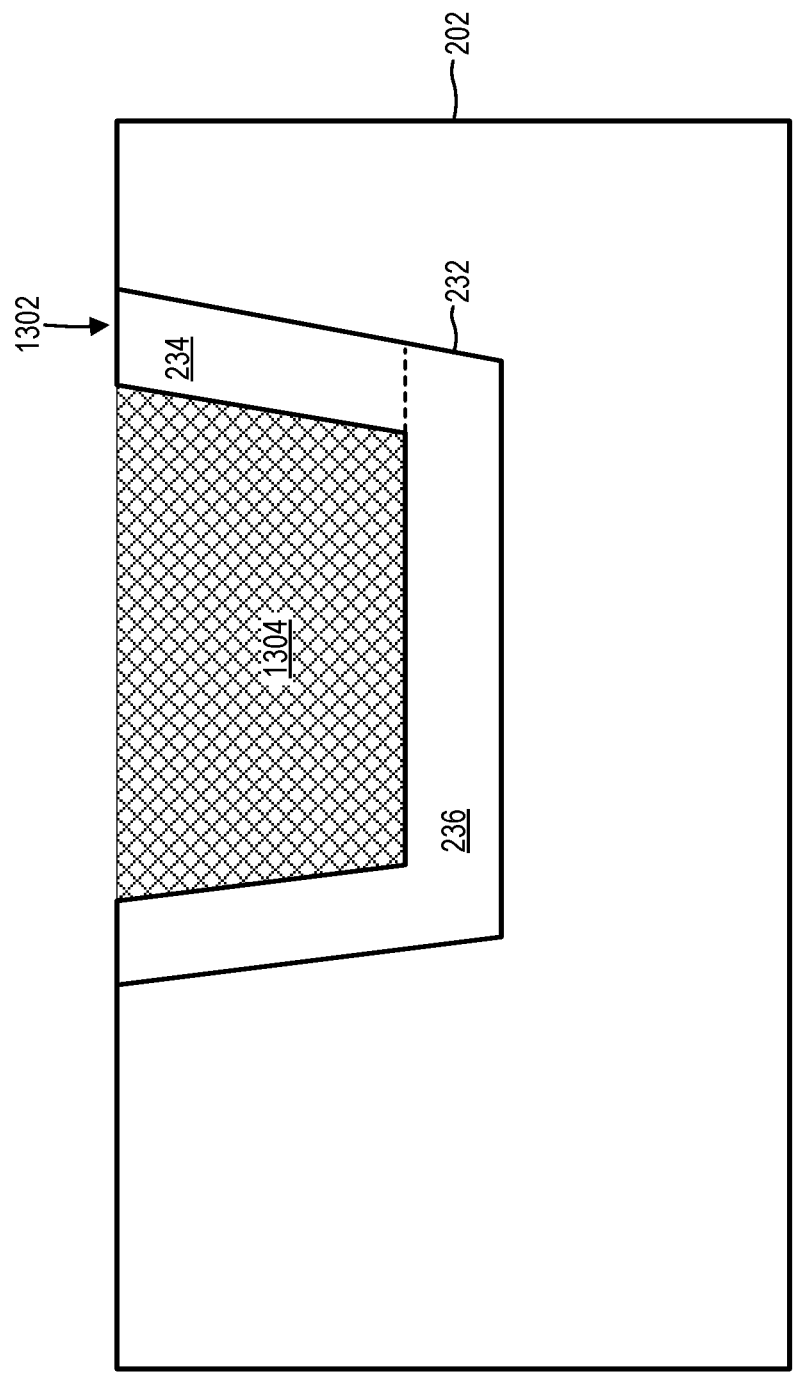
Figure 13D:
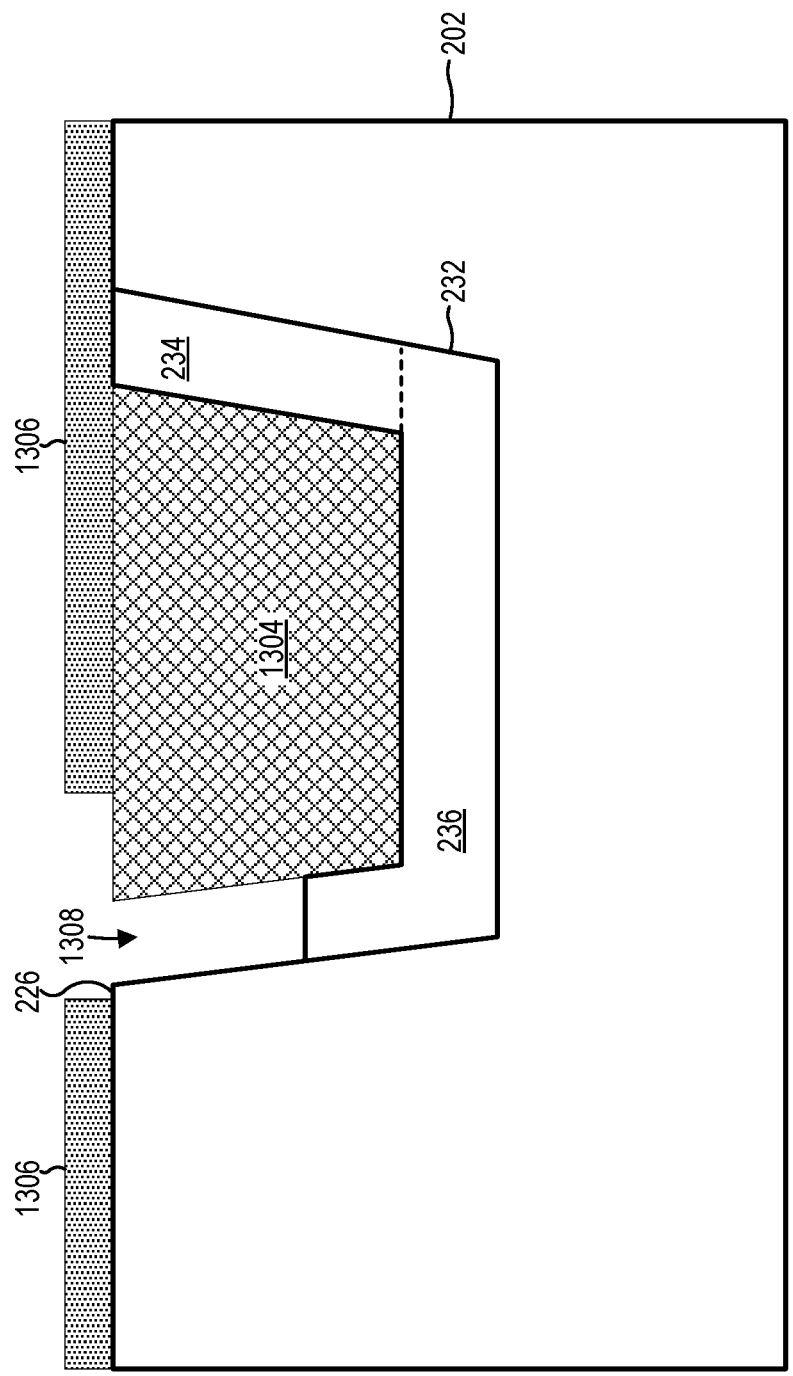
Figure 13E:
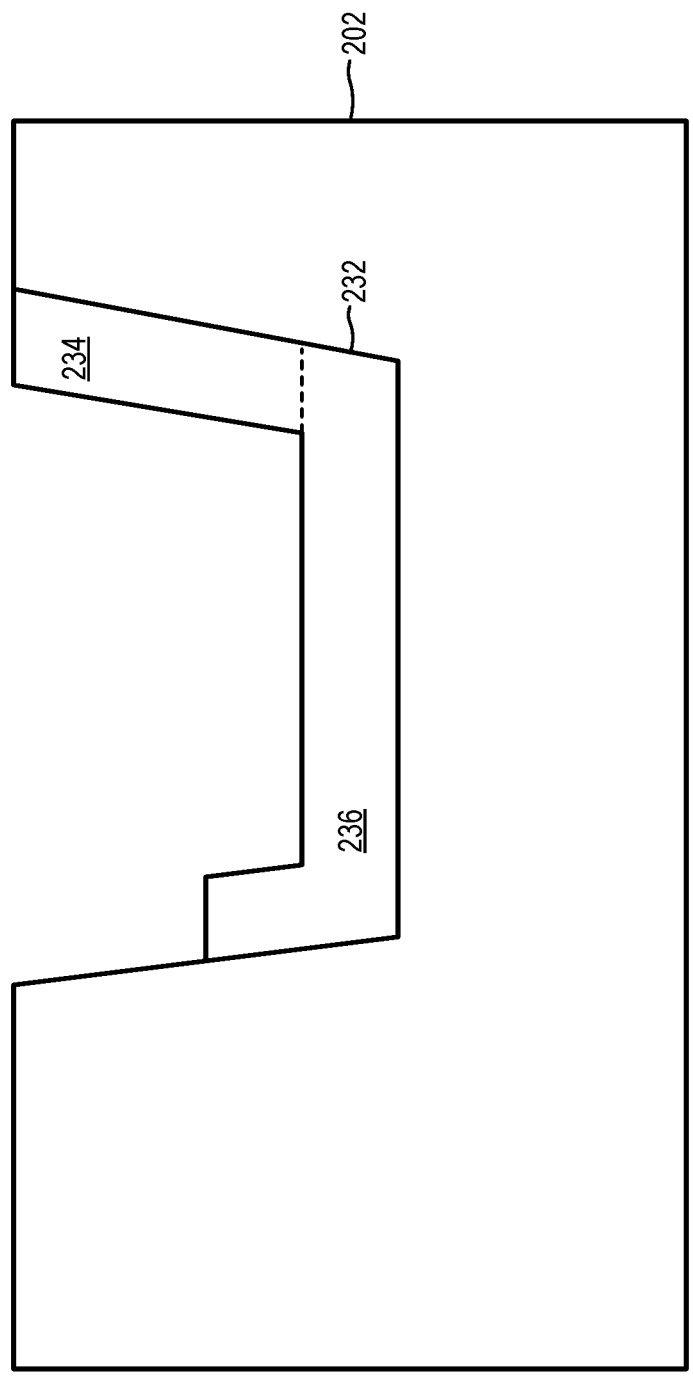

FIG. 12 illustrates a method 1200 for forming a vertical gate of a LDMOS transistor, and FIGS. 13A-13G illustrates one example of forming vertical gate 204 of LDMOS transistor 200 using method 1200. FIGS. 12 and 13 are best viewed together. In step 1202 a trench is formed in a silicon semiconductor structure. In one example of step 1202 illustrated in FIG. 13A, trench 232 is formed in silicon semiconductor structure 202. In step 1204, a first dielectric liner is formed in the trench. In one example of step 1204, a first dielectric liner 1302 is formed in trench 232 with appropriate thicknesses to form first dielectric section 234 and second dielectric section 236, as illustrated in FIG. 13B, using processes such as nitride deposition, oxide growth, and nitride removal. In step 1206, the trenched is filled with a sacrificial material. In one example of step 1206, trench 232 is filled with a spin-on carbon material 1304, or another material significantly more susceptible to etchant than first dielectric liner 1302, as illustrated in FIG. 13C.

Figure 13F:
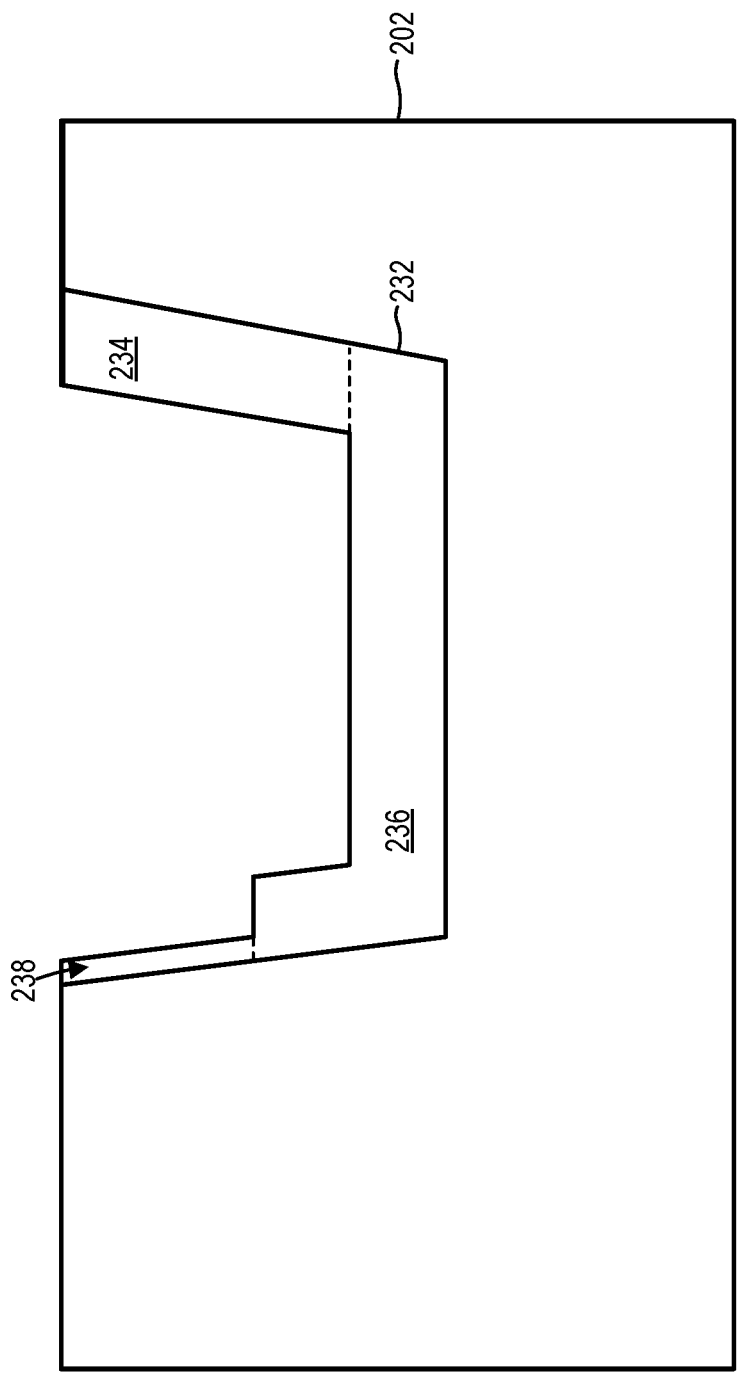
Figure 13G:
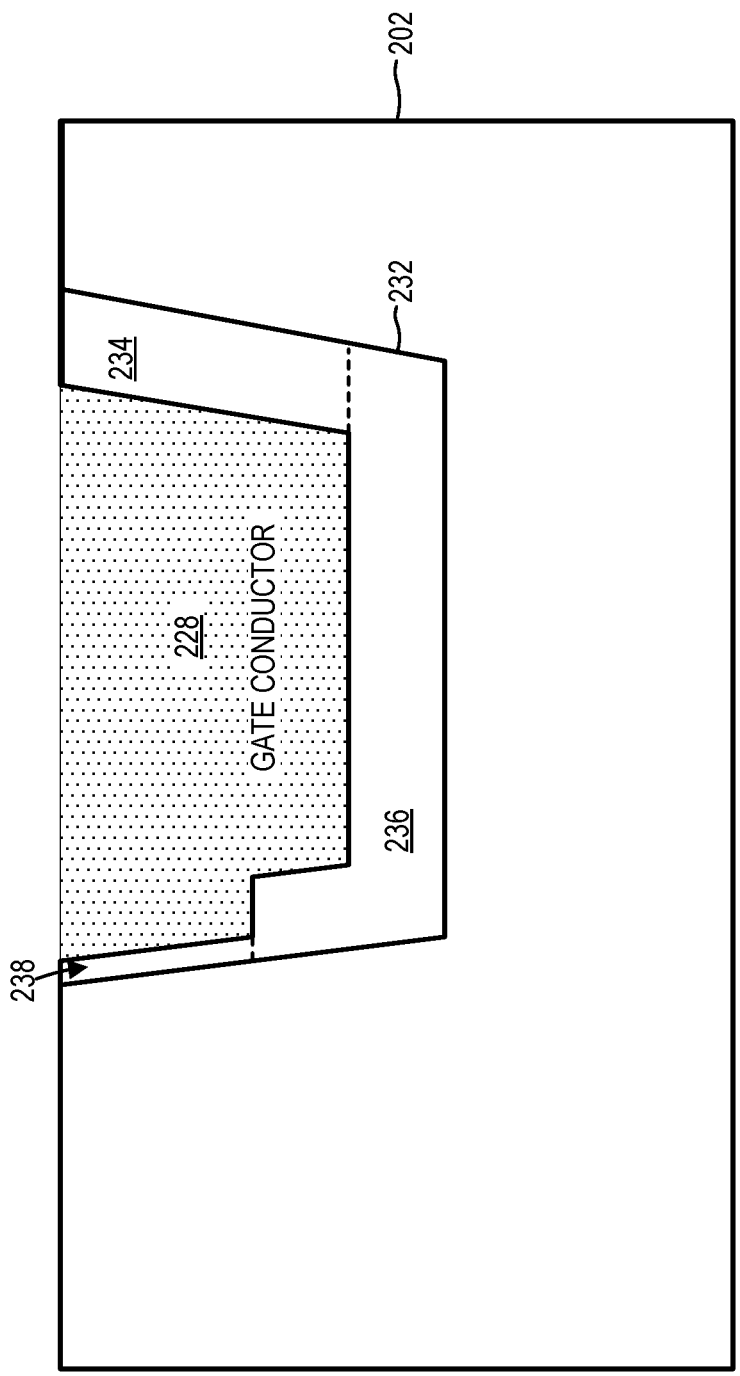

In step 1208, a portion of the first dielectric liner is removed. In one example of step 1208 illustrated in 13D, outer surface 226 of silicon semiconductor structure 202 is patterned with a hard mask material 1306, and a portion 1308 of first dielectric liner 1302, which is uncovered by hard mask material 1306, is removed using a wet etching process that selectively etches dielectric liner 1302 without significantly etching spin-on carbon material 1304. In step 1210, the sacrificial material removed. In one example of step 1210 illustrated in FIG. 13E, spin-on carbon material 1304 and hard mark material 1306 are removed using a plasma etching process. In step 1212, a second dielectric liner is formed at least where the portion of the first dielectric liner was removed in step 1208. In one example of step 1212, a second dielectric liner is disposed to form third dielectric section 238, as illustrated in FIG. 13F. In step 1214, the trench is filed with a conductive material to form a gate conductor. In one example of step 1214 as illustrated in FIG. 13G, trench 232 is filled with polysilicon and then planarized to form gate conductor 228.

Figure 14:
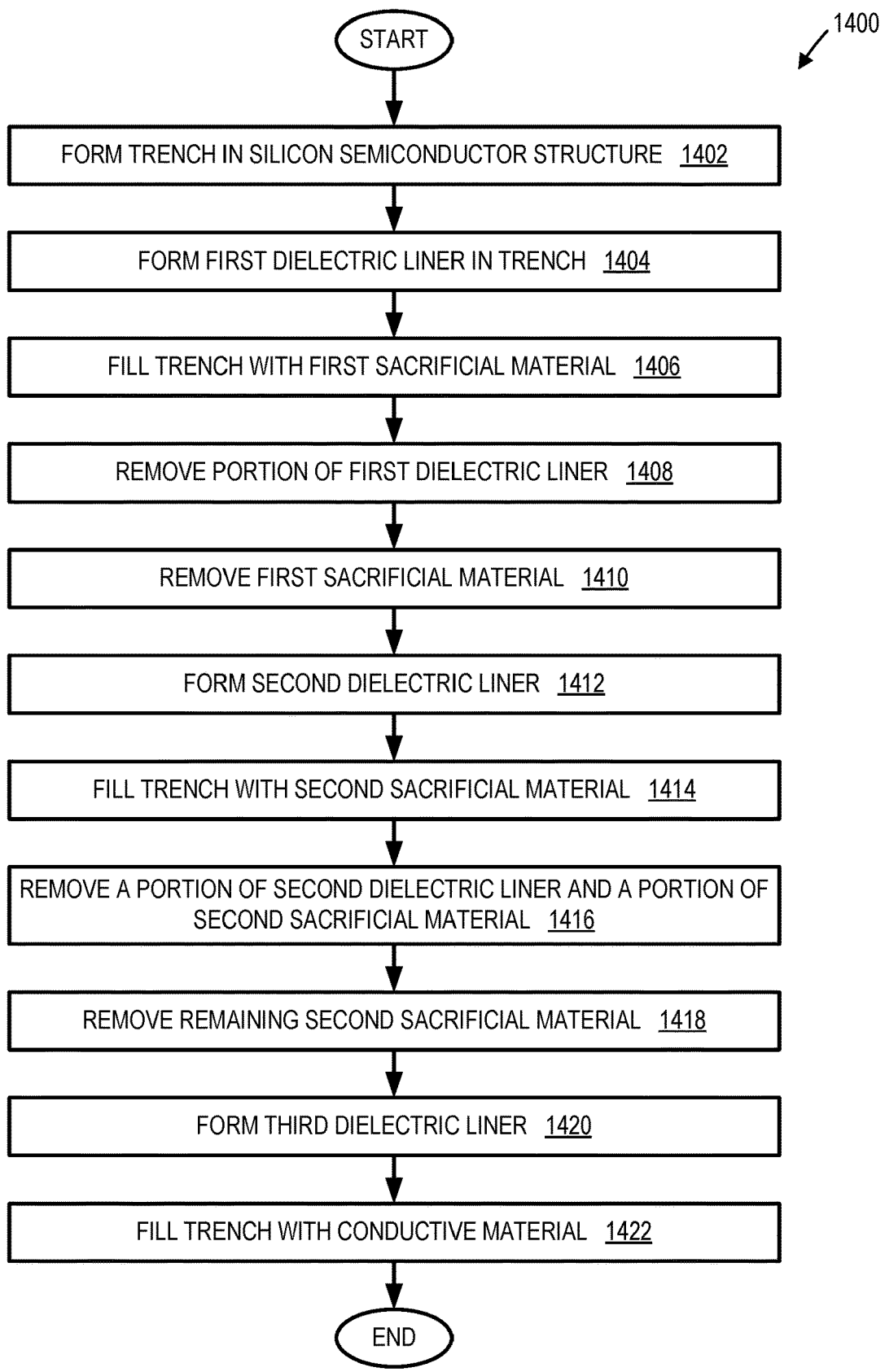
FIG. 14 illustrates yet another method for forming a vertical gate of a LDMOS transistor, according to an embodiment.
Figure 15A:
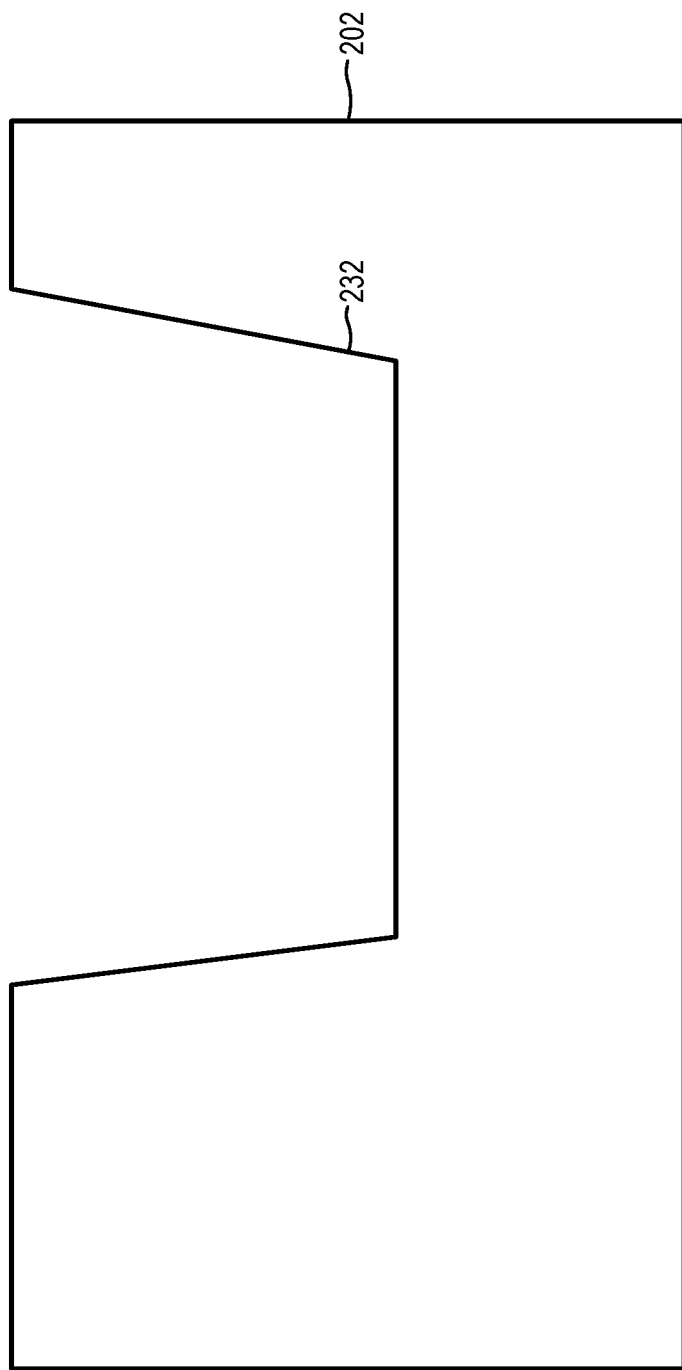
FIGS. 15A-15K illustrate one example of the FIG. 14 method being used to form a vertical gate of the FIG. 4 LDMOS transistor.
Figure 15B:
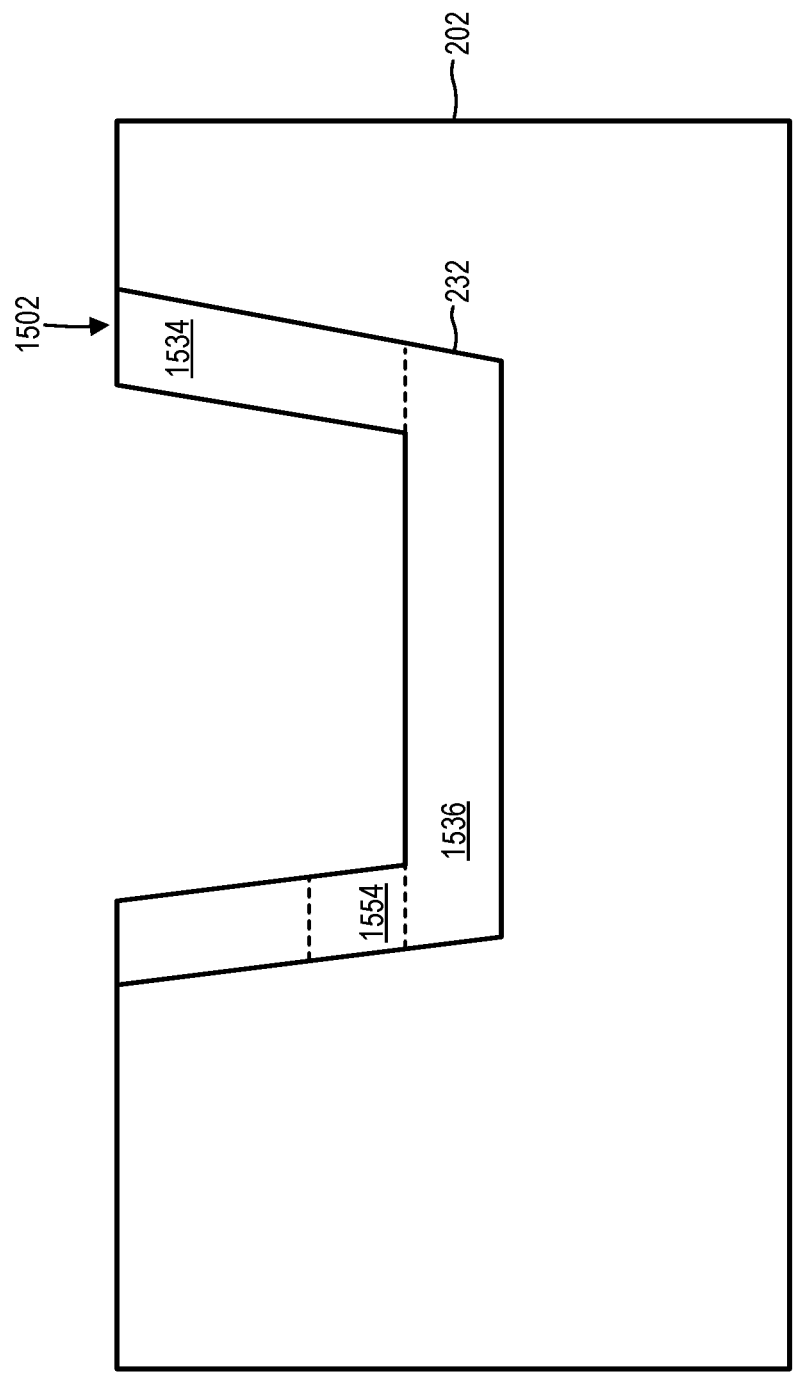
Figure 15C:
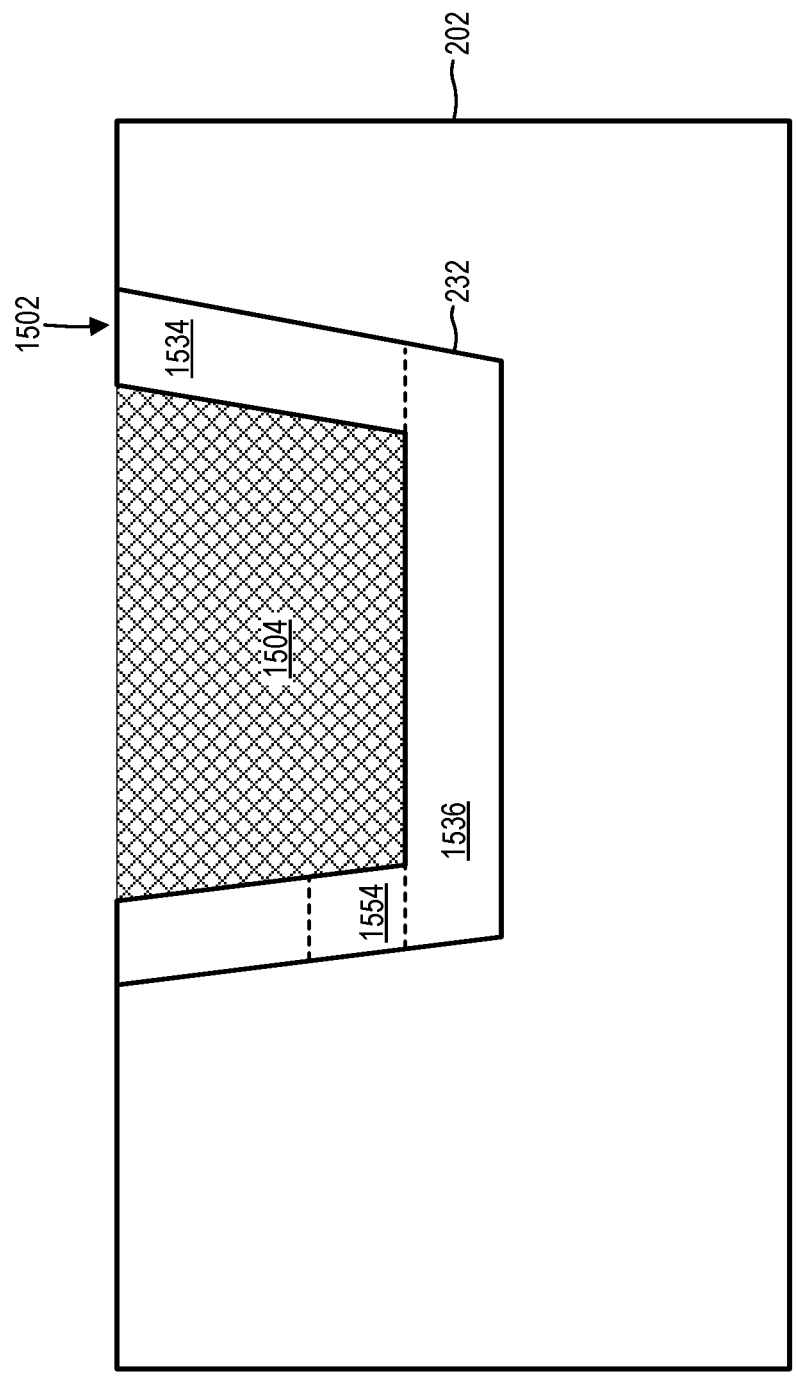
Figure 15D:
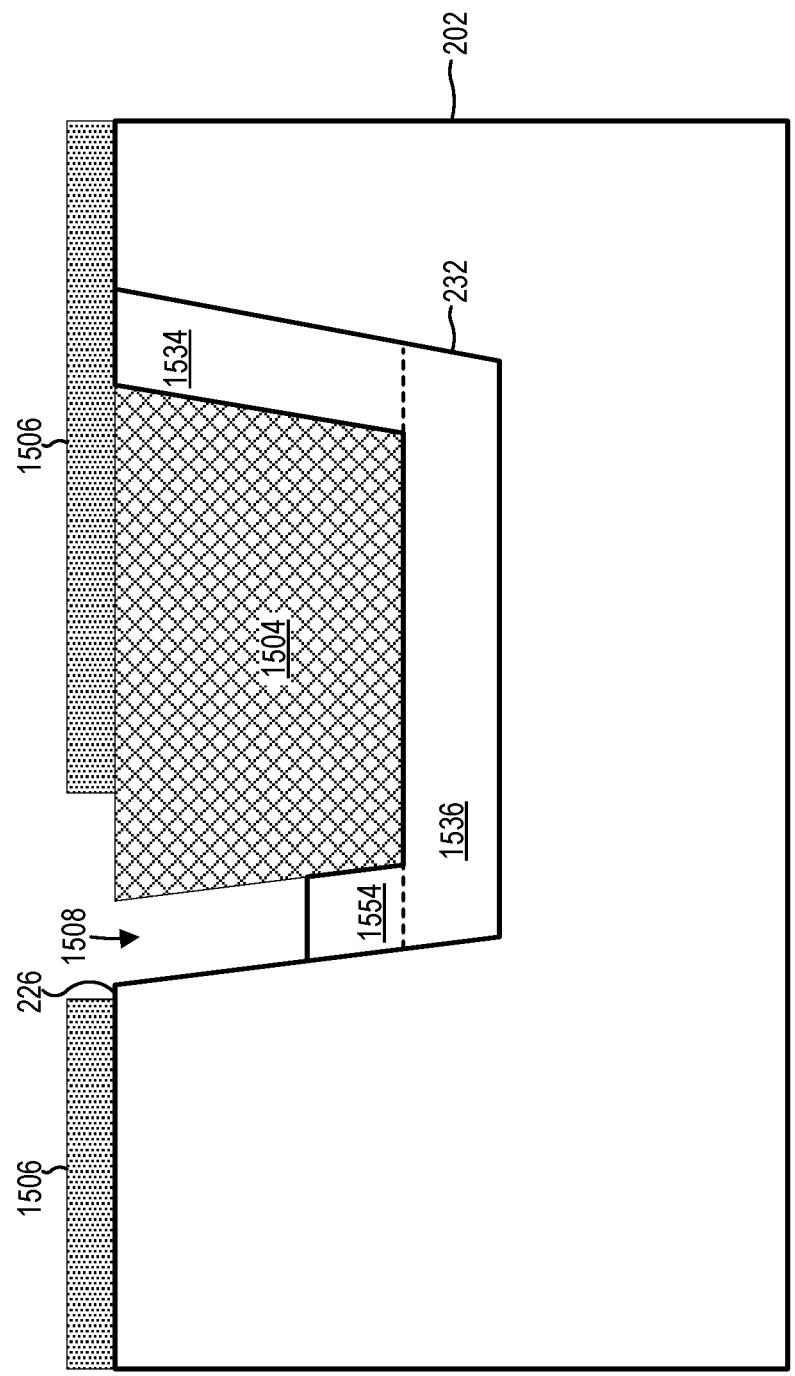
Figure 15E:
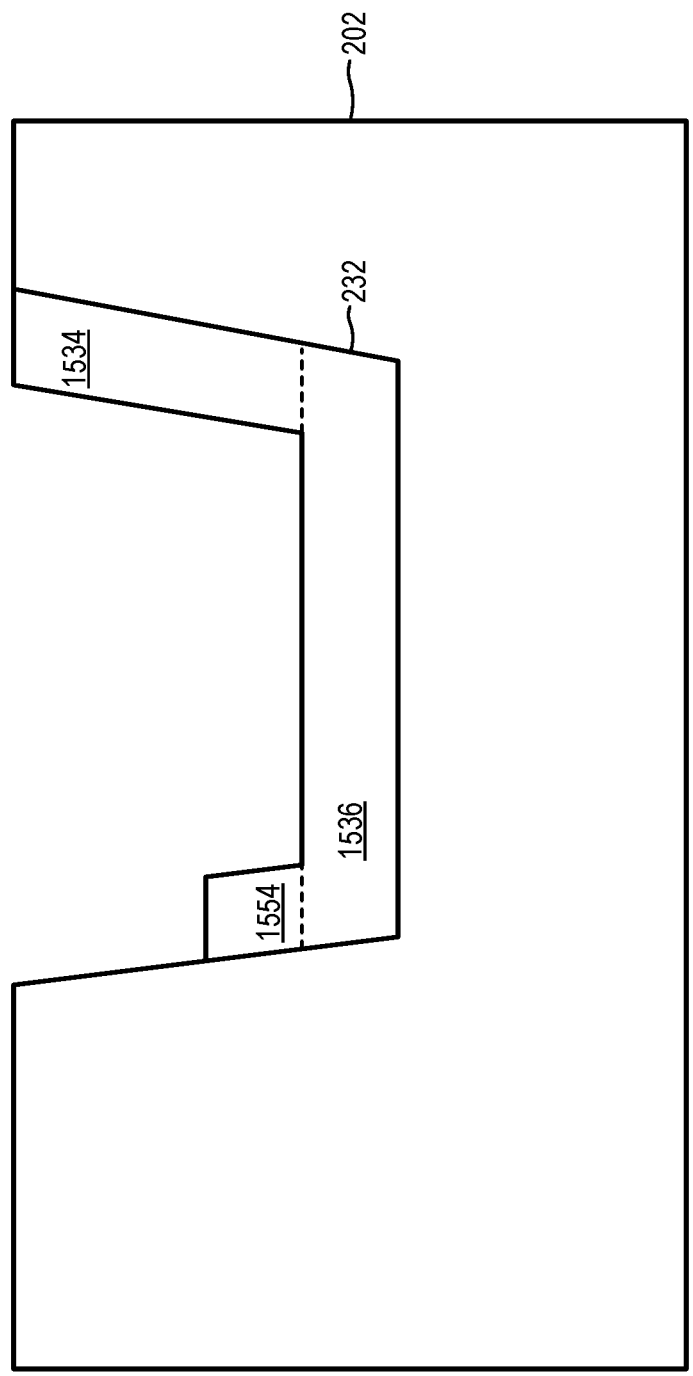

FIG. 14 illustrates a method 1400 for forming a vertical gate of a LDMOS transistor where the vertical gate includes five dielectric sections. FIG. 15 illustrates one example of forming a vertical gate 1500 of LDMOS transistor using method 1400, where vertical gate 1500 is similar to vertical gate 404 of FIGS. 4 and 5 but includes an additional dielectric section. FIGS. 14 and 15 are best viewed together. In step 1402, a trench is formed in a silicon semiconductor structure. In one example of step 1402 illustrated in FIG. 15A, trench 232 is formed in silicon semiconductor structure 202. In step 1404, a first dielectric liner is formed in the trench. In one example of step 1404, a first dielectric liner 1502 is formed in trench 232 with appropriate thicknesses to form a first dielectric section 1534, a second dielectric section 1536, and a fourth dielectric section 1554, as illustrated in FIG. 15B, using processes such as nitride deposition, oxide growth, and nitride removal. First dielectric section 1534, second dielectric section 1536, and fourth dielectric section 1554 are analogous to first dielectric section 234, second dielectric section 436, and fourth dielectric section 454, respectively. In step 1406, the trenched is filled with a first sacrificial material. In one example of step 1406, trench 232 is filled with a spin-on carbon material 1504, or another material significantly more susceptible to etchant than dielectric liner 1502, as illustrated in FIG. 15C.

Figure 15F:
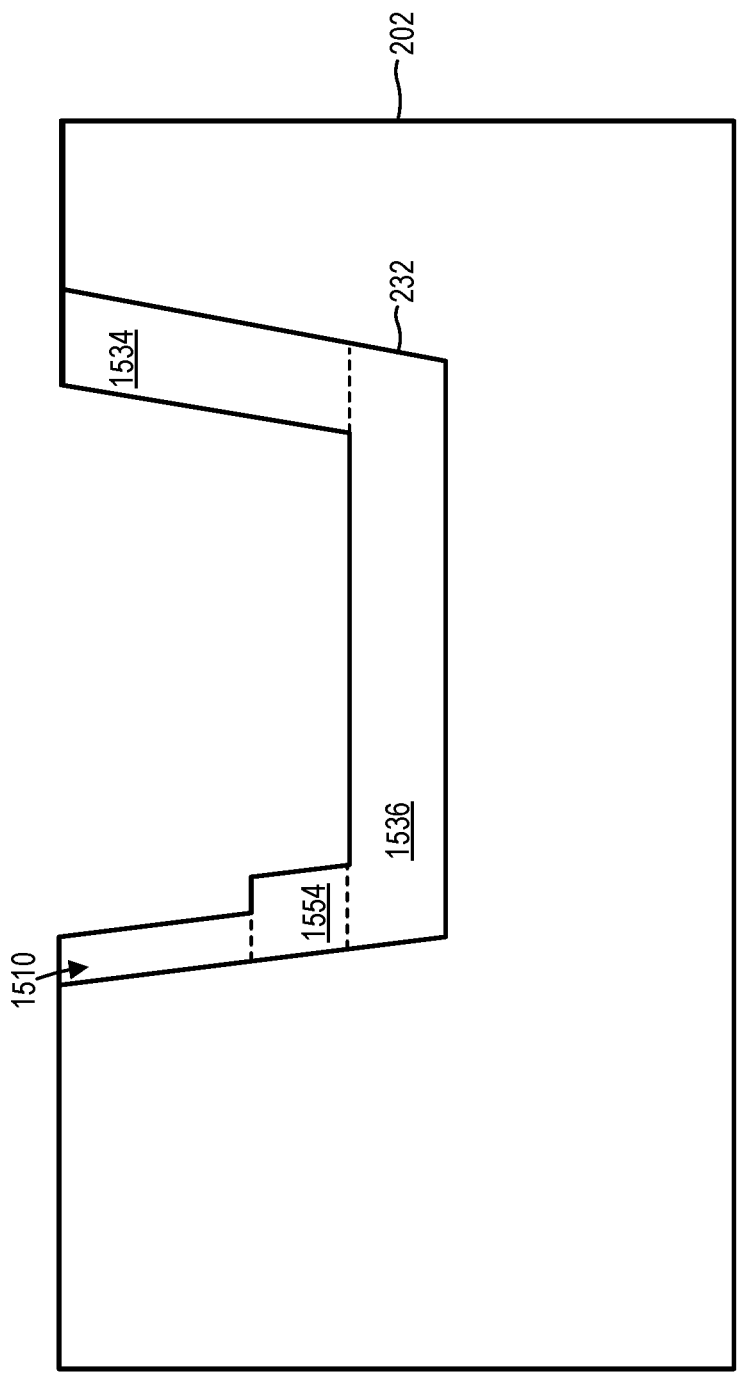
Figure 15G:
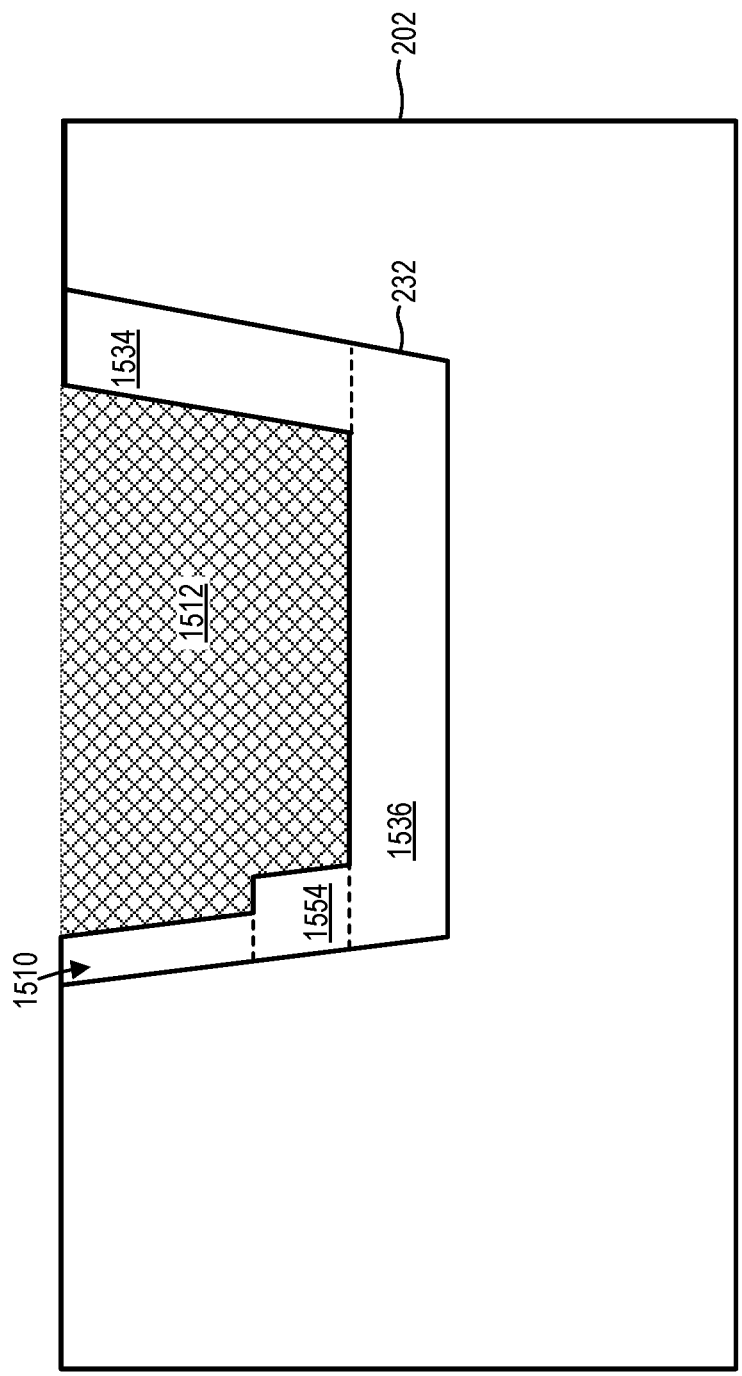
Figure 15H:
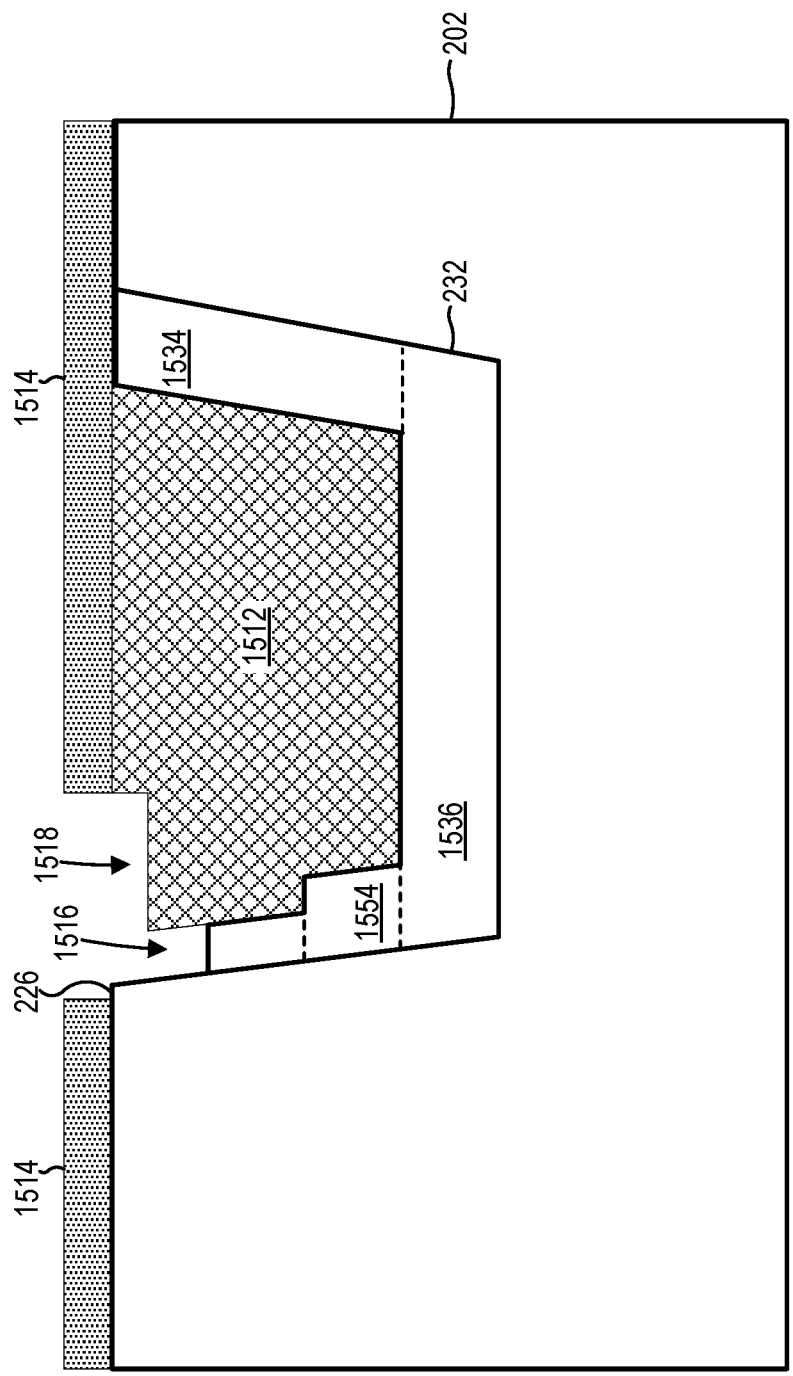
Figure 15I:
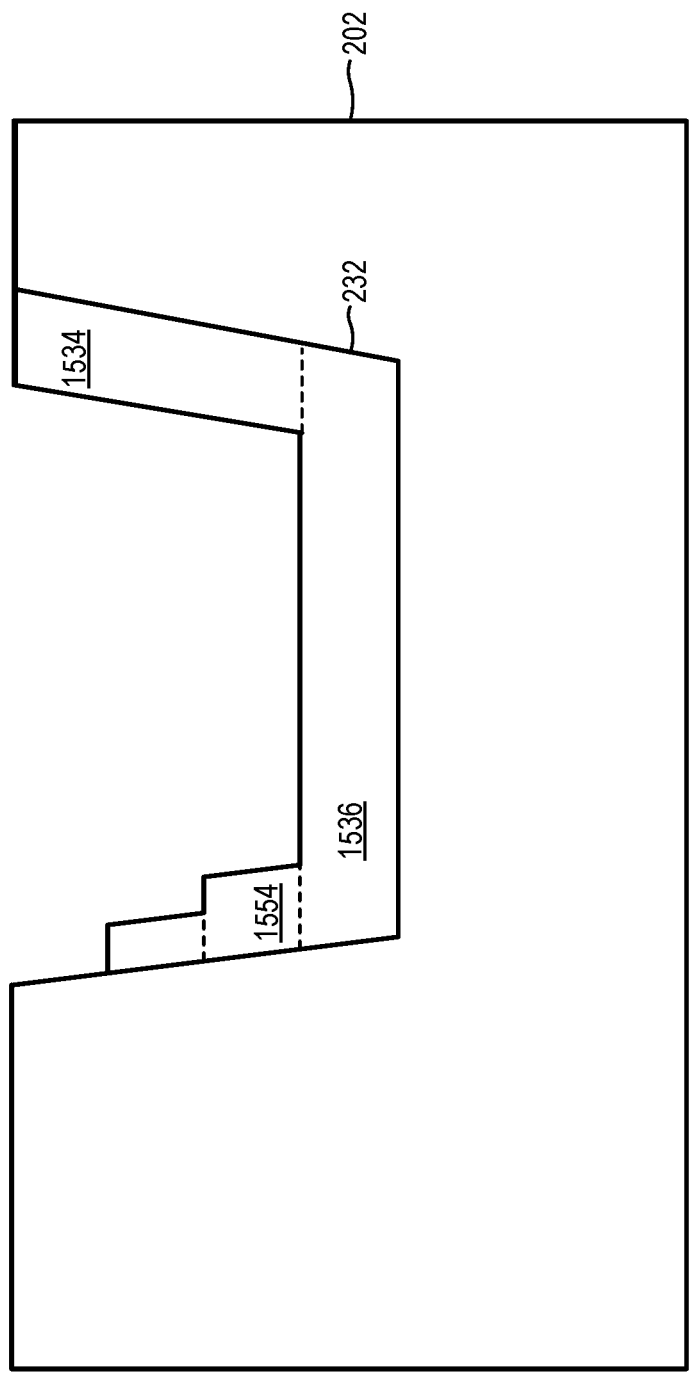

In step 1408, a portion of the first dielectric liner is removed. In one example of step 1408 illustrated in 15D, outer surface 226 of silicon semiconductor structure 202 is patterned with a hard mask material 1506, and a portion 1508 of first dielectric layer 1502, which is uncovered by hard mask material 1506, is removed using a wet etching process that selectively etches first dielectric layer 1502 without significantly etching spin-on carbon material 1504. In step 1410, the first sacrificial material removed. In one example of step 1410 illustrated in FIG. 15E, spin-on carbon material 1504 and hard mask material 1506 are removed using a plasma etching process. In step 1412, a second dielectric liner is formed at least where the portion of the first dielectric liner was removed in step 1408. In one example of step 1412, a second dielectric liner 1510 is disposed in trench 232, as illustrated in FIG. 15F. In step 1414, the trench is filled with a second sacrificial material. In one example of step 1414 illustrated in FIG. 15G, trench 232 is filled with a spin-on carbon material 1512.

Figure 15J:
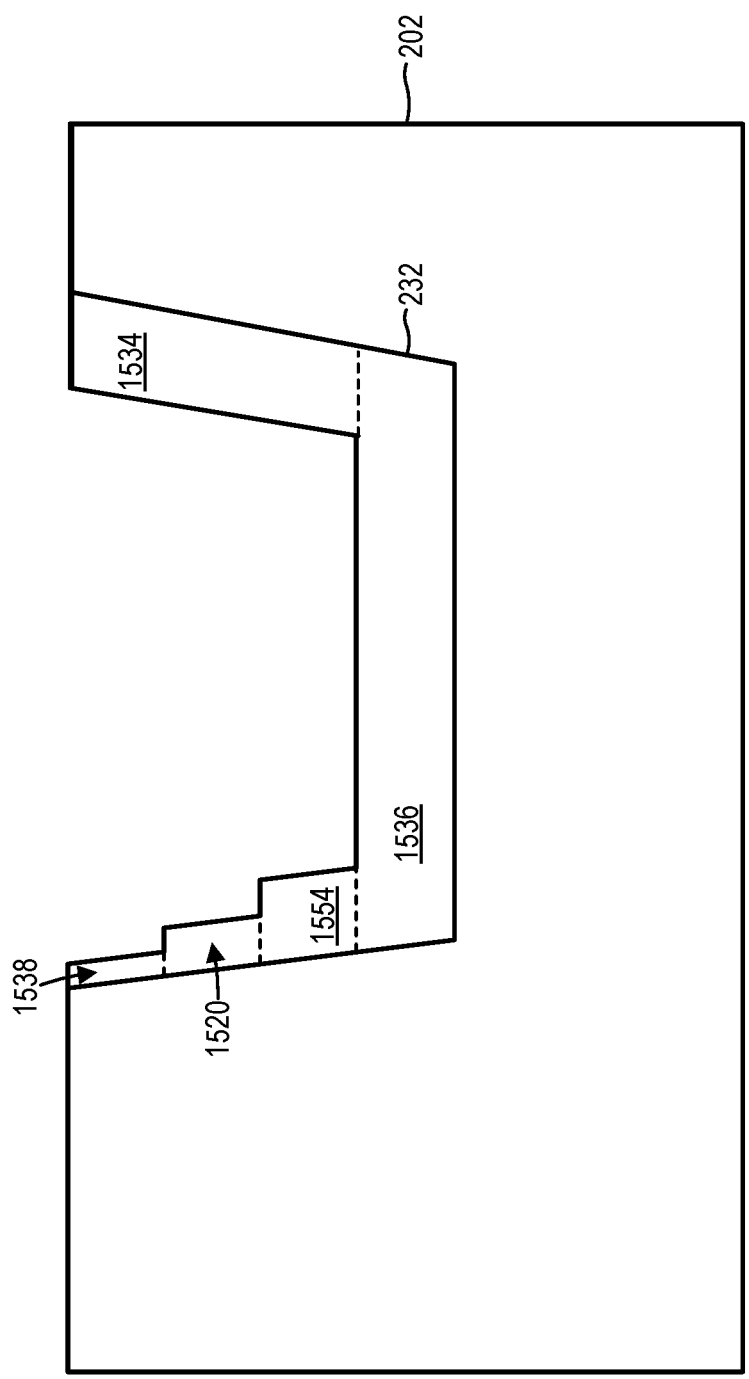
Figure 15K:
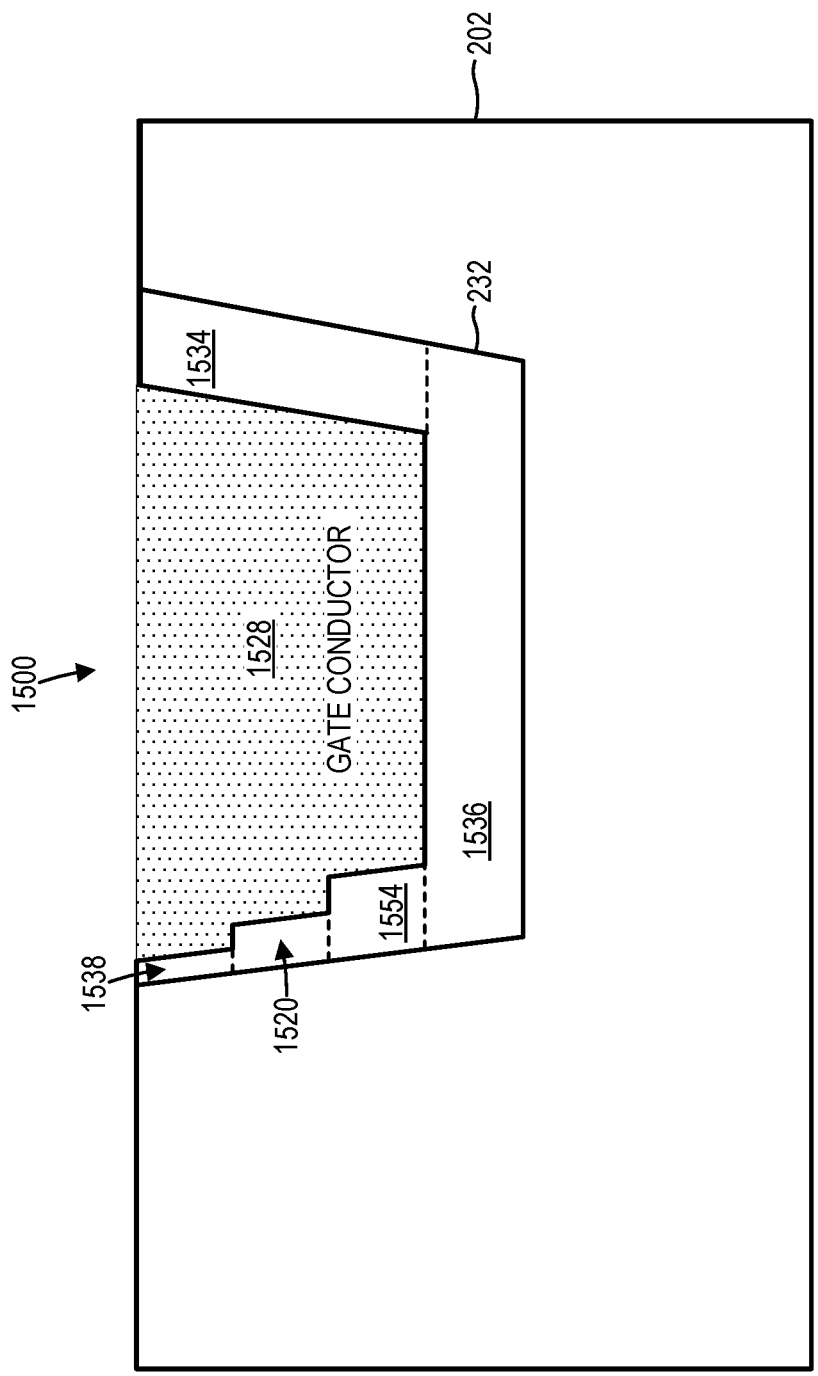

In step 1416, each of a portion of the second dielectric liner and a portion of the second sacrificial material are removed. In one example of step 1416 illustrated in FIG. 15H, outer surface 226 of silicon semiconductor structure 202 is patterned with a hard mask material 1514, and a portion 1516 of second dielectric layer 1510 and a portion 1518 of spin-on carbon material 1512, which are uncovered by hard mask material 1514, are removed using a wet etching process that etches additional dielectric layer 1510 at a greater rate than spin-on carbon material 1512. In step 1418, remaining second sacrificial material is removed. In one example of step 1418 illustrated in FIG. 15I, remaining spin-on carbon material 1512 and hard mask material 1514 are removed using a plasma etching process. In step 1420, a third dielectric liner is formed at least where the portion of the first dielectric liner was removed in step 1408 and where the portion of the second dielectric liner was removed in step 1418. In one example of step 1420, a third dielectric liner is disposed to a form third dielectric section 1538 and a fifth dielectric section 1520, as illustrated in FIG. 15J. In step 1422, the trench is filed with a conductive material to form a gate conductor. In one example of step 1422 as illustrated in FIG. 15K, trench 232 is filled with polysilicon and then planarized to form gate conductor 1528. Vertical gate 1500 include first, second, third, fourth, and fifth dielectric sections 1534, 1536, 1538, 1554, and 1520, respectively. Method 1500 could be modified to include additional steps of removing sacrificial material and dielectric liner to form a vertical gate with additional dielectric sections, without departing from the scope hereof.

Certain embodiments of methods 800, 1000, 1200, and 1400 are conducive to integration with CMOS fabrication processes, thereby facilitating forming an integrated circuit with both LDMOS transistors and CMOS transistors. One or more of methods 800, 1000, 1200, and 1400 are performed, for example, early in a CMOS fabrication process to minimize the impact of method 800, 1000, 1200, and/or 1400 on the CMOS fabrication process.

Figure 16:
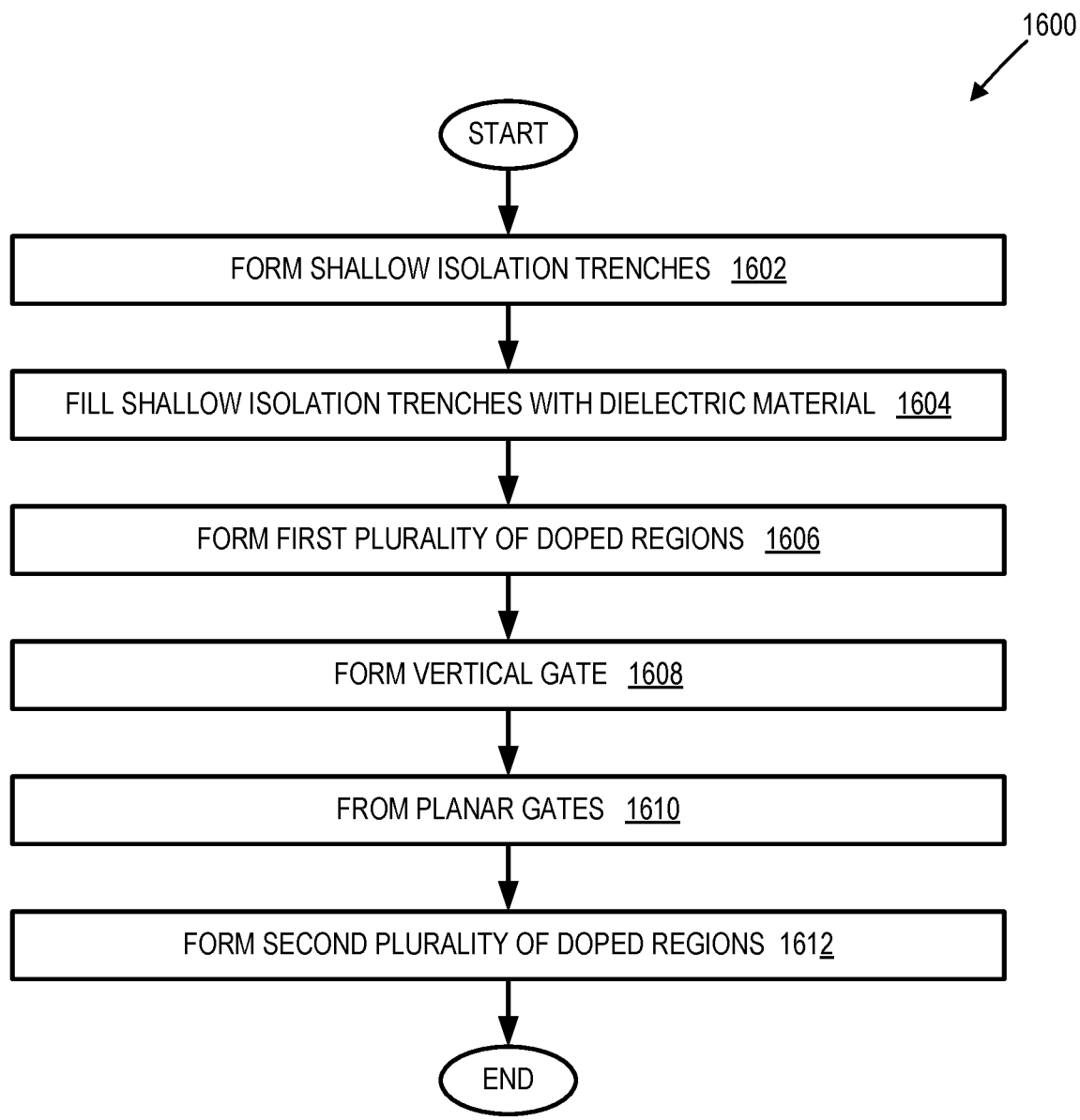
FIG. 16 illustrates a method for forming an integrated circuit, according to an embodiment.

For example, FIG. 16 illustrates a method 1600 for forming an integrated circuit where method 800 for forming a vertical gate of a LDMOS transistor is executed within a CMOS fabrication process, and FIGS. 17A-17F illustrate one example of forming integrated circuit 600 using method 1600. FIGS. 16 and 17 are best viewed together. In step 1602, one or more shallow isolation trenches are formed in a silicon semiconductor structure. In one example of step 1602 illustrated in FIG. 17A, shallow isolation trench 606 is formed in silicon semiconductor structure 202. In step 1604, the one or more shallow trenches formed in step 1602 are filled with dielectric material. In one example of step 1604 illustrated in FIG. 17B, shallow isolation trench 606 is filled with dielectric material 608. In step 1606, a first plurality of doped regions are formed in the silicon semiconductor structure. In one example of step 1606, n-type layer 214 and CMOS p-body region 612 are implanted in silicon semiconductor structure 202, as illustrated FIG. 17C.

Figure 17A:
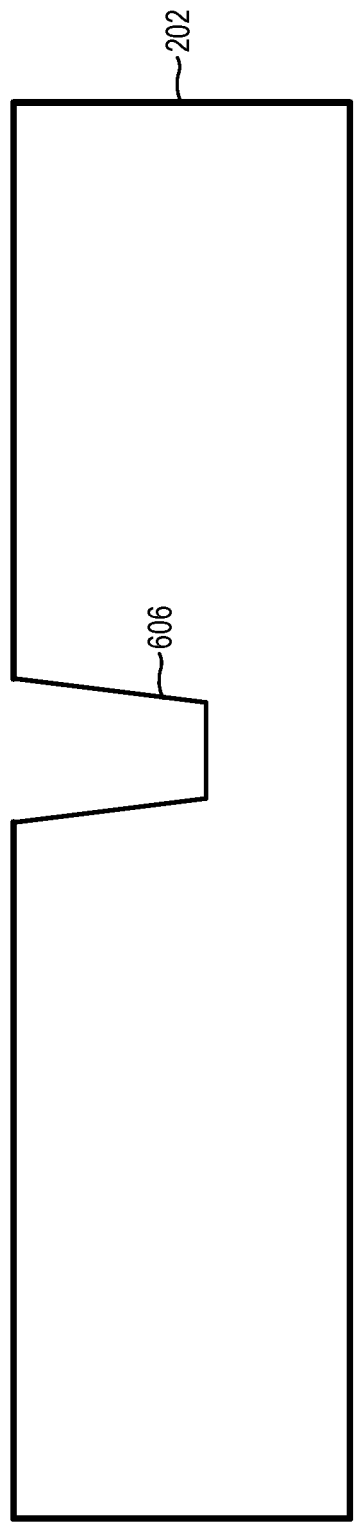
FIGS. 17A-17F illustrate one example of the FIG. 16 method being used to form the FIG. 6 integrated circuit.
Figure 17B:
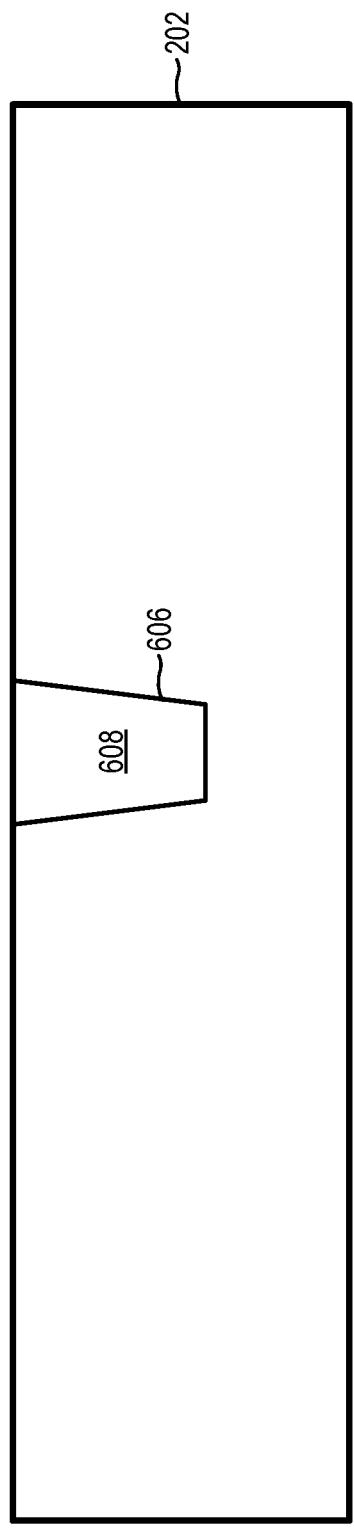
Figure 17C:
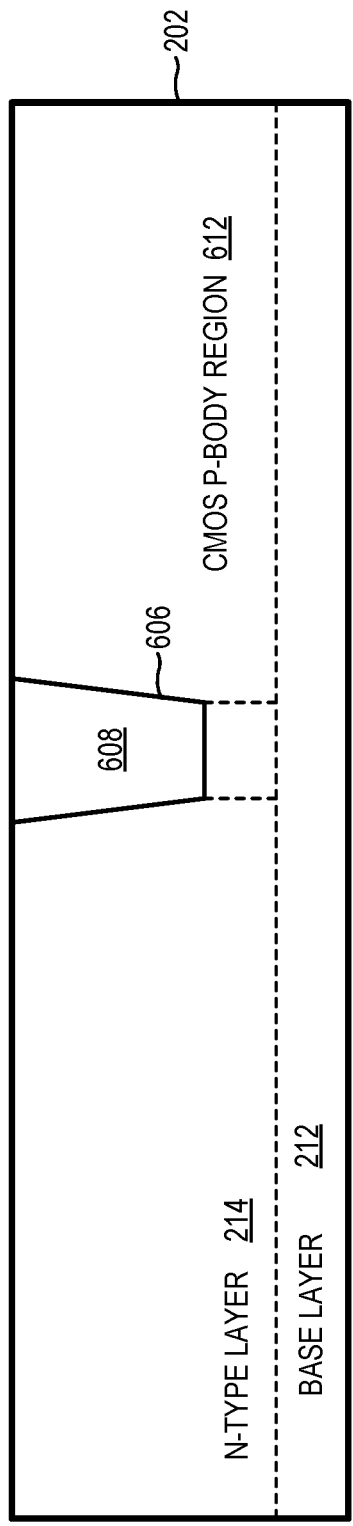
Figure 17D:
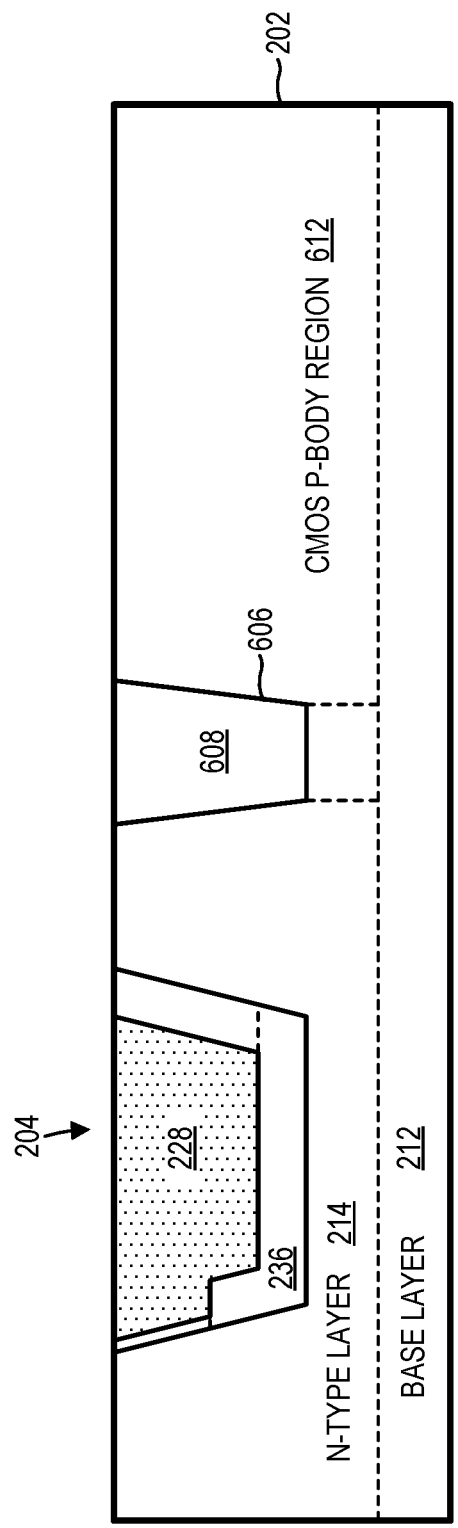
Figure 17E:
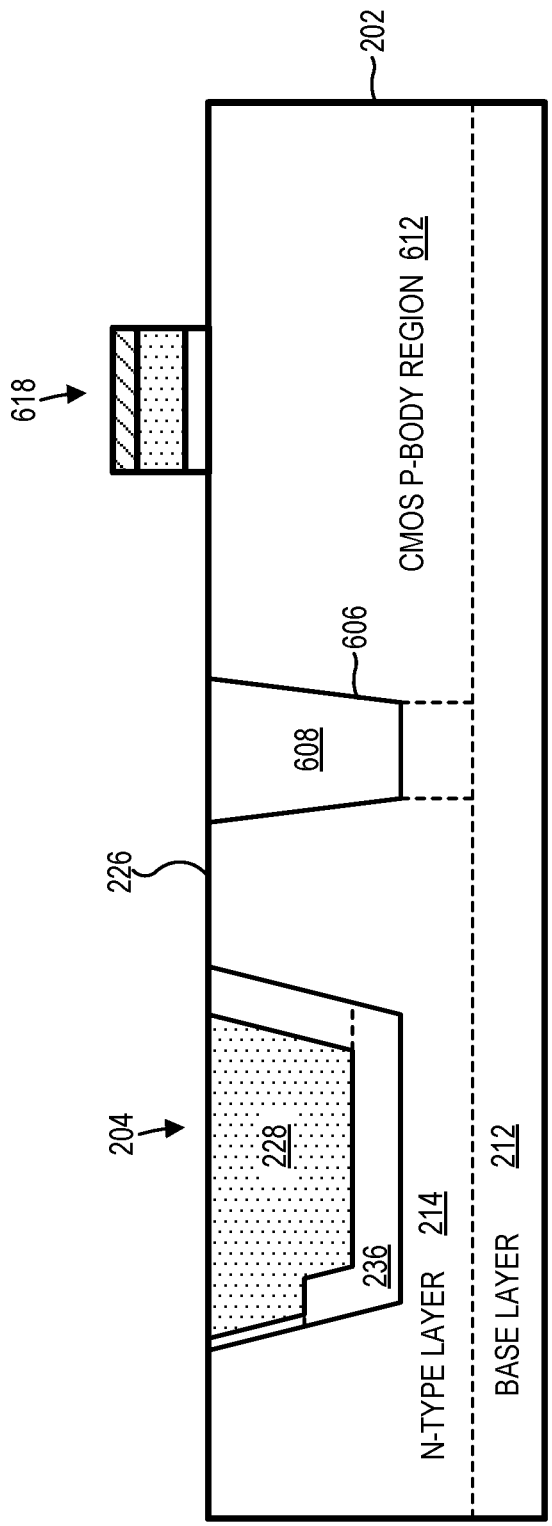
Figure 17F:
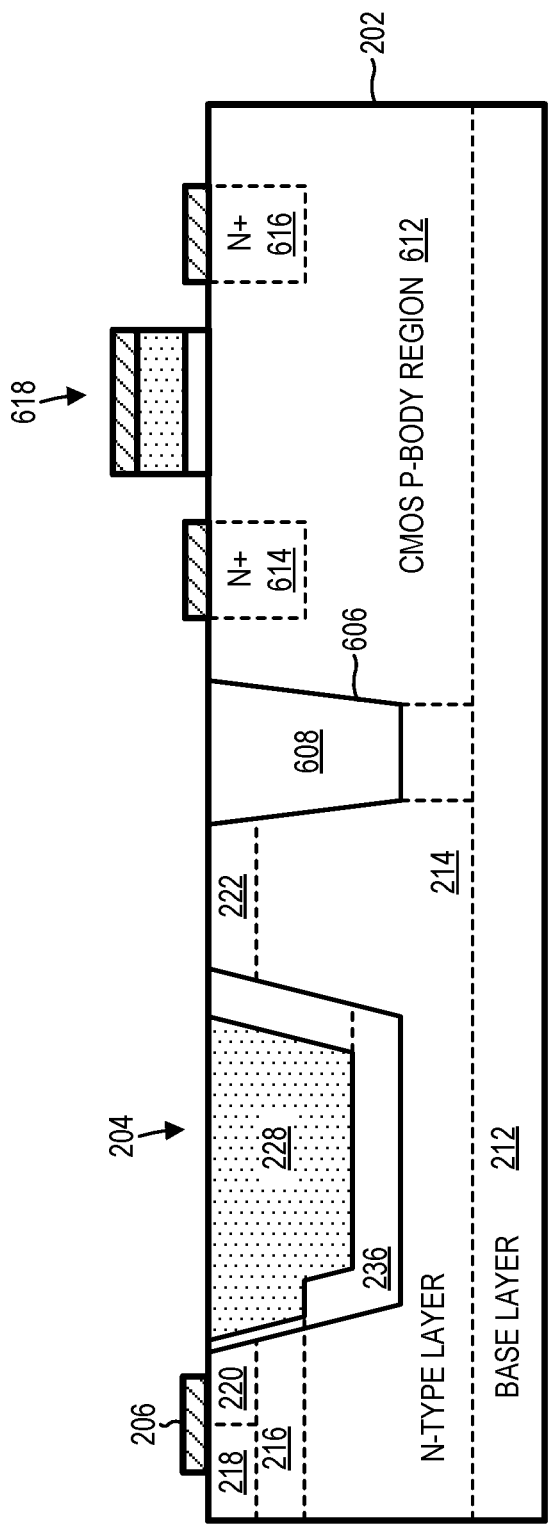

In step 1608, a vertical gate is formed in the silicon semiconductor structure. In one example of step 1608, vertical gate 204 is formed in silicon semiconductor structure 202 using method 800 of FIG. 8, as illustrated in FIG. 17D. In step 1610, one or more planar gates are formed on the silicon semiconductor structure. In one example of step 1610 illustrated in FIG. 17E, CMOS gate structure 618 is formed on outer surface 226 of silicon semiconductor structure 202. In step 1612, a second plurality of doped regions are formed in the silicon structure, such that the first plurality of doped regions, the second plurality of doped regions, the vertical gate, and one or more planar gates collectively form a LDMOS transistor and at least one CMOS transistor. In one example of step 1612, p-body region 216, source p+ region 218, source n+ region 220, drain n+ region 222, CMOS source n+ region 614, and CMOS drain n+ region 616 are formed in silicon semiconductor structure 202, resulting in integrated circuit 600 including LDMOS transistor 200 and CMOS transistor 602, as illustrated in FIG. 17F.

Figure 18:
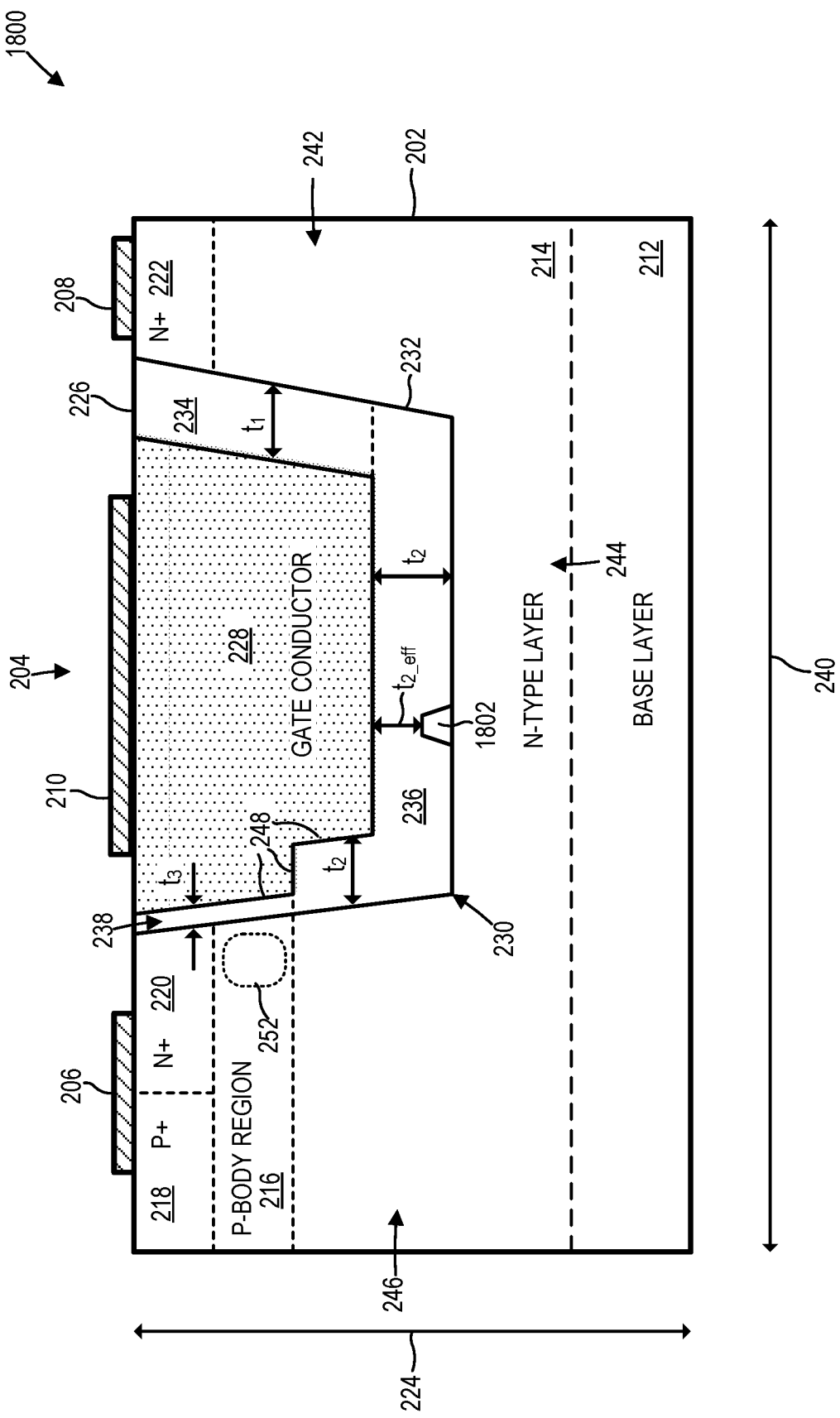
FIG. 18 is a cross-sectional view of a LDMOS transistor which is like the LDMOS transistor of FIGS. 2 and 3, but where extraneous matter present during etching of a trench caused a cone defect to form at the bottom of the trench, according to an embodiment.

Imperfections may result when forming a trench in a silicon semiconductor structure by a masking and etching process. For example, extraneous matter may mask the silicon semiconductor structure in one or more places during etching, thereby inhibiting etching and causing formation of protrusions or "cones." For example, FIG. 18 is a cross-sectional view of a LDMOS transistor 1800 which is like LDMOS transistor 200 of FIGS. 2 and 3, but where extraneous matter present during etching of trench 232 caused a cone defect 1802 to form at the bottom of trench 232. Cone defect 1802 reduces second separation distance $t_2$ to an effective value of $t_{2\_eff}$ in the vicinity of cone defect 1802, thereby negatively affecting electric field distribution in LDMOS transistor 1800 and associated breakdown voltage of the LDMOS transistor.

Applicant has determined that cone protrusions and other imperfections can be at least partially mitigated by beginning a silicon etching step with a silicon breakthrough etching sub-step using a plasma etching process with a gas mixture including fluorine with optional oxygen. This silicon breakthrough etching sub-step advantageously breaks through and removes surface oxide and any other extraneous matter which would inhibit etching, thereby helping prevent formation of imperfections such as cone protrusions. Accordingly, in certain embodiments of methods 800, 1000, 1200, and 1400, each of respective steps 802, 1002, 1202, and 1402 begins with a silicon breakthrough etching sub-step using a plasma etching process with a gas mixture including fluorine with optional oxygen.

For example, in some embodiments, one or more of steps 802, 1002, 1202, and 1402 are at least partially performed as follows. First, a masked is formed using a two-step process where (a) a photoresist masking pattern is disposed on the silicon semiconductor structure using a bottom anti-reflective coating (BARC), and (b) a hard mask is formed in accordance with the photoresist masking pattern. The hard mask is formed, for example, of one or more of a silicon nitride material, a silicon oxide material, and a silicon oxynitride material. Second, a silicon breakthrough etch is made to break through and remove surface oxide and any other extraneous matter which would inhibit etching, using a plasma etching process with a gas mixture including fluorine with optional oxygen. In some embodiments, the gas mixture contains carbon, fluorine, and oxygen.

Third, a top corner of the silicon semiconductor structure is rounded to obtain a desired radius of curvature using a plasma etching process with a $CF_x$, $O_2$, HBr or $Cl_2$ gas mixture, where "x" is an optional additional element such as oxygen. Fourth, a primary etch is made is the silicon semiconductor structure to obtain a desired trench depth and trench profile. The primary etch is made, for example, using a plasma etching process with a gas mixture that is free of carbon and fluorine. The gas mixture optionally includes oxygen to achieve the desired trench profile. Fifth, the trench bottom is rounded to avoid sharp corners at the trench's bottom. The trench bottom is rounded, for example, using a plasma etching process with a gas mixture that is free of carbon and fluorine but includes oxygen.

Figure 19:
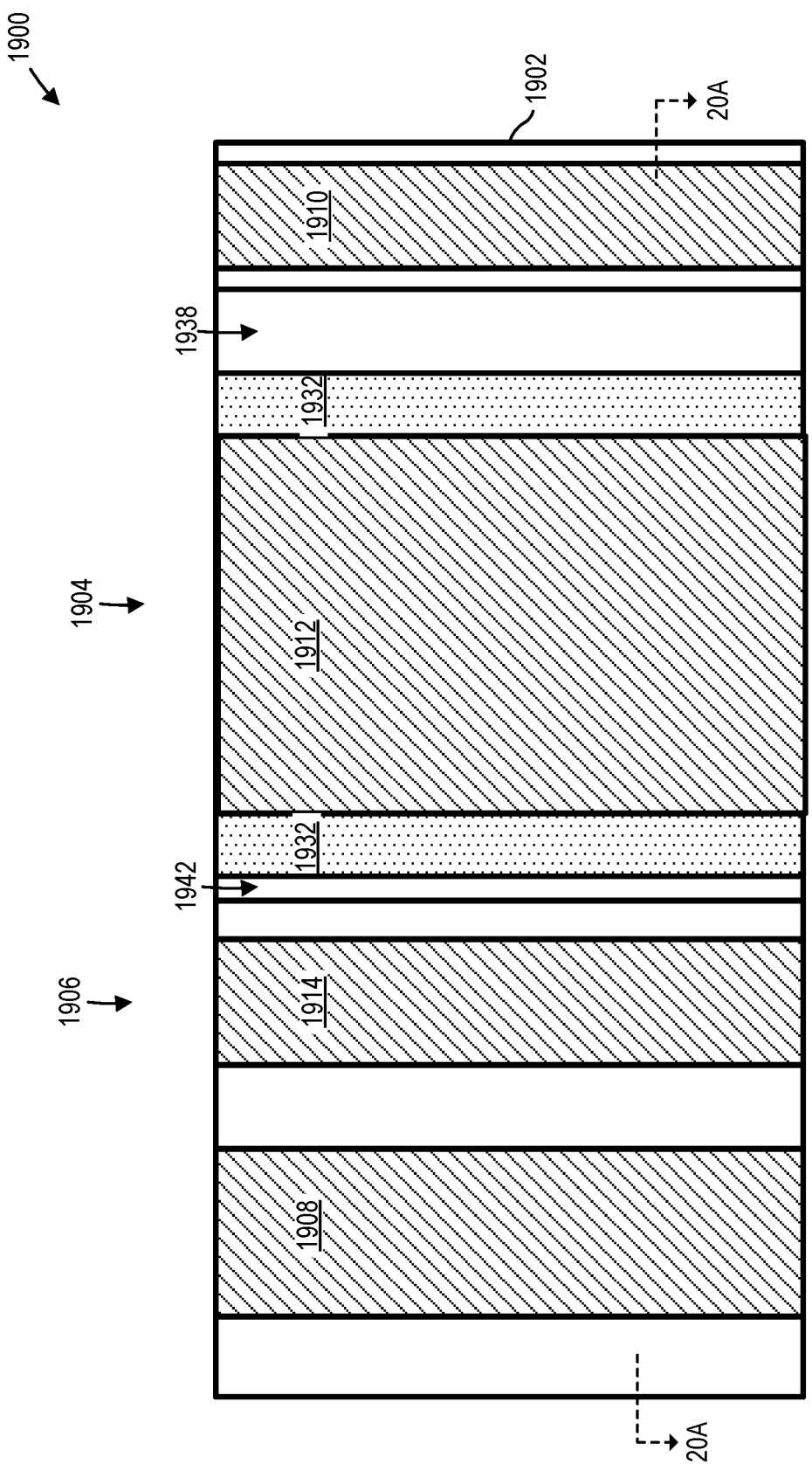
FIG. 19 is a top plan view of a LDMOS transistor including both a vertical gate and a lateral gate, according to an embodiment.

Applicant has additionally determined that a vertical gate can be used with a lateral gate to further promote low on-resistance. For example, FIG. 19 is a top plan view of a LDMOS transistor 1900 including both a vertical gate and a lateral gate. FIG. 20 is a cross-sectional view of LDMOS transistor 1900 taken along line 20A-20A of FIG. 19. LDMOS transistor 1900 includes a silicon semiconductor structure 1902, a vertical gate 1904, a lateral gate 1906, a source electrode 1908, a drain electrode 1910, a vertical gate electrode 1912, and a lateral gate electrode 1914.

Silicon semiconductor structure 1902 includes a base layer 1916, an n-type layer 1918, a p-body region 1920, a source p+ region 1922, a source n+ region 1924, and a drain n+ region 1926. Base layer 1916 is, for example, an n-type high-voltage well in a silicon substrate, a p-type silicon substrate, or an n-type epitaxial layer grown over a p-type silicon substrate. N-type layer 1918 is disposed over base layer 1916 in a thickness direction 1928, and p-body region 1920 is disposed in n-type layer 1918 adjacent to an outer surface 1930 of silicon semiconductor structure 1902. Source p+ region 1922 and source n+ region 1924 are each disposed in p-body region 1920, and drain n+ region 1926 is disposed in n-type layer 1918 adjacent to outer surface 1930. Source p+ region 1922 has a greater p-type dopant concentration than p-body region 1920, and each of source n+ region 1924 and drain n+ region 1926 has a greater n-type dopant concentration than n-type layer 1918.

Silicon semiconductor structure 1902 can include additional impurity regions without departing from the scope hereof. Additionally, the locations of source p+ region 1922 and source n+ region 1924 within p-body region 1920 can be varied. For example, in an alternate embodiment (not illustrated), source p+ region 1922 is disposed behind source n+ region 1924 within p-body region 1920.

One or more regions of silicon semiconductor structure 1902 optionally has a graded dopant concentration. For example, in some embodiments, n-type layer 1918 has a graded n-type dopant concentration where n-type dopant concentration is greatest near drain n+ region 1926, and p-body region 1920 has a graded p-type dopant concentration where p-type dopant concentration is greatest near lateral gate 1906. In certain embodiments, n-type layer 1918 is configured to have n-type dopant gradient concentrations which help maximize accumulation conductance while maintaining desired breakdown voltage of LDMOS transistor 1900.

Vertical gate 1904 is similar to vertical gate 204 of LDMOS transistor and includes a gate conductor 1932 and a gate dielectric layer 1934 each disposed in a trench 1936 of silicon semiconductor structure 1902. Depth of trench 1936 is selected, in part, according to required breakdown voltage of LDMOS transistor 1900. Breakdown voltage magnitude increases with increasing depth of trench 1936 in thickness direction 1928. Gate conductor 1932 extends from outer surface 1930 into silicon semiconductor structure 1902 in thickness direction 1932, and gate dielectric layer 1934 includes a first dielectric section 1938, a second dielectric section 1940, and a third dielectric section 1942 analogous to first dielectric section 234, second dielectric section 236, and third dielectric section 238 of vertical gate 204. Gate conductor 1932 is disposed between source n+ region 1924 and drain n+ region 1926 in a lateral direction 1944 orthogonal to thickness direction 1928. Additionally, a portion of p-body region 1920 and a portion of n-type layer 1918 separate source n+ region 1924 from vertical gate 1904 in lateral direction 1944.

Lateral gate 1906 is disposed on outer surface 1930 over a portion of p-body region 1920 and over a portion of n-type layer 1918. Lateral gate 1906 includes a gate dielectric layer 1946 disposed on outer surface 1930 in thickness direction 1928. Gate dielectric layer 1946 is formed of, for example, silicon dioxide or a high-K dielectric material such as one or more of $HfO_2$, $TiO_2$, $ZrO_2$, and $HfAlO_x$. A gate conductor layer 1948 is disposed on gate dielectric layer 1946 in thickness direction 1928, and lateral gate electrode 1914 is disposed on gate conductor layer 1948 in thickness direction 1928. Gate conductor layer 1948 is formed of, for example, polysilicon.

Source electrode 1908 is disposed on outer surface 1930 and contacts each of source p+ region 1922 and source n+ region 1924. Drain electrode 1910 disposed on outer surface 1930 and contact drain n+ region 1926, and vertical gate electrode 1912 is disposed on outer surface 1930 and contacts gate conductor 1932. In some alternate embodiments, source electrode 1908 is replaced with two separate electrodes contacting source p+ region 1922 and source n+ region 1924, respectively.

While not required, it is anticipated that lateral gate 1906 will typically be used to control LDMOS transistor 1900 and that vertical gate 1904 will be biased to mitigate miller capacitance effects. For example, in some embodiments, vertical gate 1904 is continuously grounded. As another example, in some other embodiments, vertical gate 1904 is grounded during switching of LDMOS transistor 1900, and vertical gate 1904 is positively biased during steady-state operation of LDMOS transistor 1900. Vertical gate 1904 is grounded, for instance, by electrically coupling vertical gate electrode 1912 to source electrode 1908 such that vertical gate electrode 1912 has the same electrical potential as source electrode 1908. Vertical gate 1904 is positively biased, for instance, by applying a positive voltage to vertical gate electrode 1912 relative to source electrode 1908.

In applications where lateral gate 1906 is used to control LDMOS transistor 1900, the transistor may operate as follows. When positive voltage $V_{DS}$ is applied between drain electrode 1910 and source electrode 1908, a p-n junction formed at the interface of n-type layer 1918 and p-body region 1920 is reversed biased, so that very little current flows between drain electrode 1910 and source electrode 1908 by default. However, a positive voltage $V_{GS}$ applied between lateral gate electrode 1914 and source electrode 1908 creates negative charges in semiconductor structure 1902 adjacent to gate dielectric layer 1946, causing a minority-carrier channel to form in a portion of p-body region 1920 approximately indicated by dashed-line 1950. This channel has excess electrons and therefore conducts electric current through p-body region 1920 from n-type layer 1918 to source n+ region 1924. Consequentially, current will flow from drain n+ region 1926 to source n+ region 1924 when $V_{GS}$ exceeds a threshold value and $V_{DS}$ is a positive value. Source p+ region 1922 forms an ohmic contact between p-body region 1920 and source electrode 1908 to help prevent a parasitic bipolar junction transistor (not shown) in silicon semiconductor substrate 1902 from activating.

The configuration of vertical gate 1904 could vary without departing from the scope hereof. For example, in some alternate embodiments, gate dielectric layer 1934 includes fewer or greater dielectric sections. For example, in a particular alternate embodiment, gate dielectric layer 1934 is modified to have an additional dielectric section similar to fourth dielectric section 454 of FIG. 5. Additionally, vertical gate 1904 could be modified to have a symmetrical gate dielectric layer structure without departing from the scope hereof. For example, FIG. 21 is a cross-sectional view of LDMOS transistor 2100 which is like LDMOS transistor 1900 of FIGS. 19 and 20, but where vertical gate 1904 is replaced with a vertical gate 2104 having a gate conductor 2132 disposed within a symmetrical gate dielectric layer 2134.

Combinations of Features

Features described above may be combined in various ways without departing from the scope hereof. The following examples illustrate some possible combinations:

(A1) A LDMOS transistor may include a silicon semiconductor structure and a vertical gate. The vertical gate may include (1) a gate conductor extending from a first outer surface of the silicon semiconductor structure into the silicon semiconductor structure, and (2) a gate dielectric layer including a least three dielectric sections, each of the at least three dielectric sections separating the gate conductor from the silicon semiconductor structure by a respective separation distance, each of the respective separation distances being different from each other of the respective separation distances.

(A2) In the LDMOS transistor denoted as (A1), the silicon semiconductor structure may include (1) a base layer, (2) an n-type layer disposed over the base layer in a thickness direction, (3) a p-body region disposed in the n-type layer, (4) a source p+ region and a source n+ region each disposed in the p-body region, and (5) a drain n+ region disposed in the n-type layer. The gate conductor may extend from the first outer surface of the silicon semiconductor structure into the n-type layer in the thickness direction, and the gate conductor may be disposed between the source n+ region and the drain n+ region in a lateral direction orthogonal to the thickness direction.

(A3) The LDMOS transistor denoted as (A1) may further include (1) a source electrode disposed on the first outer surface of the silicon semiconductor structure and contacting each of the source p+ region and the source n+ region, (2) a drain electrode disposed on the first outer surface of the silicon semiconductor structure and contacting the drain n+ region, and (3) a gate electrode disposed on the first outer surface of the silicon semiconductor structure and contacting the gate conductor.

(A4) In any one of the LDMOS transistors denoted as (A2) and (A3), the at least three dielectric sections may include (1) a first dielectric section separating the gate conductor from a drain portion of the n-type layer in the lateral direction by a first separation distance $t_1$, (2) a second dielectric section separating the gate conductor from a well portion of the n-type layer in the thickness direction by a second separation distance $t_2$ different from the first separation distance $t_1$, and (3) a third dielectric section separating the gate conductor from the p-body region by a third separation distance $t_3$ different from each of the first separation distance $t_1$ and the second separation distance $t_2$.

(A5) In the LDMOS transistor denoted as (A4), the drain portion of the n-type layer may be disposed (a) below the n+ drain region in the thickness direction and (b) beside the vertical gate in the lateral direction, and the well portion of the n-type layer may be disposed below the vertical gate in the thickness direction.

(A6) In any one of the LDMOS transistors denoted as (A4) and (A5), the second dielectric section may further separate the gate conductor from a source portion of the n-type layer in the lateral direction by the second separation distance $t_2$.

(A7) In the LDMOS transistor denoted as (A6), the source region of the n-type layer may be disposed (a) below the p-body region in the thickness direction and (b) beside the vertical gate in the lateral direction.

(A8) In any one of the LDMOS transistors denoted as (A4) through (A7), the third separation distance $t_3$ may be less than each of the first separation distance $t_1$ and the second separation distance $t_2$.

(A9) In any one of the LDMOS transistors denoted as (A4) and (A5), the at least three dielectric sections may further include a fourth dielectric section separating the gate conductor from a source portion of the n-type layer in the lateral direction by a fourth separation distance $t_4$ that is different from each of the first separation distance $t_1$, the second separation distance $t_2$, and the third separation distance $t_3$.

(A10) In the LDMOS transistor denoted as (A9), the source region of the n-type layer may be disposed (a) below the p-body region in the thickness direction and (b) beside the vertical gate in the lateral direction.

(A11) In any one of the LDMOS transistors denoted as (A9) and (A10), the third separation distance $t_3$ may be less than each of the first separation distance $t_1$ and the second separation distance $t_2$, and the fourth separation distance $t_4$ may be less than the second separation distance $t_2$.

(A12) In any one of the LDMOS transistors denoted as (A2) through (A11), the source p+ region may have a greater p-type dopant concentration than the p-body region, and each of the source and drain n+ regions may have a greater n-type dopant concentration than the n-type layer.

(A13) In any one of the LDMOS transistors denoted as (A2) through (A12), the base layer may be selected from the group consisting of an n-type high-voltage well in a silicon substrate, a p-type silicon substrate, and an n-type epitaxial layer.

(A14) Any one of the LDMOS transistors denoted as (A2) through (A13) may further include a lateral gate disposed on the first outer surface over a portion of the p-body region and over a portion of the n-type layer.

(A15) In any one of the LDMOS transistors denoted as (A1) through (A14), each of the at least three dielectric sections may be formed of silicon dioxide.

(A16) In any one of the LDMOS transistors denoted as (A1) through (A14), the at least three dielectric sections may be formed of one or more high-K dielectric materials.

(A17) In the LDMOS transistor denoted as (A16), the one or more high-K dielectric materials may include at least one of $HfO_2$, $TiO_2$, $ZrO_2$, and $HfAlO_x$.

(A18) In any of the LDMOS transistors denoted as (A1) through (A14), at least two of the at least three dielectric sections may be formed of different dielectric materials.

(B1) A LDMOS transistor may include a silicon semiconductor structure, a vertical gate, and a lateral gate. The silicon semiconductor structure may include (1) a base layer, (2) an n-type layer disposed over the base layer in a thickness direction, (3) a p-body region disposed in the n-type layer, (4) a source p+ region and a source n+ region each disposed in the p-body region, and (5) a drain n+ region disposed in the n-type layer. The vertical gate may include (1) a gate conductor extending from a first outer surface of the silicon semiconductor structure into the n-type layer in the thickness direction, the gate conductor disposed between the source n+ region and the drain n+ region in a lateral direction orthogonal to the thickness direction, and (2) a gate dielectric layer separating the gate conductor from the silicon semiconductor substrate. The lateral gate may be disposed on the first outer surface over a portion of the p-body region and over a portion of the n-type layer.

(C1) An integrated circuit may include (1) any one of the LDMOS transistors denoted as (A1) through (A18) and (B1), and (2) a complementary metal oxide semiconductor (CMOS) transistor. The LDMOS transistor and the CMOS transistor may share a common silicon semiconductor structure.

(C2) In the integrated circuit denoted as (C1), the LDMOS and CMOS transistors may be electrically coupled within the integrated circuit.

(D1) LDMOS transistor may include a silicon semiconductor structure and a vertical gate. The silicon semiconductor structure may include (1) a base layer, (2) an n-type layer disposed over the base layer in a thickness direction, (3) a p-body region disposed in the n-type layer, (4) a source p+ region and a source n+ region each disposed in the p-body region, and (5) a drain n+ region disposed in the n-type layer. The vertical gate may include (1) a gate conductor extending from a first outer surface of the silicon semiconductor structure into the n-type layer in the thickness direction, the gate conductor disposed between the source n+ region and the drain n+ region in a lateral direction orthogonal to the thickness direction, and (2) a gate dielectric layer separating the gate conductor from the silicon semiconductor substrate, the gate dielectric layer including a stepped sidewall, as seen when the LDMOS transistor is viewed cross-sectionally in a depth direction orthogonal to each of the thickness and lateral directions.

(D2) The LDMOS transistor denoted as (D1) may further include (1) a source electrode disposed on the first outer surface of the silicon semiconductor structure and contacting each of the source p+ region and the source n+ region, (2) a drain electrode disposed on the first outer surface of the silicon semiconductor structure and contacting the drain n+ region, and (3) a gate electrode disposed on the first outer surface of the silicon semiconductor structure and contacting the gate conductor.

(E1) A method for forming a vertical gate of a LDMOS transistor may include the steps of (1) forming a trench in a silicon semiconductor structure, (2) forming a first dielectric liner in the trench, (3) after the step of forming the first dielectric liner, filling the trench with a sacrificial material, (4) removing a first portion of the sacrificial material to expose a first portion of the first dielectric liner, (5) removing the first portion of the first dielectric liner, (6) removing a remainder of the sacrificial material, (7) forming a second dielectric liner at least where the first portion of the first dielectric liner was removed, and (8) filling the trench with a conductive material to form a gate conductor.

(E2) The method denoted as (E1) may further include the following steps that are executed after the step of removing the first portion of the first dielectric liner but before the step of removing the remainder of the sacrificial material: (1) removing a second portion of the sacrificial material to expose a second portion of the first dielectric liner, and (2) removing the second portion of the first dielectric liner.

(E3) In any one of the methods denoted as (E1) and (E2), the sacrificial material may include a spin-on carbon material.

(E4) In any one of the methods denoted as (E1) through (E3), the step of removing the first portion of the sacrificial material may include (1) patterning a top surface of the silicon semiconductor structure with a photoresist material, and (2) removing the first portion of the sacrificial material using a dry etching process.

(E5) In any one of the methods denoted as (E1) through (E4), the step of removing the first portion of the first dielectric liner may include using a wet etching process to remove the first portion of the first dielectric liner.

(E6) In any one of the methods denoted as (E1) through (E5), the step of removing the remainder of the sacrificial material may include using one of a plasma ashing process or an etching process to remove the remainder of the sacrificial material.

(E7) In any one of the methods denoted as (E1) through (E6), the step of forming the trench in the silicon semiconductor structure may include making a silicon breakthrough etch in the silicon semiconductor structure using a plasma etching process with a gas mixture including fluorine.

(F1) A method for forming a vertical gate of a lateral double-diffused metal-oxide-semiconductor (LDMOS) transistor may include the steps of (1) forming a trench in a silicon semiconductor structure, (2) forming a first dielectric liner in the trench, (3) after the step of forming the first dielectric liner, filling the trench with a first sacrificial material, (4) removing a portion of the first dielectric liner, (5) removing the first sacrificial material, (6) forming a second dielectric liner at least where the portion of the first dielectric liner was removed, and (7) filling the trench with a conductive material to form a gate conductor.

(F2) In the method denoted as (F1), the first sacrificial material may include a spin-on carbon material.

(F3) Any one of the methods denoted as (F1) and (F2) may further include the following steps that are executed after the step of forming the second dielectric liner but before the step of filling the trench with a conductive material: (1) filling the trench with a second sacrificial material, (2) removing a portion of the second dielectric liner and a portion of the second sacrificial material, (3) removing remaining second sacrificial material, and (4) forming a third dielectric liner at least where the portion of the second dielectric liner was removed.

(F4) In the method denoted as (F3), the second sacrificial material may include a spin-on carbon material.

(F5) In any one of the methods denoted as (F1) through (F4), the step of removing the portion of the first dielectric liner may include (1) patterning a top surface of the silicon semiconductor structure with a hard mask material and (2) removing the portion of the first dielectric liner using a wet etching process.

(F6) In any one of the methods denoted as (F1) through (F5), the step of forming the trench in the silicon semiconductor structure may include making a silicon breakthrough etch in the silicon semiconductor structure using a plasma etching process with a gas mixture including fluorine.

(G1) A method for forming an integrated circuit may include the steps of (1) forming one or more shallow isolation trenches in a silicon semiconductor structure, (2) filling the one or more shallow isolation trenches with dielectric material, (3) forming a first plurality of doped regions of the silicon semiconductor structure, (4) forming a vertical gate in the silicon semiconductor structure using any one of the methods of claims (E1) through (E7) and (F1) through (F6), (5) forming one or more planar gates on the silicon semiconductor structure, and (6) forming a second plurality of doped regions of the silicon structure, such that the first plurality of doped regions, the second plurality of doped regions, the vertical gate, and the one or more planar gates collectively form a lateral double-diffused metal-oxide-semiconductor (LDMOS) transistor and at least one complementary metal oxide semiconductor (CMOS) transistor.

Changes may be made in the above devices, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present devices, methods, and systems, which, as a matter of language, might be said to fall therebetween.

What is claimed is:

1. A lateral double-diffused metal-oxide-semiconductor (LDMOS) transistor, comprising:
   a silicon semiconductor structure, including:
      a base layer,
      an n-type layer disposed over the base layer in a thickness direction,
      a p-body region disposed in the n-type layer,
      a source p+ region and a source n+ region each disposed in the p-body region, and
      a drain n+ region disposed in the n-type layer; and
   a vertical gate, including:
      a gate conductor extending from a first outer surface of the silicon semiconductor structure into the silicon semiconductor structure, and
      a gate dielectric layer including a least three dielectric sections, each of the at least three dielectric sections separating the gate conductor from the silicon semiconductor structure by a respective separation distance, each of the respective separation distances being different from each other of the respective separation distances, wherein the at least three dielectric sections include:
         a first dielectric section separating the gate conductor from a drain portion of the n-type layer in a lateral direction orthogonal to the thickness direction by a first separation distance $t_1$,
         a second dielectric section separating the gate conductor from a well portion of the n-type layer in the thickness direction by a second separation distance $t_2$ that is different from the first separation distance $t_1$, and
         a third dielectric section separating the gate conductor from the p-body region by a third separation distance $t_3$ that is different from each of the first separation distance $t_1$ and the second separation distance $t_2$; and
   wherein:
      the gate conductor extends from the first outer surface of the silicon semiconductor structure into the n-type layer in the thickness direction,
      the gate conductor is disposed between the source n+ region and the drain n+ region in the lateral direction, and
      the second dielectric section further separates the gate conductor from a source portion of the n-type layer in the lateral direction by the second separation distance $t_2$.

2. The LDMOS transistor of claim 1, wherein the source portion of the n-type layer is disposed (a) below the p-body region in the thickness direction and (b) beside the vertical gate in the lateral direction.

3. A lateral double-diffused metal-oxide-semiconductor (LDMOS) transistor, comprising:
   a silicon semiconductor structure, including:
      a base layer,
      an n-type layer disposed over the base layer in a thickness direction,
      a p-body region disposed in the n-type layer,
      a source p+ region and a source n+ region each disposed in the p-body region, and
      a drain n+ region disposed in the n-type layer; and
   a vertical gate, including:
      a gate conductor extending from a first outer surface of the silicon semiconductor structure into the silicon semiconductor structure, and
      a gate dielectric layer including a least three dielectric sections, each of the at least three dielectric sections separating the gate conductor from the silicon semiconductor structure by a respective separation distance, each of the respective separation distances being different from each other of the respective separation distances, wherein the at least three dielectric sections include:
         a first dielectric section separating the gate conductor from a drain portion of the n-type layer in a lateral direction orthogonal to the thickness direction by a first separation distance $t_1$, a second dielectric section separating the gate conductor from a well portion of the n-type layer in the thickness direction by a second separation distance $t_2$ that is different from the first separation distance $t_1$, and a third dielectric section separating the gate conductor from the p-body region by a third separation distance $t_3$ that is different from each of the first separation distance $t_1$ and the second separation distance $t_2$; and wherein:

the gate conductor extends from the first outer surface of the silicon semiconductor structure into the n-type layer in the thickness direction, the gate conductor is disposed between the source n+ region and the drain n+ region in the lateral direction, and the third separation distance $t_3$ is less than each of the first separation distance $t_1$ and the second separation distance $t_2$.

\* \* \* \* \*